United States Patent
Ozeki et al.

(10) Patent No.: US 12,476,231 B2
(45) Date of Patent: Nov. 18, 2025

(54) LIGHT EMITTING DEVICE, AND LIGHT EMITTING MODULE EACH HAVING COVER MEMBERS ON ELEMENT STRUCTURE BODIES

(71) Applicant: NICHIA CORPORATION, Anan (JP)

(72) Inventors: Kenji Ozeki, Tokushima (JP); Kosuke Sato, Anan (JP); Chinami Nakai, Anan (JP); Takashi Ishii, Tokushima (JP); Atsushi Kojima, Tokushima (JP)

(73) Assignee: NICHIA CORPORATION, Anan (JP)

( * ) Notice: Subject to any disclaimer, the term of this patent is extended or adjusted under 35 U.S.C. 154(b) by 804 days.

(21) Appl. No.: 17/778,000

(22) PCT Filed: Nov. 2, 2020

(86) PCT No.: PCT/JP2020/041132
§ 371 (c)(1),
(2) Date: May 19, 2022

(87) PCT Pub. No.: WO2021/100454
PCT Pub. Date: May 27, 2021

(65) Prior Publication Data
US 2023/0005895 A1    Jan. 5, 2023

(30) Foreign Application Priority Data

Nov. 22, 2019  (JP) ................ 2019-211557
Jan. 17, 2020  (JP) ................ 2020-006262
Jul. 31, 2020  (JP) ................ 2020-130538

(51) Int. Cl.
*H01L 25/16*    (2023.01)
*H01L 23/00*    (2006.01)
(Continued)

(52) U.S. Cl.
CPC ............ *H01L 25/167* (2013.01); *H01L 24/29* (2013.01); *H01L 24/32* (2013.01); *H01L 24/33* (2013.01);
(Continued)

(58) Field of Classification Search
CPC ....... H01L 25/167; H01L 24/29; H01L 24/32; H01L 24/33; H01L 24/83; H01L 25/162; H10H 20/854; H10H 20/857
See application file for complete search history.

(56) References Cited

U.S. PATENT DOCUMENTS

2007/0099341 A1   5/2007   Lo
2011/0175117 A1   7/2011   Jagt et al.
(Continued)

FOREIGN PATENT DOCUMENTS

JP   2004-273897   9/2004
JP   2006-165058   6/2006
(Continued)

*Primary Examiner* — Michael Jung
(74) *Attorney, Agent, or Firm* — MORI & WARD, LLP

(57) ABSTRACT

A light emitting device and a light emitting module both having narrow spacing between emission faces, as well as a method of manufacturing light emitting device and a method of manufacturing light emitting module are provided.

A light emitting device 100 includes element structure bodies 15, at least one of the element structure bodies including a submount substrate 10, a light emitting element 20 disposed on the submount substrate 10, a light transmitting member 30 disposed on the light emitting element 20, and a first cover member 50 covering the lateral faces of the light emitting element 20 on the submount substrate 10, and a second cover member 60 supporting the element structure bodies 15 by covering the lateral faces of the element structure bodies 15.

16 Claims, 41 Drawing Sheets

(51) Int. Cl.
*H10H 20/854* (2025.01)
*H10H 20/857* (2025.01)
*H10H 20/01* (2025.01)
*H10H 20/858* (2025.01)

(52) U.S. Cl.
CPC ............ *H01L 24/83* (2013.01); *H01L 25/162* (2013.01); *H10H 20/854* (2025.01); *H10H 20/857* (2025.01); H01L 24/16 (2013.01); H01L 24/73 (2013.01); H01L 2224/16227 (2013.01); H01L 2224/2919 (2013.01); H01L 2224/29191 (2013.01); H01L 2224/32227 (2013.01); H01L 2224/33181 (2013.01); H01L 2224/73204 (2013.01); H01L 2924/0665 (2013.01); H01L 2924/12041 (2013.01); H10H 20/0362 (2025.01); H10H 20/0364 (2025.01); H10H 20/8585 (2025.01)

(56) References Cited

U.S. PATENT DOCUMENTS

| | | | |
|---|---|---|---|
| 2012/0193662 A1* | 8/2012 | Donofrio | H10H 20/856 257/E33.059 |
| 2013/0168723 A1* | 7/2013 | Kasae | F21V 21/00 362/382 |
| 2015/0263254 A1* | 9/2015 | Miyoshi | H10H 20/8515 438/27 |
| 2015/0380622 A1 | 12/2015 | Miyoshi et al. | |
| 2017/0054062 A1* | 2/2017 | Tamaki | H10H 20/8512 |
| 2017/0103950 A1 | 4/2017 | Kawai | |
| 2017/0154880 A1* | 6/2017 | Ozeki | H01L 24/96 |
| 2017/0155022 A1* | 6/2017 | Tomonari | H10H 20/813 |
| 2017/0179360 A1 | 6/2017 | Miyoshi et al. | |
| 2018/0082990 A1 | 3/2018 | Furuyama | |
| 2019/0259679 A1 | 8/2019 | Kawai | |

FOREIGN PATENT DOCUMENTS

| | | |
|---|---|---|
| JP | 2007-088453 | 4/2007 |
| JP | 2007-329372 | 12/2007 |
| JP | 2010-010252 | 1/2010 |
| JP | 2010-177225 | 8/2010 |
| JP | 2010-219324 | 9/2010 |
| JP | 2012-503876 | 2/2012 |
| JP | 2012-199342 | 10/2012 |
| JP | 2015-207703 | 11/2015 |
| JP | 2016-27620 | 2/2016 |
| JP | 2018-049892 | 3/2018 |
| WO | WO 2018/070192 | 4/2018 |
| WO | WO 2019/098029 | 5/2019 |

* cited by examiner

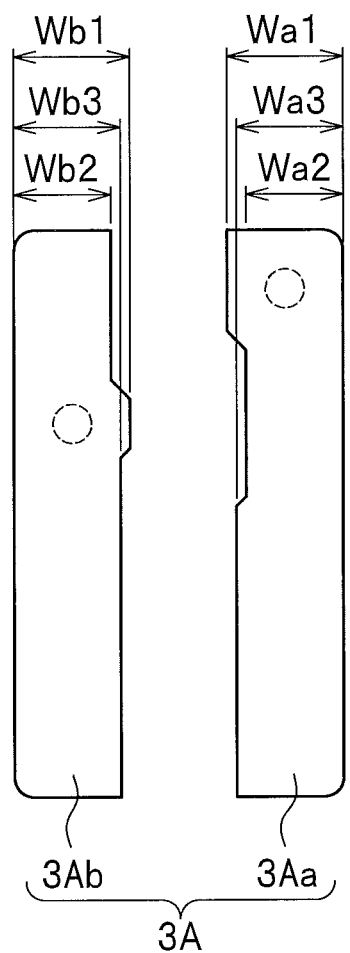

LIGHT EMITTING DEVICE, AND LIGHT EMITTING MODULE EACH HAVING COVER MEMBERS ON ELEMENT STRUCTURE BODIES

TECHNICAL FIELD

The present disclosure relates to a light emitting device, a light emitting module, a method of manufacturing a light emitting device, and a method of manufacturing a light emitting module.

BACKGROUND ART

A light emitting device equipped with multiple emission faces has been known. For example, Patent Document 1 discloses a light emitting device that comprises a plurality of light emitting elements, light transmitting members covering the upper faces of the light emitting elements, and a light reflecting member integrally covering the lateral faces of the light emitting elements.

CITATION LIST

Patent Literature

Patent Document 1: JP 2016-27620 A

SUMMARY OF INVENTION

Technical Problem

There is room for improvement in densely arranging emission faces.

One object of certain embodiments of the present disclosure is to provide a light emitting device and a light emitting module both having narrow spacing between emission faces, as well as a method of manufacturing light emitting device and a method of manufacturing light emitting module.

Solution to Problem

A light emitting device according to one embodiment of the present disclosure includes a plurality of element structure bodies, at least one of the element structure bodies comprising: a submount substrate, a light emitting element disposed on the submount substrate, a light transmitting member disposed on the light emitting element, and a first cover member covering a lateral face of the light emitting element on the submount substrate, and a second cover member supporting the element structure bodies by covering the lateral faces of the element structure bodies.

A light emitting module according to another embodiment of the present disclosure includes the light emitting device described above, and a module substrate on which the light emitting device is mounted such that the submount substrates faces the module substrate.

A method of manufacturing a light emitting device according to one embodiment of the present disclosure includes: a step of preparing a plurality of element structure bodies, at least one of the element structure bodies including a submount substrate, a light emitting element disposed on the submount substrate, a light transmitting member disposed on the light emitting element, and a first cover member covering a lateral face of the light emitting element on the submount substrate, a step of mounting the element structure bodies on a sheet member such that the submount substrates of the element structure bodies faces the sheet member, and a step of forming a second cover member on the sheet member to support the element structure bodies by covering the lateral faces of the element structure bodies.

A method of manufacturing a light emitting module according to another embodiment of the present disclosure includes a step of preparing a light emitting device using the method of manufacturing the light emitting device described above, and a step of mounting the light emitting device on a module substrate such that the submount substrates faces the module substrate.

Advantageous Effects of Invention

A light emitting device according to certain embodiments of the present disclosure can have a narrow space between emission faces.

A light emitting module according to certain embodiments of the present disclosure can have a narrow space between emission faces.

A method of manufacturing a light emitting device according to certain embodiments of the present disclosure can produce a light emitting device that has a narrow space between emission faces.

A method of manufacturing a light emitting module according to certain embodiments of the present disclosure can produce a light emitting module that has a narrow space between emission faces.

BRIEF DESCRIPTION OF DRAWINGS

FIG. 14C is an enlarged view schematically showing the structure of the external connection electrodes of the light emitting device shown in FIG. 14B.

DESCRIPTION OF EMBODIMENT

Certain embodiments will be explained below with reference to the accompanying drawings. The embodiments described below are illustrations of exemplary light emitting devices, light emitting modules, methods of manufacturing light emitting devices, and methods of manufacturing light emitting modules for the purpose of giving shape to the technical ideas related to the embodiments without limiting the present invention. The dimensions, materials, shapes, and relative positions of the constituent parts described in the embodiments are merely provided as examples, and are not intended to limit the scope of the present invention unless otherwise specifically noted. The sizes of and positional relationship between the members shown in each drawing may be exaggerated for clarity of explanation. The number of light emitting elements in each drawing is set as an example for the purpose of making the structure easily understood.

First Embodiment

Figure 1A:
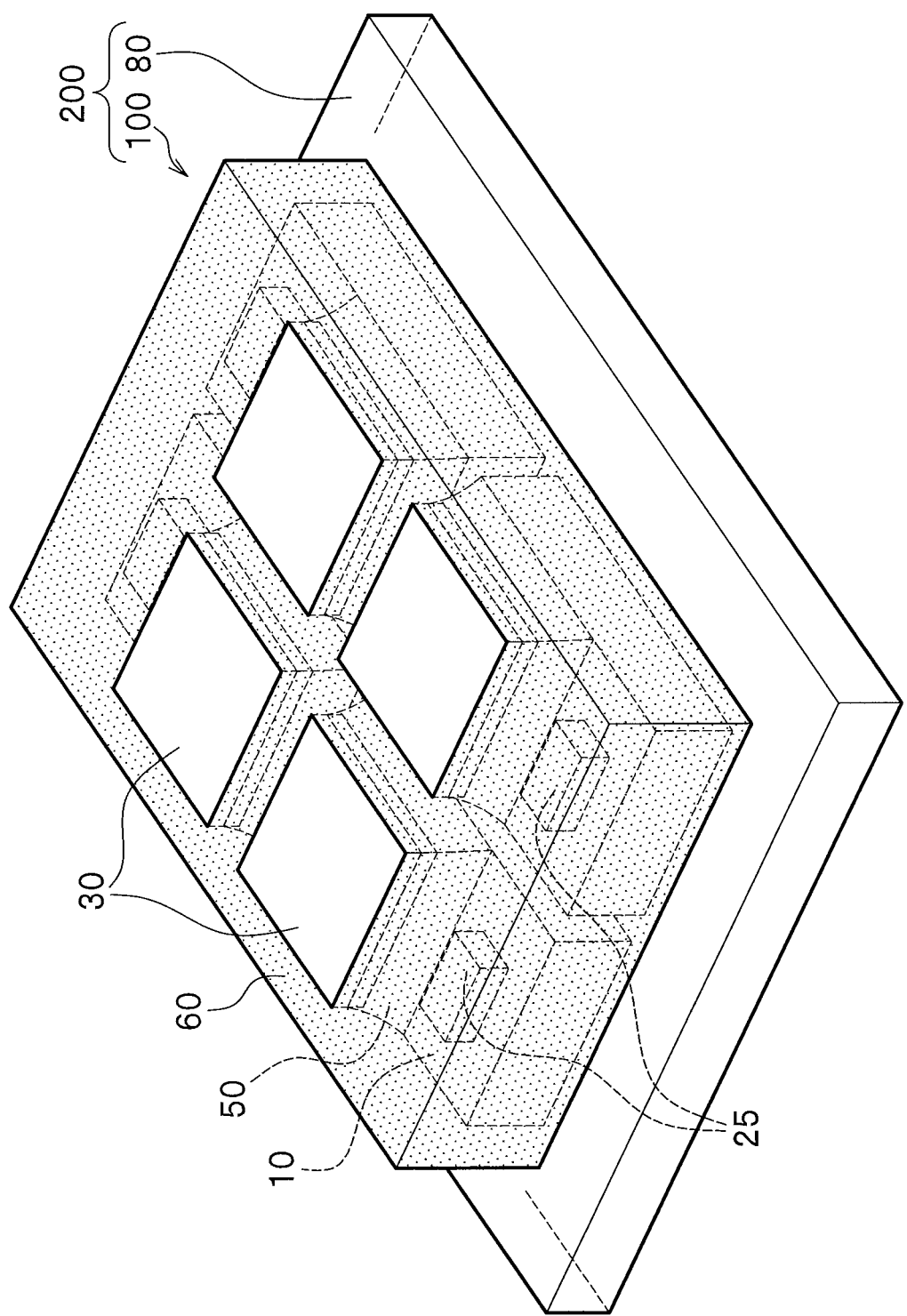
FIG. 1A is a perspective view schematically showing the structure of a light emitting module that includes a light emitting device according to a first embodiment.
Figure 1B:
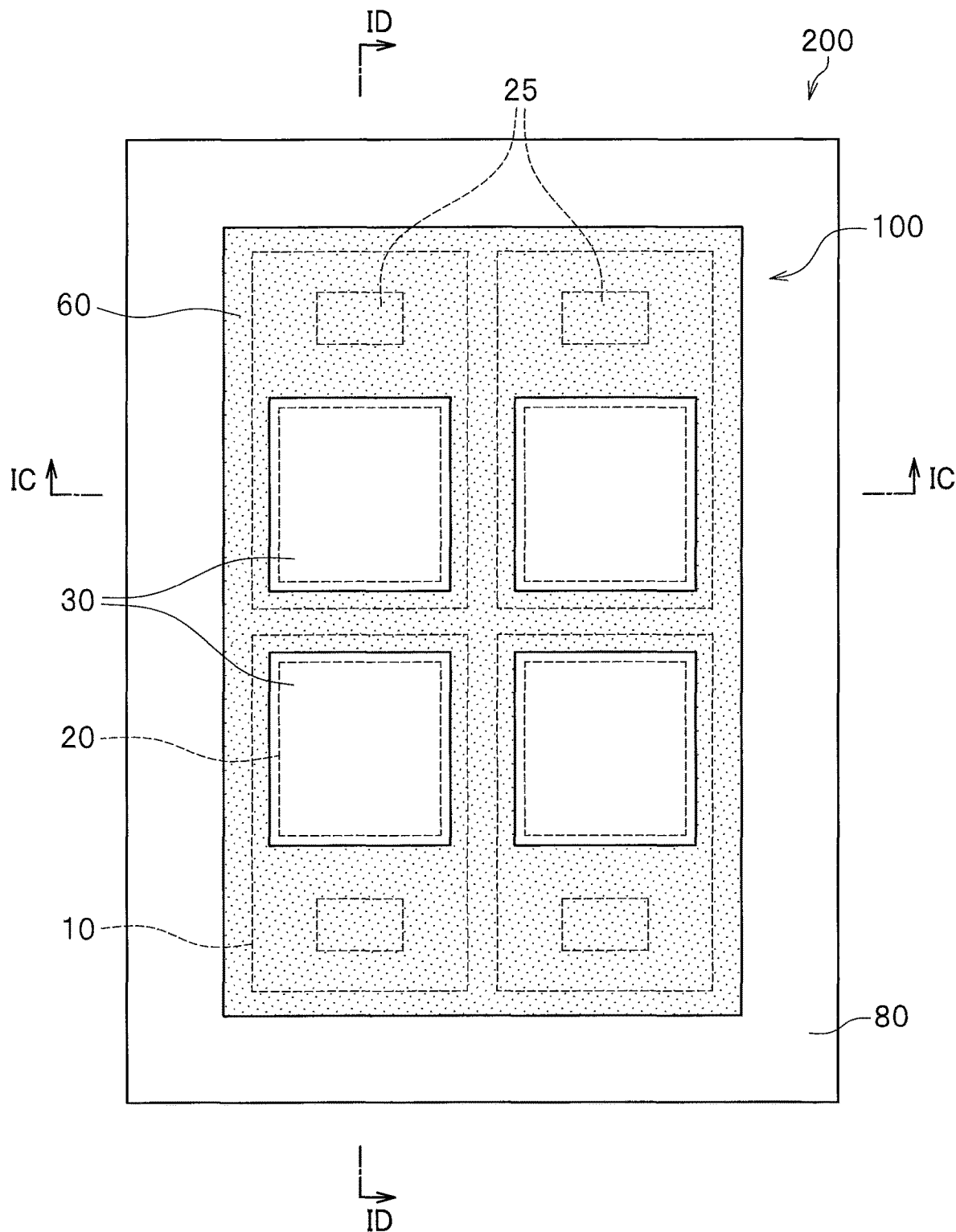
FIG. 1B is a plan view schematically showing the structure of the light emitting module that includes the light emitting device according to the first embodiment.
Figure 1C:
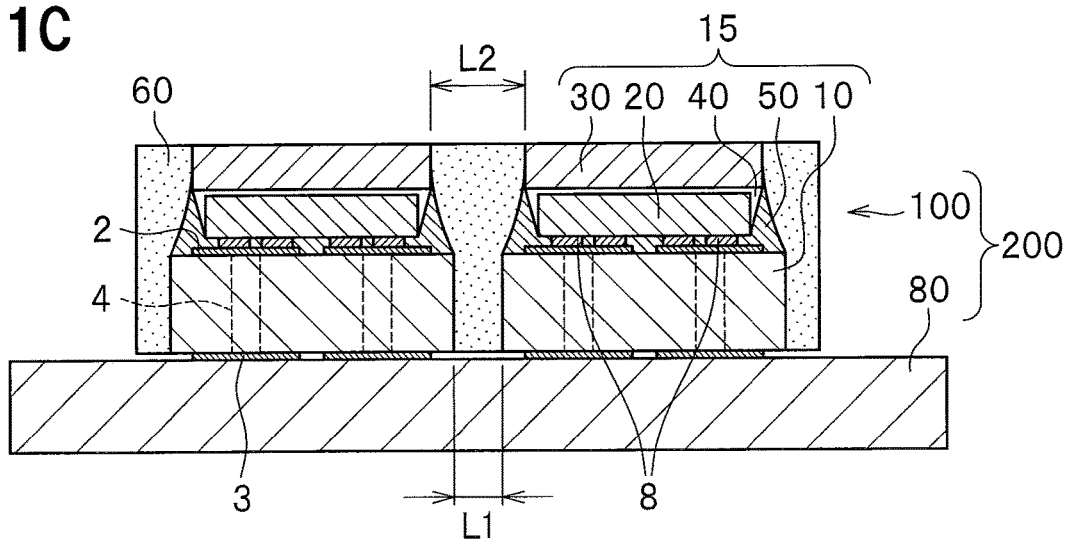
FIG. 1C is a cross-sectional view taken along line IC-IC in FIG. 1B.
Figure 1D:
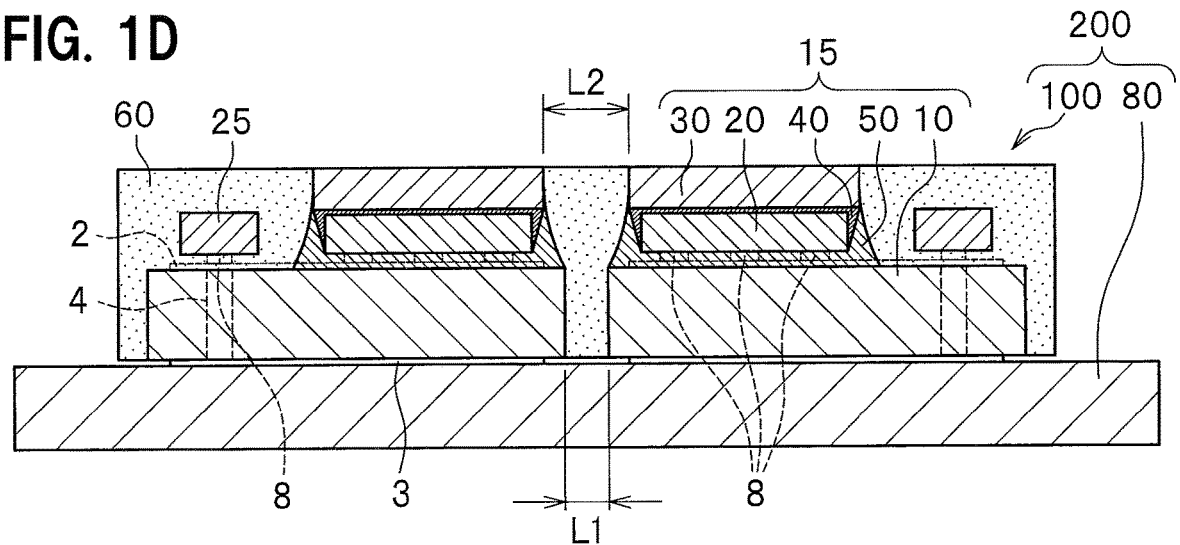
FIG. 1D is a cross-sectional view taken along line ID-ID in FIG. 1B.
Figure 1E:
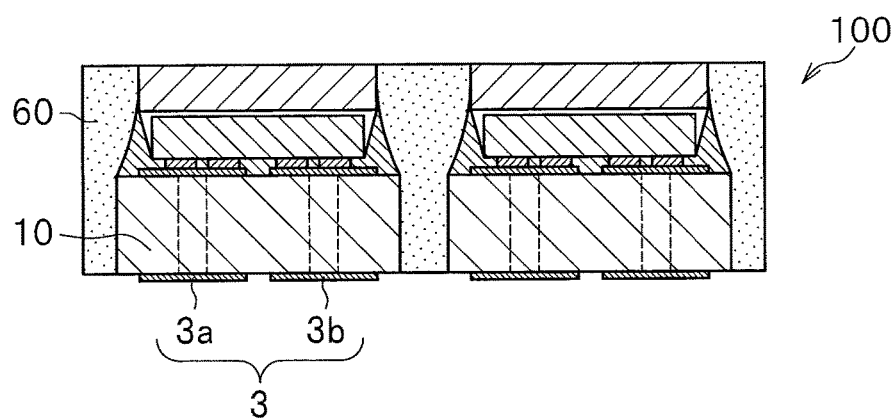
FIG. 1E is a cross-sectional view schematically showing the structure of the light emitting device according to the first embodiment.
Figure 1F:
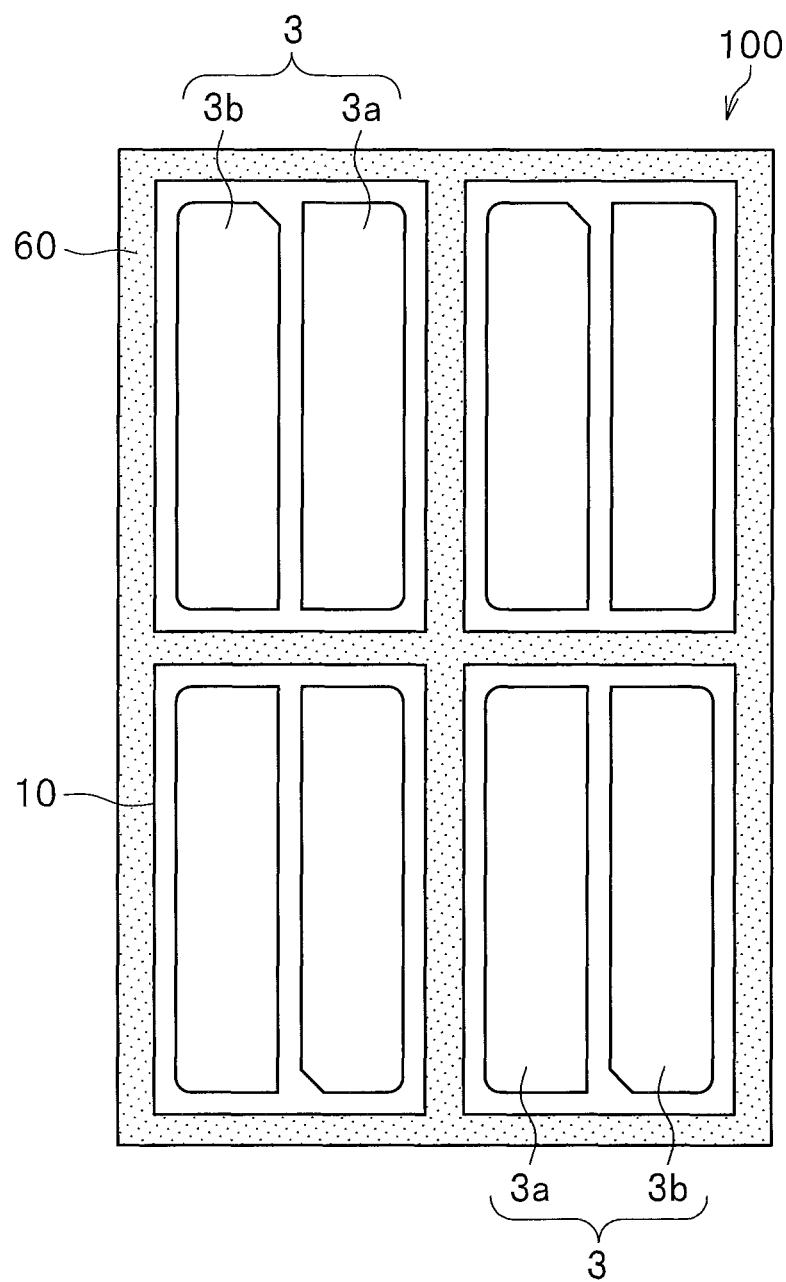
FIG. 1F is a bottom view schematically showing the structure of the light emitting device according to the first embodiment.

FIG. 1A is a perspective view schematically showing the structure of a light emitting module that includes a light emitting device according to a first embodiment. FIG. 1B is a plan view schematically showing the structure of the light emitting module that includes the light emitting device according to the first embodiment. FIG. 1C is a cross-sectional view taken along line IC-IC in FIG. 1B. FIG. 1D is a cross-sectional view taken along line ID-ID in FIG. 1B. FIG. 1E is a cross-sectional view schematically showing the structure of the light emitting device according to the first embodiment. FIG. 1F is a bottom view schematically showing the structure of the light emitting device according to the first embodiment.

A light emitting module 200 includes a light emitting device 100 and a module substrate 80 on which the light emitting device 100 is mounted.

Light Emitting Device

A light emitting device 100 will be explained first.

The light emitting device 100 has, in the upper face, a plurality of emission faces as the light extraction regions of the light emitting device 100.

The light emitting device 100 includes element structure bodies 15, at least one of the element structure bodies including a submount substrate 10, a light emitting element 20 disposed on the submount substrate 10, a light transmitting member 30 disposed on the light emitting element 20, and a first cover member 50 covering the lateral face(s) of the light emitting element 20 on the submount substrate 10; and a second cover member 60 supporting the element structure bodies 15 by covering the lateral faces of the element structure bodies 15. The upper faces of the light transmitting members 30 are exposed from the second cover member 60 and constitute a plurality of emission faces of the light emitting device 100.

In the light emitting device 100, a plurality of element structure bodies 15, each having an emission face, are supported by the second cover member 60. The second cover member 60 can support the element structure bodies 15 at desired locations, thereby enabling a denser arrangement of the emission faces with narrower spacing therebetween.

The light emitting device 100 primarily includes submount substrates 10, light emitting elements 20, protective devices 25, light transmitting members 30, light guide members 40, first cover members 50, and a second cover member 60.

Each constituent element of the light emitting device 100 will be explained below.

A submount substrate 10 is a member on which a light emitting element 20 and a protective device 25 are mounted. The submount substrate 10, for example, is substantially rectangular in a plan view.

For the submount substrate 10, an insulating material is preferably used, and a material barely transmitting the light emitted from a light emitting element 20 or the light from the outside is preferably used. For example, ceramics, such as alumina, aluminum nitride, mullite, or the like, thermoplastic resins, such as polyamide (PA), polyphthalamide (PPA), polyphenylene sulfide (PPS), liquid crystal polymers, or the like, or thermosetting resins, such as epoxy resins, silicone resins, modified epoxy resins, urethane resins, phenol resins, or the like, can be used. Among them, ceramics are preferable for their good heat dissipation properties.

The submount substrate 10 includes wiring on the upper face, lower face, and inside for electrically connecting a light emitting element 20, an external power supply, and the like. Wiring can be formed using metals, such as Fe, Cu, Ni, Al, Ag, Au, Pt, Ti, W, Pd, or alloys containing at least one of these metals.

One example of submount substrate 10 has, on the upper face where a light emitting element 20 will be mounted, upper face wiring 2 to be connected to the light emitting element 20, and on the lower face located opposite to the upper face where the light emitting element 20 is mounted, external connection electrodes 3, e.g., anode 3$a$ and cathode 3$b$, to be electrically connected to an external power supply. In this case, between the upper face wiring 2 and the external connection electrodes 3, vias 4 reaching both the upper face and the lower face, i.e., penetrating through the submount substrate 10, may be formed. In this manner, the upper face wiring 2 and the external connection electrodes 3 can be electrically connected.

In the light emitting device 100, the distance L1 between adjacent submount substrates 10 is preferably set in the range from 0.05 mm to 0.2 mm. This can make the thickness of the second cover member 60 between adjacent submount substrates 10 to be 0.05 mm to 0.2 mm, thereby allowing adjacent submount substrates 10 to be joined in a concentrated manner. In the light emitting device 100 having a plurality of element structure bodies 15, providing each element structure body 15 with a submount substrate 10 while disposing the second cover member 60 between the submount substrates 10 can reduce the effect of thermal stress caused by the expansion or contraction of the submount substrates 10 attributable to the heat generated by the individual element structure bodies 15 and the thermal history during the step of mounting the light emitting device.

A light emitting element 20 is a semiconductor element which emits light by itself when a voltage is applied. Any shape and size can be selected for the light emitting element 20. For the emission color of the light emitting element 20, one having optional wavelength can be selected depending on the application. For example, for a blue (light with a wavelength in the range from 430 to 500 nm) or green (light with a wavelength in the range from 500 to 570 nm) light emitting element 20, one employing a nitride-based semiconductor ($In_XAl_YGa_{1-X-Y}N$, 0≤X, 0≤Y, X+Y≤1), GaP, or the like, can be used. For a red (light with a wavelength in the range from 610 to 700 nm) light emitting element 20, GaAlAs, AlInGaP, or the like, can be used in addition to nitride-based semiconductor elements.

It is preferable for the light emitting element 20 to have positive and negative electrodes on one face so as to be flip-chip mounted on the wiring on the submount substrate 10 using a conductive adhesive material 8. For the conductive adhesive material 8, for example, eutectic solder, conductive paste, bumps, and the like can be used.

A protective device 25 can be, for example, a Zener diode. The protective device 25 has positive and negative electrodes on one face and is flip-chip mounted on the wiring on the submount substrate 10 using a conductive adhesive material 8. The light emitting device may be one that includes no protective device 25.

A light transmitting member 30 is a sheet-shaped member having an upper face which serves as the primary emission face of each element structure body 15 and the light emitting device 100, and a lower face located opposite to the upper face. The light transmitting member 30 is a light transmissive member formed of, for example, a resin, glass, inorganic material, or the like. The light transmitting member 30 is disposed on a light emitting element 20. The light transmitting member 30 preferably has a larger upper face than the upper face of the light emitting element 20, and is disposed to enclose the light emitting element 20 in a plan view.

In the light emitting device 100, the distance L2 between adjacent light transmitting members 30 exposed at the upper face of the light emitting device 100 is preferably 0.2 mm at most. In the case of employing a light emitting device 100 as the light source of an adaptive driving beam (ADB) headlight in a vehicle, for example, setting the distance L2 between adjacent light transmitting member 30 to 0.2 mm at most can reduce the size of the light source and the size of the headlight lens. Accordingly, the primary lens can be omitted in the optical system. Furthermore, the loss of light passing through the headlight lens can be reduced. From the perspective of further reducing the size of the light source, the distance L2 between adjacent light transmitting members 30 is preferably set to 0.1 mm at most, more preferably 0.05 mm at most. The distance L2 between adjacent light transmitting members 30 is preferably at least 0.03 mm from the perspective of ease of manufacture for the light emitting device 100.

The plan view shape of the light transmitting member 30 can be circular, elliptical, or polygonal, such as a square, hexagon, or the like. Among them, from the perspective of arranging multiple emission faces in close proximity to one another, a quadrilateral shape, such as a square, rectangle, or the like is preferable, and a shape similar to the plan view shape of a light emitting element 20 is more preferable.

The light transmitting member 30 may contain a wavelength conversion material. Examples of wavelength conversion materials include phosphors. Examples of light transmitting members 30 containing a phosphor include a sintered body of a phosphor, or a resin, glass, ceramic or another inorganic material that contains phosphor power. The light transmitting member 30 may be one made by forming a light transmitting layer, such as a resin layer containing a phosphor or a glass layer containing a phosphor, on the surface of a light transmitting sheet, such as a formed resin, glass, ceramic, or the like. The light transmitting member 30 may contain a filler such as a diffuser depending on the purpose. In the case of containing a filler such as a diffuser, the light transmitting member 30 may be a resin, glass, ceramic or another inorganic material that contains a filler, or one made by forming a light transmitting layer, such as a resin layer containing a filler or a glass layer containing a filler, on the surface of a light transmitting sheet that is a formed resin, glass, ceramic, or the like.

As for phosphors, known phosphors in the art can be used. Examples of green light emitting phosphors include yttrium aluminum garnet-based phosphors (e.g., $Y_3(Al,Ga)_5O_{12}$:Ce), lutetium aluminum garnet-based phosphors (e.g., $Lu_3(Al,Ga)_5O_{12}$:Ce), terbium aluminum garnet-based phosphors (e.g., $Tb_3(Al,Ga)_5O_{12}$:Ce), silicate-based phosphors (e.g., $(Ba,Sr)_2SiO_4$:Eu), chlorosilicate-based phosphors (e.g., $Ca_8Mg(SiO_4)_4C_{12}$:Eu), β-SiAlON-based phosphors (e.g., $Si_{6-z}Al_zO_zN_{8-z}$:Eu (0<z<4.2)), SGS-based phosphors (e.g., $SrGa_2S_4$:Eu), and the like. Examples of yellow light emitting phosphors include α-SiAlON-based phosphors (e.g., $Mz(Si,Al)_{12}(O,N)_{16}$ (0<z≤2, M is Li, Mg, Ca, Y, or lanthanide elements excluding La and Ce). Some of the green light emitting phosphors described above can also be yellow-emitting phosphors.

For example, yttrium aluminum garnet-based phosphors can emit yellow light by substituting a portion of Y with Gd to shift the peak emission wavelength to longer wavelengths. Some of these are fluorescent substances that can emit orange light. Examples of red emitting phosphors include nitrogen-containing calcium aluminosilicate (CASN or SCASN)-based phosphors (e.g., $(Sr,Ca)AlSiN_3$:Eu), BSESN-based phosphors (e.g., $(Ba,Sr,Ca)_2Si_5N_8$:Eu), and the like. Additional examples include manganese-activated fluoride-based phosphors (phosphors represented by the general formula (I) $A_2[M_{1-a}Mn_aF_6]$, where A in the general formula (I) is at least one selected from the group consisting of K, Li, Na, Rb, Cs, and $NH_4$, and M is at least one selected from the group consisting of Group 4 elements and Group 14 elements, where 0<a<0.2 is satisfied). Representative examples of manganese-activated fluoride-based phosphors include manganese-activated potassium fluorosilicate phosphors (e.g., $K_2SiF_6$:Mn).

As for diffusers, known diffusers in the art can be used. For example, barium titanate, titanium oxide, aluminum oxide, silicon oxide, or the like can be used.

Examples of resin materials that can be used in cases where a resin is employed as the light transmitting member 30, or used as the binder for a phosphor and/or diffuser, include thermosetting resins, such as epoxy resins, modified epoxy resins, silicone resins, modified silicone resins, and the like.

A light guide member 40 disposed between a light transmitting member 30 and a light emitting element 20 is a member that joins the light emitting element 20 and the light transmitting member 30. Furthermore, the light guide member 40 facilitates the extraction of light from a light emitting element 20, as well as guiding the light from the light emitting element 20 to the light transmitting member 30. The light guide member 40 can improve the luminous flux and light extraction efficiency. The light guide member 40 is also preferably disposed on the lateral faces of a light emitting element 20.

The light guide member 40 covering the lateral faces of a light emitting element 20 can be formed by allowing the adhesive material that bonds a light transmitting member 30 and a light emitting element 20 to wet and spread over the lateral faces of the light emitting element 20.

The light guide member 40 is formed to have a triangular cross section such that the width of the member increases in the direction from the lower face of the light emitting element 20 (the submount substrate 10 side) to the light transmitting member 30. Such a structure can facilitate upward reflection of the laterally advancing light from a light emitting element 20, thereby further improving the luminous flux and light extraction efficiency. The cross-sectional shape of the outer lateral face of the light guide member 40 is not limited to a linear shape, and may be a curved shape. For example, the curved shape of the light guide member 40 may be one that protrudes towards the first cover member 50 or one that is recessed towards the light emitting element 20.

Although it is sufficient for the light guide member 40 to cover the portions of the lateral faces of a light emitting element 20 that include the light emitting part, from the perspective of improving the luminous flux and light extraction efficiency, it is more preferable to cover substantially the entire lateral faces of the light emitting element 20.

For the light guide member 40, a light transmissive resin material can be used. Other examples of the light guide member 40 include the light transmissive adhesive materials, such as the resins for use as the light transmitting member 30 described above. It may also contain any of the diffusers described above. This allows the light to enter the light transmitting member 30 more uniformly, to thereby reduce color unevenness in the light emitting device 100.

A first cover member 50 is disposed on a submount substrate 10 and covers the lateral faces of the light emitting elements 20. The first cover member 50 can strengthen the adhesion between the submount substrate 10 and the light emitting element 20. The first cover member 50 covers the lateral faces of the light emitting element 20 via the light guide member 40.

The first cover member 50 has a triangular cross section, for example, such that the width of the member increases in the direction from the light transmitting member 30 side to the submount substrate 10. The cross-sectional shape of the outer lateral face of the first cover member 50 is not limited to a linear shape, but may be a curved shape. For example, the curved shape of the first over member 50 may protrude towards the second cover member 60, or may be recessed towards the light emitting element 20.

For the first cover member 50, for example, a light transmissive resin containing a reflecting material can be used. Examples of resin materials for use as the first cover member 50 include silicone resins, epoxy resins, urea resins, and the like. Particularly, silicone resins which is good in light resistance and heat resistance are preferable. Examples of reflecting materials include titanium oxide, silica, silicon oxide, aluminum oxide, zirconium oxide, magnesium oxide, potassium titanate, zinc oxide, silicon nitride, boron nitride, and the like. Among them, from the light reflection perspective, titanium oxide which has a relatively high refractive index is preferable.

It is sufficient for a first cover member 50 to partially cover the lateral faces of a light emitting element 20. Preferably, the first cover member 50 covers the entire lateral faces of the light emitting element 20. The first cover member 50 more preferably extends from the lateral faces of the light emitting element 20 to cover at least a portion of the lateral faces of the light transmitting member 30. This can restrain the light from the lateral faces of the light emitting elements 20 from exiting to the outside, in the individual element structure bodies 15. This can reduce the leakage of light from one element structure body 15 to adjacent element structure body 15 in the light emitting device 100 including multiple element structure bodies 15, thereby reducing uneven light emission. This can make it easier to identify the chromaticity coordinates of the element structure bodies 15 during the sorting step after dividing the element structure bodies 15 into individual pieces as described later.

The first cover member 50 preferably covers the lower face of each light emitting element 20. This allows the light advancing downward from the light emitting element 20 to enter the first cover member 50, thereby further improving the luminous flux of the light emitting device 100. Moreover, this can further reinforce the adhesion between the submount substrate 10 and the light emitting element 20.

A second cover member 60 is a member disposed in the surrounding of the element structure bodies 15. A resin material is preferably used for the second cover member 60. For example, the second cover member 60 can be formed using a white resin, that is a light transmissive resin material containing a reflecting material, to cover the lateral faces of the element structure bodies 15. In other words, the second cover member 60 covers the lateral faces of the submount substrates 10, the lateral faces of the first cover members 50, and lateral faces of the light transmitting members 30. The second cover member 60 is also provided between adjacent element structure bodies 15, covering the outer lateral faces of each element structure body 15 while exposing the upper face of each light transmitting member 30.

Examples of resin materials for use as the second cover member 60 include those resin materials listed as examples for use as the first cover member 50. Examples of reflecting materials contained in the resin used as the second cover member 60 include those reflecting materials listed as examples that can be included in the first cover member 50.

The light emitting device 100 includes a plurality of element structure bodies 15 where each element structure body 15 includes a first cover member 50 covering the lateral faces of the light emitting element 20. This reduces the leakage of the light emitted from the light emitting elements 20 in the lateral direction. Accordingly, the element structure bodies 15 can be arranged in closer proximity to one another without reducing the light extraction efficiency of the individual element structure bodies 15.

The light emitting device 100 shown here as one example has four element structure bodies 15 arranged in a matrix of two rows by two columns that are supported by the second cover member 60. Each element structure body 15 includes a protective device 25 that is positioned on the outer side. This allows the four light transmitting members 30 to be arranged in a matrix at smaller intervals. A light emitting device may include three or less, or five or more, element structure bodies 15.

Light Emitting Module

A light emitting module 200 will be explained next.

The light emitting module 200 includes a light emitting device 100 having the structure as already explained, and a module substrate 80 on which the light emitting device 100 is mounted such that the submount substrates 10 faces the module substrate 80.

In the case where the light emitting device 100 includes no protective device 25, it is preferable to have the module substrate 80 include a protective device 25. The module substrate 80 may be designed to include an electronic part other than a protective device 25.

The light emitting device 100 has the features as described above.

The module substrate 80 is a member on which the light emitting device 100 is mounted, which electrically externally connects the light emitting device 100. The module substrate 80 is formed to be substantially rectangular in a plan view, for example.

Examples of materials for use as the module substrate 80 include those described as examples of materials for use as the submount substrates 10.

The module substrate 80 includes, on the upper face, wiring for electrical connection to the light emitting device 100. Examples of materials for use as the wiring of the module substrate 80 include those described as examples of materials for use as the wiring in the submount substrates 10. A composite material formed of an insulating material and metal may alternatively be used.

The light emitting device 100 is mounted on the upper face of the module substrate 80 so as to connect the wiring on the submount substrates 10 and the wiring on the module substrate 80 via a conductive adhesive material. For example, eutectic solder, conductive paste, bumps, or the like, can be used as the conductive adhesive material.

Operation of Light Emitting Module

When the light emitting module 200 is driven, an electric current is supplied by an external power supply to the light emitting elements 20, to thereby emit light. The light emitted by the light emitting elements 20 advancing upwards is extracted above and outside the light emitting device 100 via the light transmitting members 30. The light advancing downwards is reflected by the submount substrates 10 to be extracted from the light emitting device 100 via the light transmitting members 30. The light laterally advancing is reflected by the first cover members 50 and/or the second cover member 60 to be extracted from the light emitting device 100 via the light transmitting members 30. At this time, reducing the spacing between the light transmitting members 30, e.g., 0.2 mm at most, can simplify and reduce the size of the structure of the optical system in the case of employing the light emitting module 200 as the light source of an automotive headlight, for example.

Manufacturing Method of First Embodiment

Figure 2:
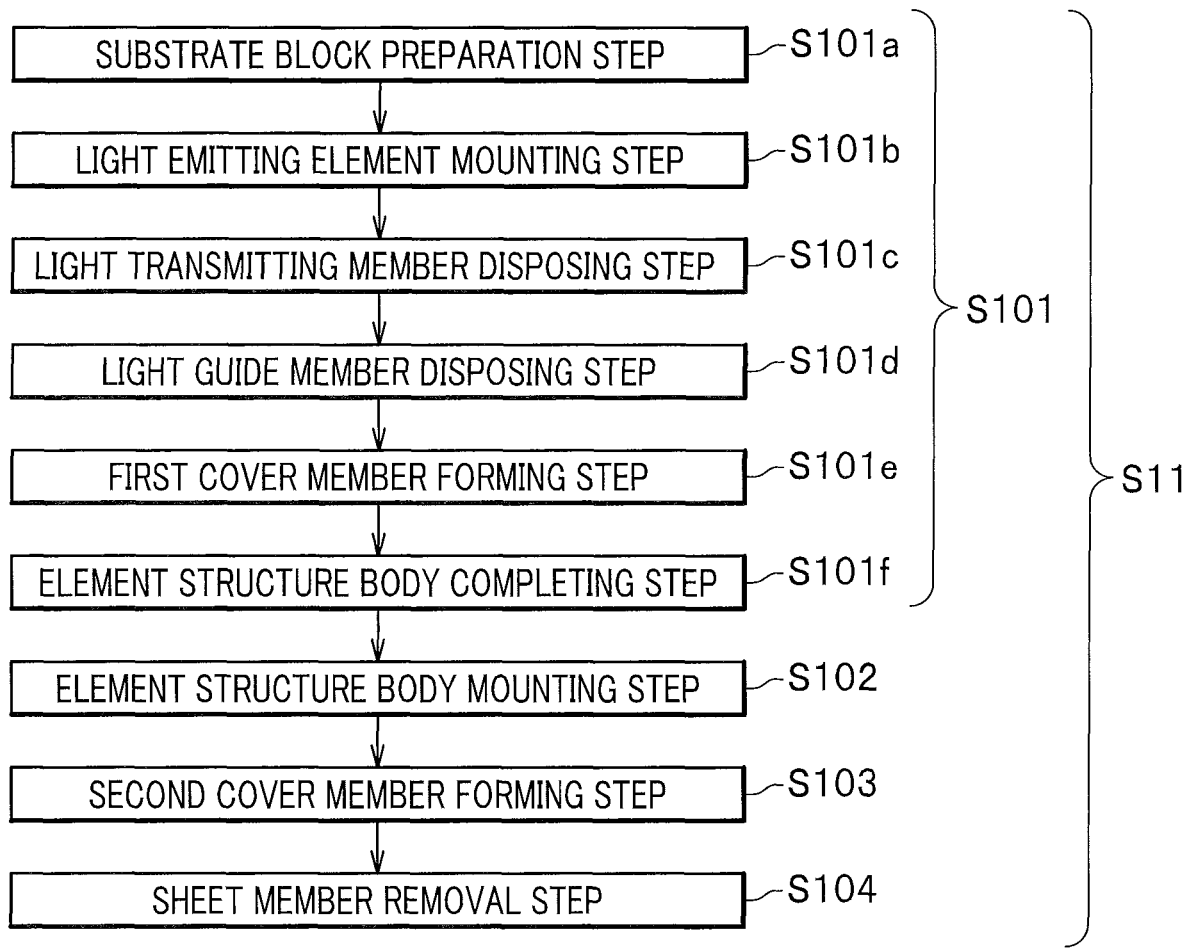
FIG. 2 is a flowchart of a method of manufacturing a light emitting device according to the first embodiment.
Figure 3:
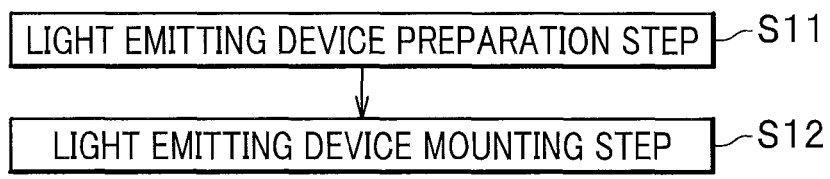
FIG. 3 is a flowchart of a method of manufacturing a light emitting module according to the first embodiment.
Figure 4A:
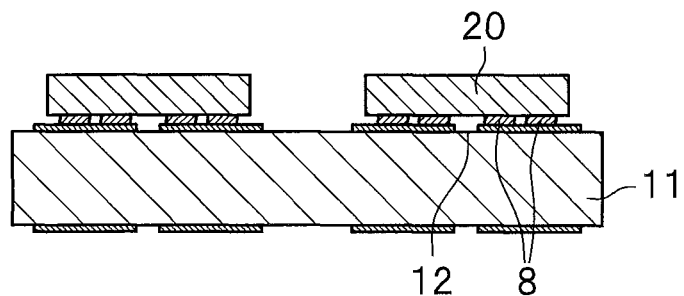
FIG. 4A is a cross-sectional view showing a step of mounting light emitting elements in an element structure body preparation step of the method of manufacturing a light emitting device according to the first embodiment.
Figure 4B:
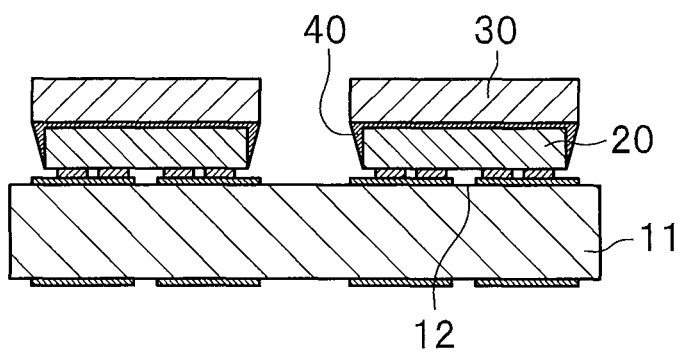
FIG. 4B is a cross-sectional view showing a step of disposing light transmitting members in the element structure body preparation step of the method of manufacturing a light emitting device according to the first embodiment.
Figure 4C:
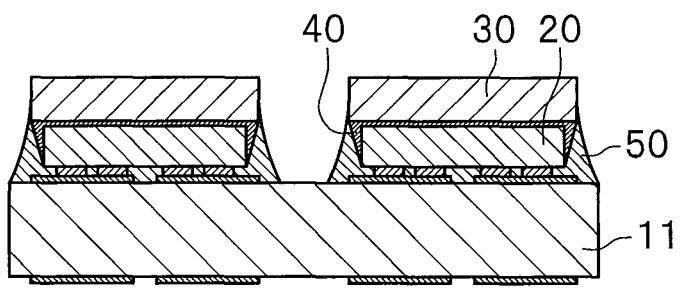
FIG. 4C is a cross-sectional view showing a step of forming first cover members in the element structure body preparation step of the method of manufacturing a light emitting device according to the first embodiment.
Figure 4D:
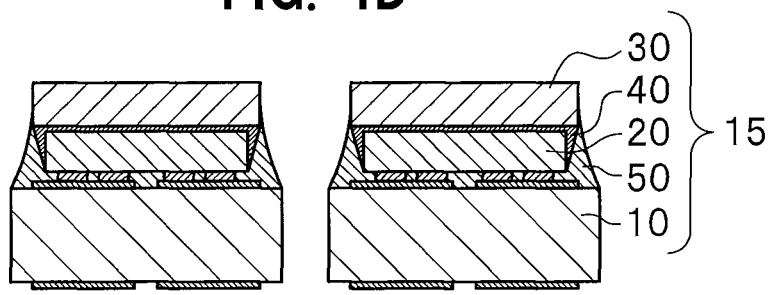
FIG. 4D is a cross-sectional view showing a step of completing element structure bodies in the element structure body preparation step of the method of manufacturing a light emitting device according to the first embodiment.
Figure 4E:
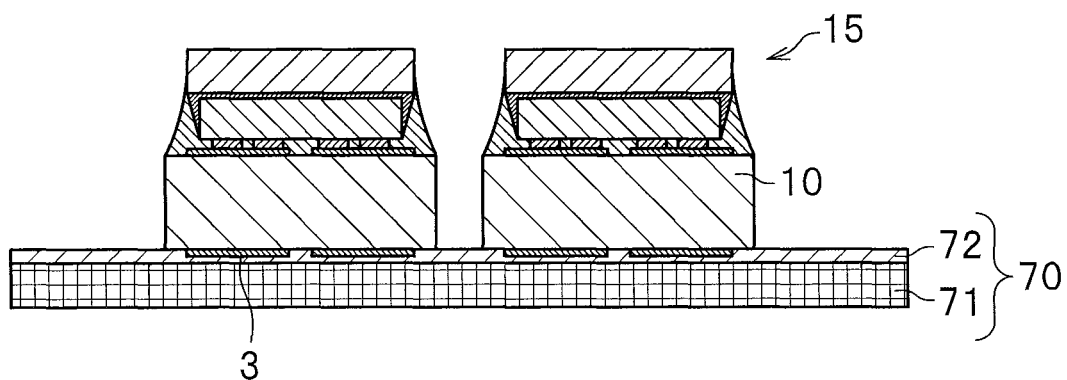
FIG. 4E is a cross-sectional view showing a step of mounting the element structure bodies in the method of manufacturing a light emitting device according to the first embodiment.
Figure 4F:
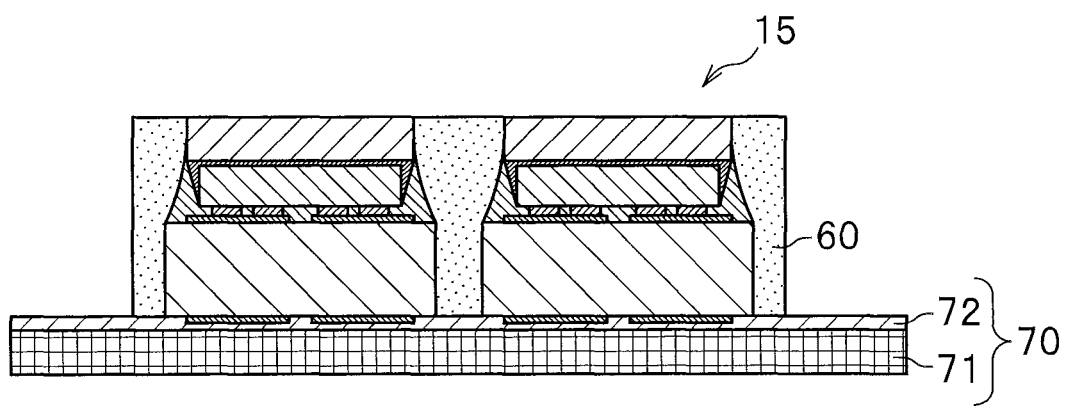
FIG. 4F is a cross-sectional view showing a step of forming a second cover member in the method of manufacturing a light emitting device according to the first embodiment.
Figure 4G:
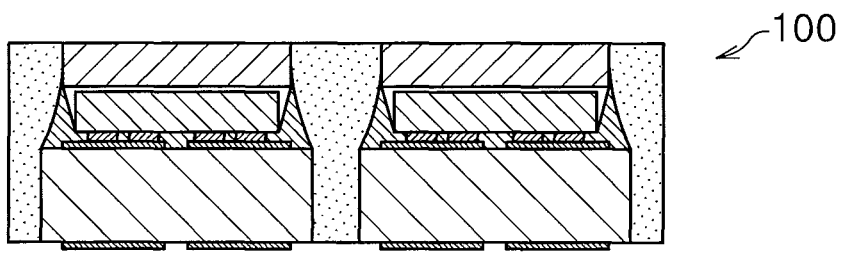
FIG. 4G is a cross-sectional view showing a step of removing the sheet member in the method of manufacturing a light emitting device according to the first embodiment.
Figure 4H:
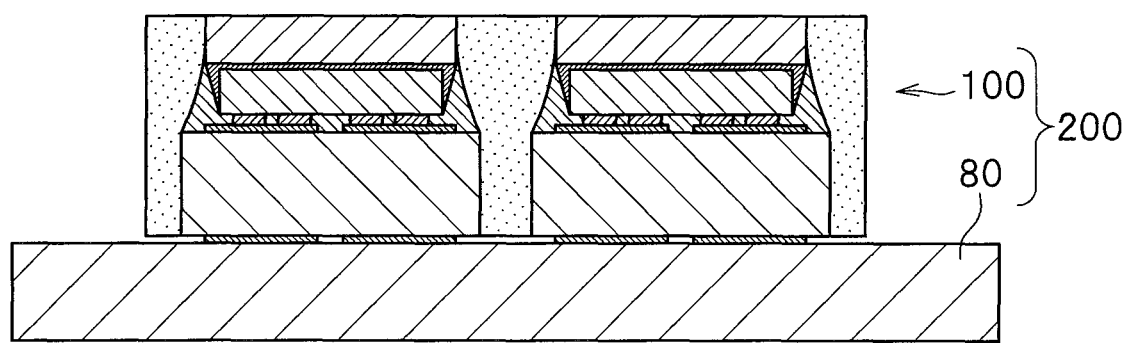
FIG. 4H is a cross-sectional view showing a step of mounting the element structure bodies in the method of manufacturing a light emitting module according to the first embodiment.

FIG. 2 is a flowchart of a method of manufacturing a light emitting device according to the first embodiment. FIG. 3 is a flowchart of manufacturing a light emitting module according to the first embodiment. FIG. 4A is a cross-sectional view showing a step of mounting light emitting elements in an element structure body preparation step of the method of manufacturing a light emitting device according to the first embodiment. FIG. 4B is a cross-sectional view showing a step of disposing light transmitting members in the element structure body preparation step of the method of manufacturing a light emitting device according to the first embodiment. FIG. 4C is a cross-sectional view showing a step of forming first cover members in the element structure body preparation step of the method of manufacturing a light emitting device according to the first embodiment. FIG. 4D is a cross-sectional view showing a step of completing element structure bodies in the element structure body preparation step of the method of manufacturing a light emitting device according to the first embodiment. FIG. 4E is a cross-sectional view showing a step of mounting the element structure bodies in the method of manufacturing a light emitting device according to the first embodiment. FIG. 4F is a cross-sectional view showing a step of forming a second cover member in the method of manufacturing a light emitting device according to the first embodiment. FIG. 4G is a cross-sectional view showing a step of removing the sheet member in the method of manufacturing a light emitting device according to the first embodiment. FIG. 4H is a cross-sectional view showing a step of mounting the element structure bodies in the method of manufacturing a light emitting module according to the first embodiment.

Method of Manufacturing Light Emitting Device

One example of method of manufacturing a light emitting device 100 will be explained first.

The method of manufacturing a light emitting device 100 includes an element structure body preparation step S101 that prepares a plurality of element structure bodies 15 each including a submount substrate 10, a light emitting element 20 disposed on the submount substrate 10, a light transmitting member 30 disposed on the light emitting element 20, a light guide member 40 disposed on the lateral faces of the light emitting element 20, and a first cover member 50 covering the lateral faces of the light emitting element 20 on the submount substrate 10; an element structure body mounting step S102 that mounts the element structure bodies 15 on a sheet member 70 such that the submount substrates 10 of the element structure bodies 15 faces the sheet member 70; a second cover member forming step S103 that forms a second cover member 60 on the sheet member 70 to support the element structure bodies 15 by covering the lateral faces of the element structure bodies 15; and a sheet member removal step S104 that removes the sheet member 70.

The element structure body preparation step S101 includes: a substrate block preparation step S101a that prepares a substrate block 11 including a plurality of submount regions 12 that will become submount substrates 10 when the substrate block 11 is subsequently divided; a light emitting element mounting step S101b that mounts light emitting elements 20 on the submount regions 12; a light transmitting member disposing step S101c that disposes light transmitting members 30 on light emitting elements 20; a light guide member disposing step S101d that disposes a light guide member 40 on the lateral faces of the light emitting elements 20; a first cover member forming step S101e that forms a first cover member 50 covering the lateral faces of the light emitting element 20 on the substrate block 11; and element structure body completing step S101f that produces a plurality of element structure bodies 15 by dividing the substrate block 11 into individual submount regions 12.

The material, location, and the like of each member are as described above in relation to the light emitting device 100, for which the explanation will be omitted as appropriate.

Element Structure Body Preparation Step

The element structure body preparation step S101 is a step that prepares a plurality of element structure bodies 15 each including a submount substrate 10, a light emitting element 20, a light transmitting member 30, a light guide member 40, and a first cover member 50.

The step S101 includes a substrate block preparation step S101a, a light emitting element mounting step S101b, a light transmitting member disposing step S101c, a light guide member disposing step S101d, a first cover member forming step S101e, and an element structure body completing step S101f.

Substrate Block Preparation Step

The substrate block preparation step S101a is a step of preparing a substrate block 11 which includes a plurality of submount regions 12 that will become submount substrates 10 after the substrate block 11 is divided.

A substrate block 11 is a piece of substrate that includes a plurality of submount regions 12 where light emitting elements 20 will be mounted. In FIG. 4A, a substrate block 11 having two submount regions 12 is shown for the sake of convenience, but the number of submount regions 12 can be suitably adjusted.

Light Emitting Element Mounting Step

The light emitting element mounting step S101b is a step of mounting the plurality of light emitting elements 20 on the plurality of submount regions 12.

In the step S101b, the light emitting elements 20 are mounted on the submount regions 12, one element per region. Each light emitting element 20 is flip-chip mounted on the wiring disposed on the submount region 12 via a conductive adhesive material 8 using the electrode forming face as the mounting face.

The step S101b includes a step of mounting protective devices 25 on the submount regions 12. In other words, in the step S101b, the plurality of protective devices 25 are mounted on the plurality of submount regions 12, one device per region.

Light Transmitting Member Disposing Step

The light transmitting member disposing step S101c is a step of disposing a light transmitting member 30 on each light emitting element 20.

In the step S101c, for example, a light transmitting member 30 having a predetermined shape is bonded to the upper face located opposite to the electrode forming face, i.e., the primary light extraction face, of each light emitting element 20.

In the step S101c, for example, a light transmitting member 30 is disposed on each light emitting element 20 on whose upper face an adhesive material is disposed. Accordingly, the light transmitting member 30 is bonded to the upper face of the light emitting element 20 via the adhesive material. As will be described later, the adhesive material is compressed by the light transmitting member 30 to become a light guide member 40 having a predetermined thickness. The lower face of the light transmitting member 30 is preferably larger in width than the upper face of the light emitting element 20. This facilitates the extension of the adhesive material over the lateral faces of the light emitting element 20. Alternatively, an adhesive material may be disposed on each light transmitting member 30 before disposing the light transmitting member 30 on each light emitting element 20 such that the adhesive material on the light transmitting member 30 is placed on the upper face of the light emitting element 20.

The light transmitting members 30 may be bonded to the light emitting elements 20 by way of direct bonding without using an adhesive material.

Light Guide Member Disposing Step

The light guide member disposing step S101d is a step of disposing a light guide member 40 on the lateral faces of the light emitting elements 20.

In the step S101d, by adjusting the amount of the adhesive material, the adhesive material disposed between the light emitting elements 20 and the light transmitting members 30 can extend over the lateral faces of the light emitting elements 20, to thereby form light guide members 40 on the lateral faces of the light emitting elements 20.

This also provides a light guide member 40 that is a bonding member having a predetermined thickness between the upper face of each light emitting element 20, i.e., the primary light extraction face, and the lower face of each light transmitting member 30 located opposite to the light extraction face. The light guide member 40 interposed between the upper face of the light emitting element 20 and the lower face of the light transmitting member 30 can be extremely thin so long as the light emitting element 20 and the light transmitting member 30 are bonded. In this manner, the step S101c and the step S101d make up the step of forming a light guide member 40 on the lateral faces of the light emitting elements 20 by disposing a light transmitting member 30 on the light emitting element 20.

As such, in the case of using for the light guide members 40 an adhesive material that bonds the light emitting elements 20 and the light transmitting member 30, the light transmitting member disposing step and the light guide disposing step can be performed as one step.

First Cover Member Forming Step

The first cover member forming step S101e is a step of forming a first cover member 50 covering the lateral faces of the light emitting elements 20 on the substrate block 11.

In the step S101e, the first cover members 50 are formed to cover the lateral faces of the light emitting elements 20 via the light guide members 40 disposed on the lateral faces of the light emitting elements 20. The first cover members 50 may also be disposed between the light emitting elements 20 and the substrate block 11. In the step S101e, the first cover members 50 are preferably disposed to cover the lower faces of the light emitting elements 20.

In the step S101e, an uncured resin material employed to form the first cover members 50 is disposed on the substrate block 11 by, for example, potting, spraying, or the like. Subsequently, the resin material is hardened to form the first cover members 50.

Element Structure Body Completing Step

The element structure body completing step S101f is a step of dividing the substrate block 11 into individual submount regions 12 to produce a plurality of element structure bodies 15.

In the step S101f, the substrate block 11 is split at predetermined positions to separate the element structure bodies 15 into individual pieces.

In the method of manufacturing a light emitting device 100, the separated element structure bodies 15 are combined to manufacture a light emitting device. In other words, because the element structure bodies 15 can be sorted after being divided into individual structures, a light emitting device 100 can be produced using a desired combination of element structure bodies 15 that have been sorted according to the emission characteristics of predetermined ranges. This can produce a light emitting device 100 having a desired emission color with limited color unevenness.

Furthermore, because each element structure body 15 includes a first cover member 50, the element structure bodies can be easily sorted according to the emission characteristics of predetermined ranges even when the emission colors of the element structure bodies 15 differ from the emission colors of the light emitting elements 20, such as a case in which the light transmitting members 30 contain a wavelength conversion material.

Furthermore, if some element structure bodies 15 fail during the manufacturing step, only the failed element structure bodies 15 could be discarded prior to the step of mounting the element structure bodies 15 on a sheet member 70. In the case of a light emitting device where multiple light emitting elements are mounted on a single submount substrate, the entire light emitting device would have to be discarded should some components fail. The method of manufacturing a light emitting device according to this embodiment can therefore reduce the amount of waste in the event of a failure in the step.

Element Structure Body Mounting Step

The element structure body mounting step S102 is a step of mounting multiple element structure bodies 15 on a sheet member 70 such that the submount substrates 10 of the element structure bodies 15 faces the sheet member 70. In other words, multiple element structure bodies 15 are mounted on a sheet member 70 such that the lower faces of the submount substrates 10 (i.e., the faces located opposite to the faces on which the light emitting elements 20 is mounted) are in contact with the upper face of the sheet member 70. The sheet member 70 has a pressure sensitive adhesive 72 disposed on the upper face of a support member 71. In the case where the element structure bodies 15 have external connection electrodes 3 on the lower faces, the lower faces of the element structure bodies 15 are preferably pushed into the pressure sensitive adhesive 72 such that the external connection electrodes 3 are buried in the pressure sensitive adhesive 72 of the sheet member 70. This can restrain the second cover member 60 from reaching under the surfaces of the external connection electrodes 3 in the second cover member forming step S103 described later.

In the step S102, the separated element structure bodies 15 are arranged on a sheet member 70. Thus, in the case of using a blade in separating them into individual structures, for example, the element structure bodies 15 can be arranged at a smaller distance from one another than the blade width. This can produce a light emitting device 100 having narrow spacing between emission faces.

The sheet member 70 can be ones known in the art, such as a heat resistant resin sheet, UV curable sheet, and the like.

Second Cover Member Forming Step

The second cover member forming step S103 is a step of forming on the sheet member 70 a second cover member 60 that supports element structure bodies 15 by covering the lateral faces of the element structure bodies 15.

In the step S103, an uncured resin material used to form the second cover member 60 is disposed on the sheet member 70 by, for example, potting, spraying, or the like. Subsequently, the resin material is hardened to form the second cover member 60.

In the step S103, the second cover member 60 is disposed to cover the lateral faces of the element structure bodies 15 (i.e., the lateral faces of the submount substrates 10, the lateral faces of the light emitting elements 20, and the lateral faces of the light transmitting members 30) while exposing the upper faces of the light transmitting members 30. The second cover member 60 may be disposed to cover the upper faces of the light transmitting members 30 followed by partially removing the second cover member 60 by polishing, grinding, cutting, or the like to expose the upper faces of the light transmitting members 30.

The second cover member 60 may alternatively be formed by molding, printing, or the like.

Sheet Member Removal Step

The sheet member removal step S104 is a step of removing the sheet member 70.

In the step S104, the sheet member 70 on which the element structure bodies 15 and the like are mounted is detached to obtain a light emitting device 100.

The light emitting device 100 produced in this manner having narrow spacing between emission faces can facilitate the light distribution adjustment achieved by an optical system such as a lens.

Method of Manufacturing Light Emitting Module

One example of method of manufacturing a light emitting module 200 will be explained next.

The method of manufacturing a light emitting module 200 includes a light emitting device preparation step S11 that prepares a light emitting device 100 using the method of manufacturing a light emitting device 100, and a light emitting device mounting step S12 that mounts the light emitting device 100 on a module substrate 80 such that the submount substrates 10 faces the module substrate.

The material, location, and the like of each member are as described above with reference to the light emitting module 200, for which the explanation will be omitted as appropriate.

Light Emitting Device Preparation Step

The light emitting device preparation step S11 is a step of preparing a light emitting device 100 using the method of manufacturing a light emitting device 100 described above.

In the step S11, a light emitting device 100 is produced by performing the steps S101 to S104 described above.

Light Emitting Device Mounting Step

The light emitting device mounting step S12 is a step of mounting a light emitting device 100 on a module substrate 80 such that the submount substrates 10 of the light emitting device 100 faces the module substrate 80.

In the step S12, a light emitting device 100 is mounted on the upper face of a module substrate 80. The light emitting device 100 is mounted on the upper face of the module substrate 80 using the submount substrate 10 side as the mounting face.

Second Embodiment

Figure 5A:
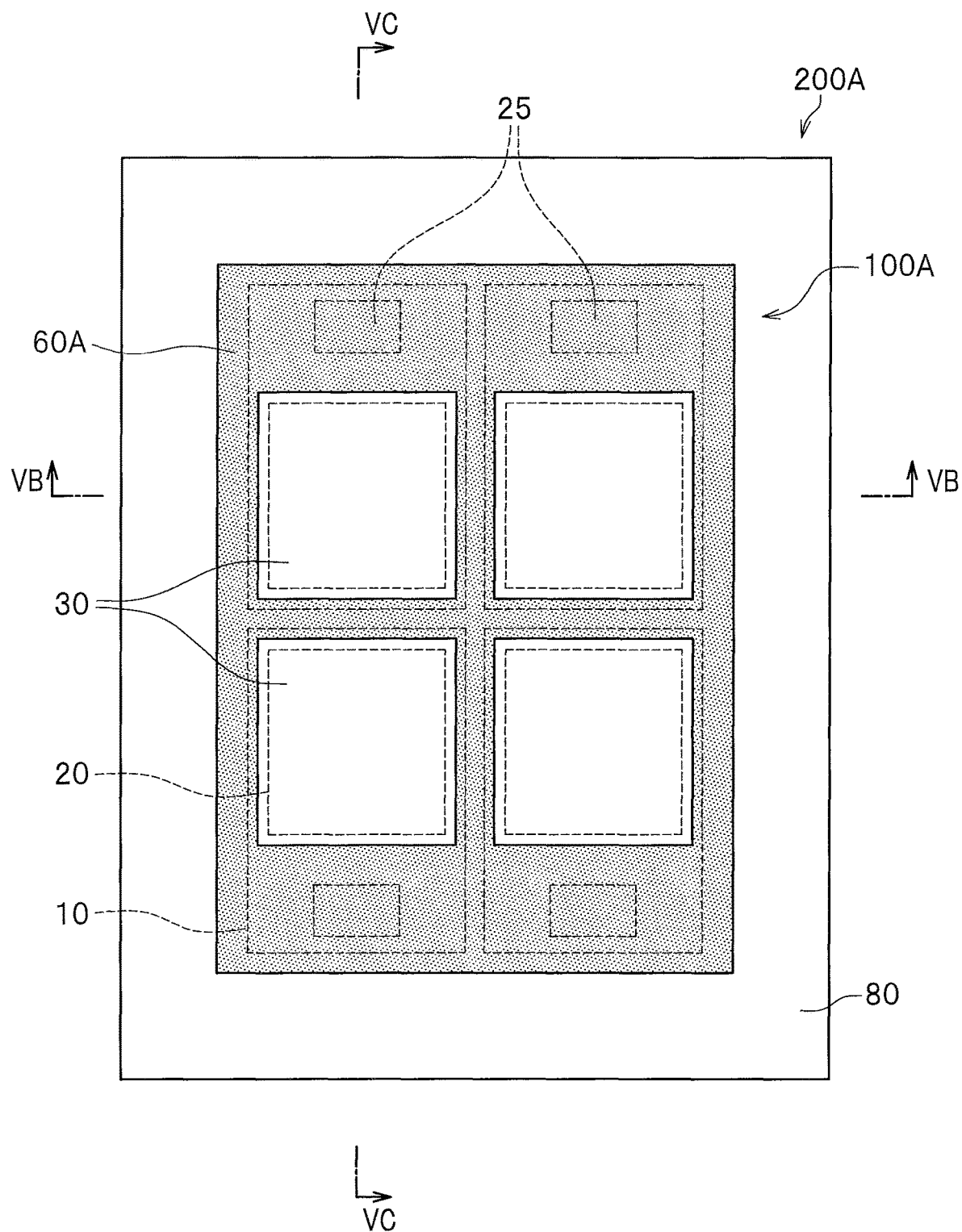
FIG. 5A is a plan view schematically showing the structure of a light emitting module that includes a light emitting device according to a second embodiment.
Figure 5B:
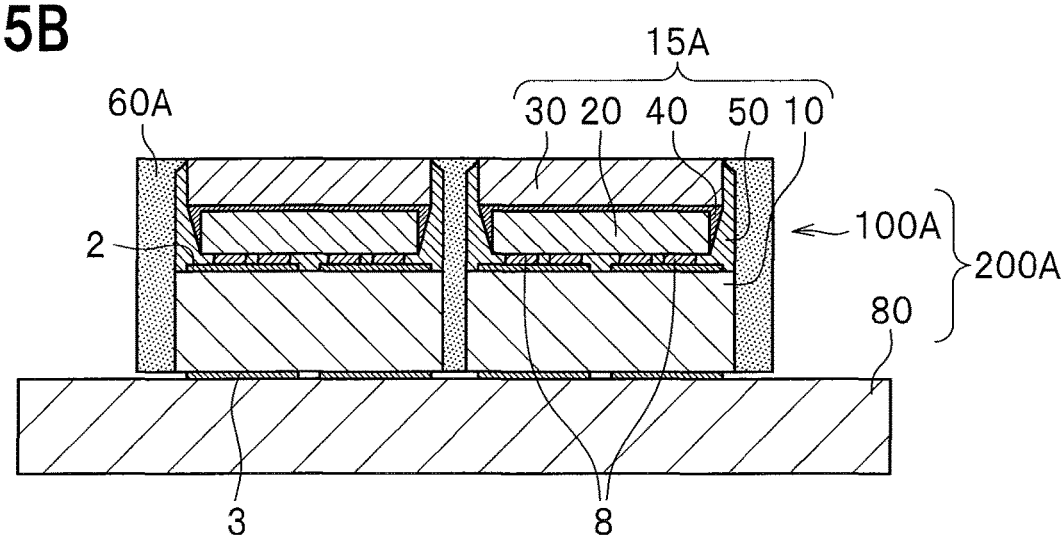
FIG. 5B is a cross-sectional view taken along line VB-VB in FIG. 5A.
Figure 5C:
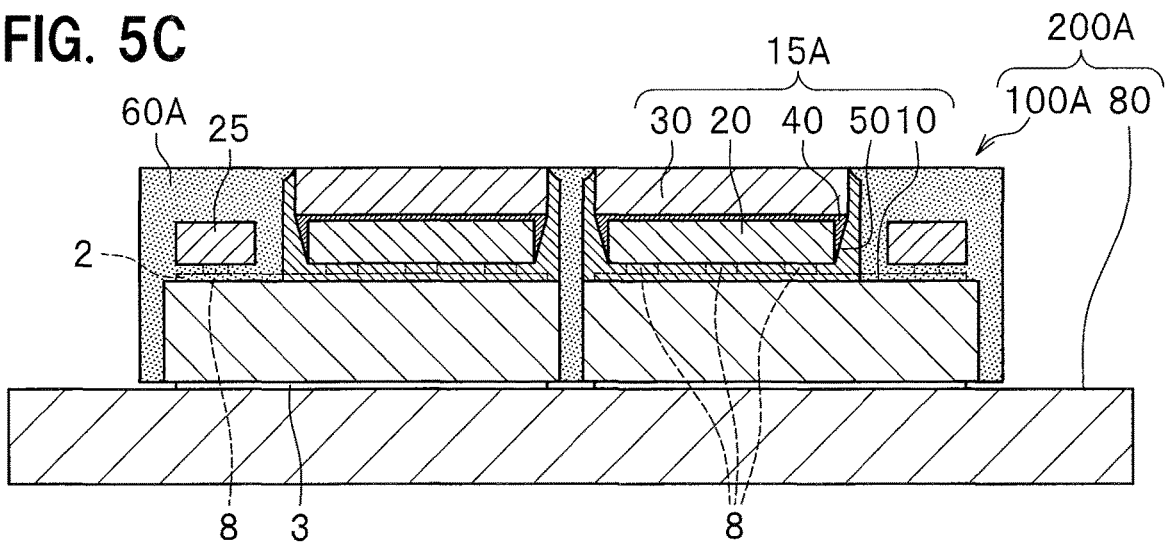
FIG. 5C is a cross-sectional view taken along line VC-VC in FIG. 5A.
Figure 5D:
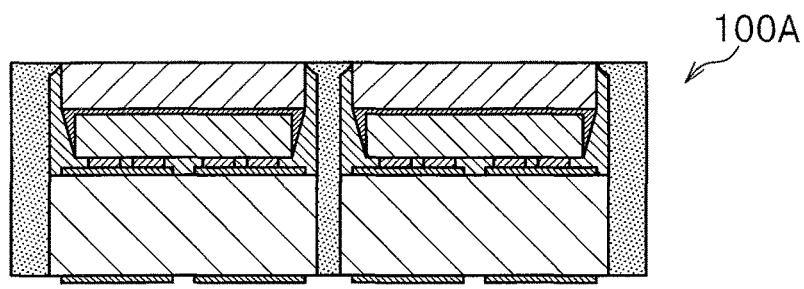
FIG. 5D is a cross-sectional view schematically showing the structure of the light emitting device according to the second embodiment.

FIG. 5A is a plan view schematically showing the structure of a light emitting module equipped with a light emitting device according to a second embodiment. FIG. 5B is a cross-sectional view taken along line VB-VB in FIG. 5A. FIG. 5C is a cross-sectional view taken along line VC-VC in FIG. 5A. FIG. 5D is a cross-sectional view schematically showing the structure of the light emitting device according to the second embodiment.

A light emitting module 200A includes a light emitting device 100A and a module substrate 80 on which the light emitting device 100A is mounted.

Light Emitting Device

A light emitting device 100A will be explained first.

The light emitting device 100A uses element structure bodies 15A instead of element structure bodies 15. The light emitting device 100A also uses a second cover member 60A instead of a second cover member 60. The other features are the same as or similar to those in the light emitting device 100 according to the first embodiment, for which the explanation will be omitted as appropriate.

In each element structure body 15A, the first cover member 50 covers the lateral faces of the light emitting element 20 and the lateral faces of the light transmitting member 30 on the submount substrate 10. Specifically, the first cover member 50 covers the lower face of the light emitting element 20 as well as covering the lateral faces of the light emitting element 20 via the light guide member 40. The first cover member 50 further covers the lateral faces of the light transmitting member 30. The first cover member 50 covering the lateral faces of the light transmitting member 30 makes it easier to identify the chromaticity coordinates and measure the optical characteristics of an element structure body 15A. The upper face of the first cover member 50 is curved to be concave in a cross-sectional view such that the height decreases as the distance from each lateral face of the light transmitting member 30 increases. Such a structure can reduce the distance between each light transmitting member 30 and the second cover member 60A that surrounds the light transmitting member 30 in the upper face of the light emitting device 100A that includes the emission faces.

For the second cover member 60A, a black resin or a gray resin is preferably used. Disposing a second cover member 60A, which is a black or gray resin, between element structure bodies 15A can restrain the light from one element structure body 15A from entering adjacent element structure bodies 15A. This can produce a high-contrast light emitting device having a "clearly distinguishable boundary" between the emission region and non-emission region when individually lighting the light emitting elements. Examples of black or gray resins include resins containing a coloring material, such as carbon black, graphite, and the like. The color density of black, gray, or the like can be adjusted by the content of the coloring material. The other materials are the same as or similar to those used for the second cover member 60.

Light Emitting Module

A light emitting module 200A will be explained next.

The light emitting module 200A is the same as or similar to the light emitting module 200 according to the first embodiment except for the use of a light emitting device 100A.

Manufacturing Method of Second Embodiment

Figure 6A:
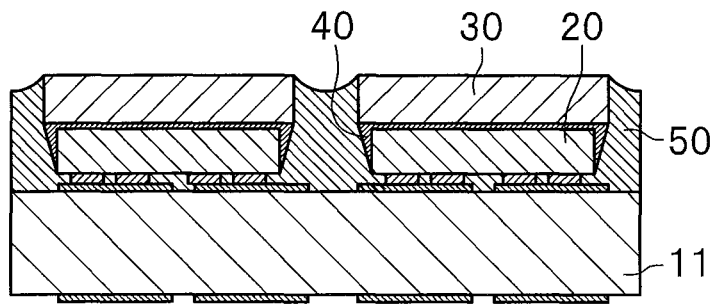
FIG. 6A is a cross-sectional view showing a step of forming a first cover member in an element structure body preparation step of the method of manufacturing a light emitting device according to the second embodiment.
Figure 6B:
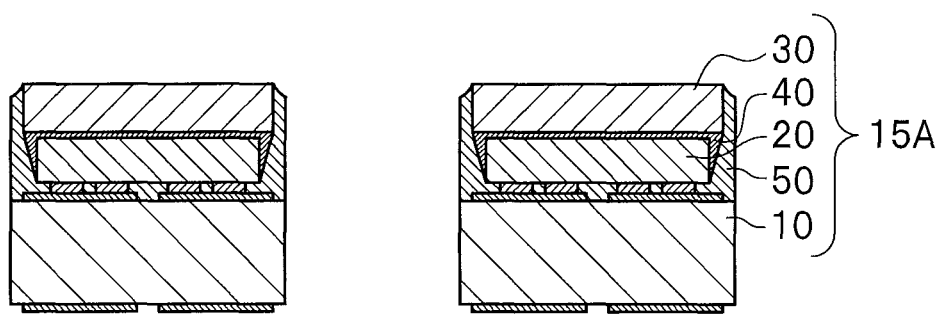
FIG. 6B is a cross-sectional view showing a step of completing element structure bodies in the element structure body preparation step of the method of manufacturing a light emitting device according to the second embodiment.
Figure 6C:
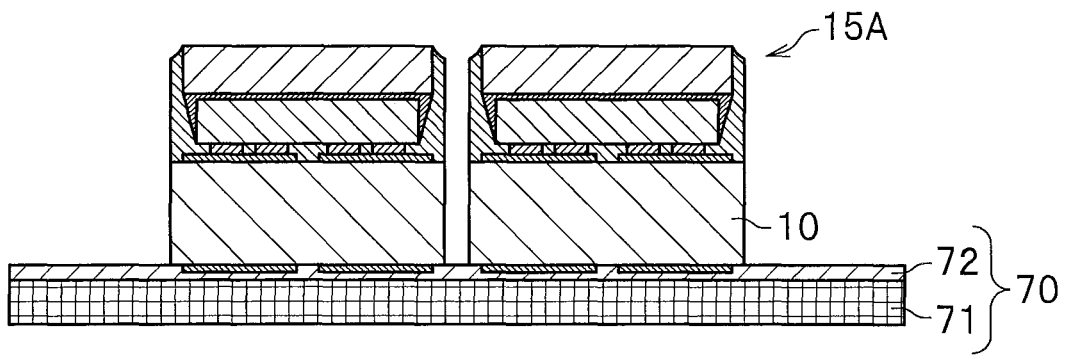
FIG. 6C is a cross-sectional view showing a step of mounting the element structure bodies in the method of manufacturing a light emitting device according to the second embodiment.
Figure 6D:
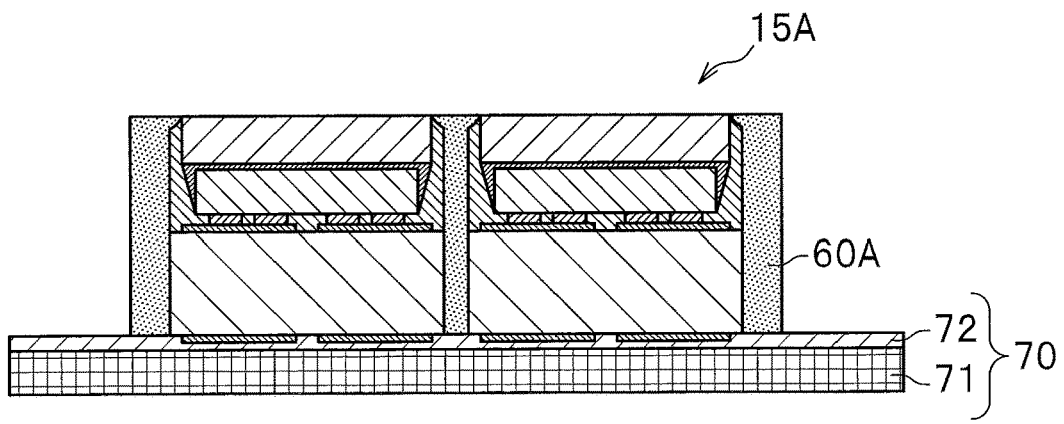
FIG. 6D is a cross-sectional view showing a step of forming a second cover member in the method of manufacturing a light emitting device according to the second embodiment.
Figure 6E:
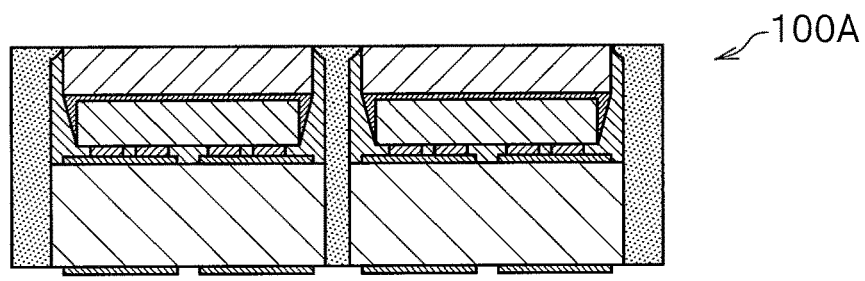
FIG. 6E is a cross-sectional view showing a step of removing the sheet member in the method of manufacturing a light emitting device according to the second embodiment.
Figure 6F:
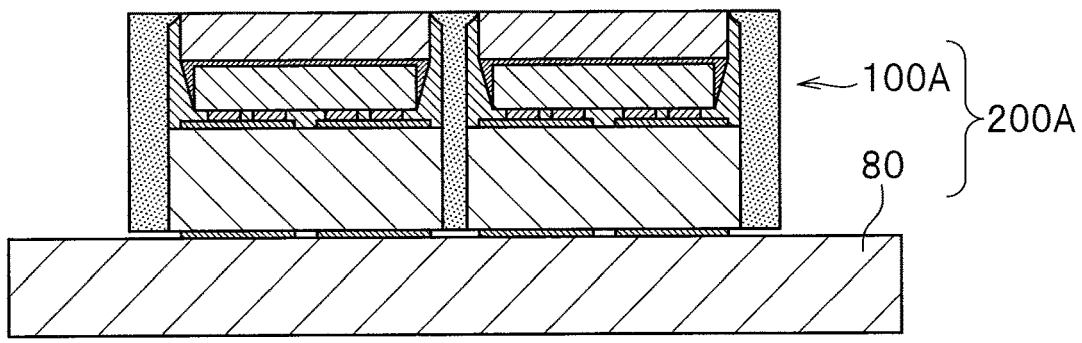
FIG. 6F is a cross-sectional view showing a step of mounting the light emitting device in the method of manufacturing a light emitting module according to the second embodiment.

FIG. 6A is a cross-sectional view showing a step of forming a first cover member in an element structure body preparation step of the method of manufacturing a light emitting device according to the second embodiment. FIG. 6B is a cross-sectional view showing a step of completing element structure bodies in the element structure body preparation step of the method of manufacturing a light emitting device according to the second embodiment. FIG. 6C is a cross-sectional view showing a step of mounting the element structure bodies in the method of manufacturing a light emitting device according to the second embodiment. FIG. 6D is a cross-sectional view showing a step of forming a second cover member in the method of manufacturing a light emitting device according to the second embodiment. FIG. 6E is a cross-sectional view showing a step of removing the sheet member in the method of manufacturing a light emitting device according to the second embodiment. FIG. 6F is a cross-sectional view showing a step of mounting the light emitting device in the method of manufacturing a light emitting module according to the second embodiment.

Method of Manufacturing Light Emitting Device

One example of method of manufacturing a light emitting device 100A will be explained first.

The method of manufacturing a light emitting device 100A includes the steps S101 to S104 described in reference to the method of manufacturing a light emitting device 100. The differences in the method of manufacturing a light emitting device 100A from the method of manufacturing a light emitting device 100 will be explained below.

The method of manufacturing a light emitting device 100A, in the element structure body preparation step S101, prepares a plurality of element structure bodies 15A each having a first cover member 50 covering the lateral faces of the light emitting element 20 and the lateral faces of the light transmitting member 30.

In other words, the method of manufacturing a light emitting device 100A, in the first cover member forming step S101e, forms a first cover member 50 on the substrate block 11 to cover the lateral faces of the light emitting elements 20 and the lateral faces of the light transmitting members 30. The resin material employed to form the first cover member 50 contains a high boiling point organic solvent, such as decane, dodecane, or the like, in order to reduce the post-curing volume while covering the lateral faces of the light transmitting members 30. In the step S101e, the organic solvent evaporates as the resin material hardens to readily create depressions in the upper face of the first cover member 50. This facilitates the formation of the first cover member 50 having depressed portions in the upper face between adjacent light transmitting members 30 in a cross-sectional view while covering the lateral faces of the light transmitting members 30.

The method of manufacturing a light emitting device 100A, in the second cover member forming step S103, forms a second cover member 60A on a sheet member 70 to cover the lateral faces of the element structure bodies 15A. At this point, the second cover member 60A also covers the upper faces of the first cover members 50.

Method of Manufacturing Light Emitting Module

One example of method of manufacturing a light emitting module 200A will be explained next.

The method of manufacturing a light emitting module 200A is the same as or similar to the method of manufacturing a light emitting module 200 according to the first embodiment except for the use of a light emitting device 100A prepared by the method of manufacturing a light emitting device 100A described above.

Third Embodiment

Figure 7A:
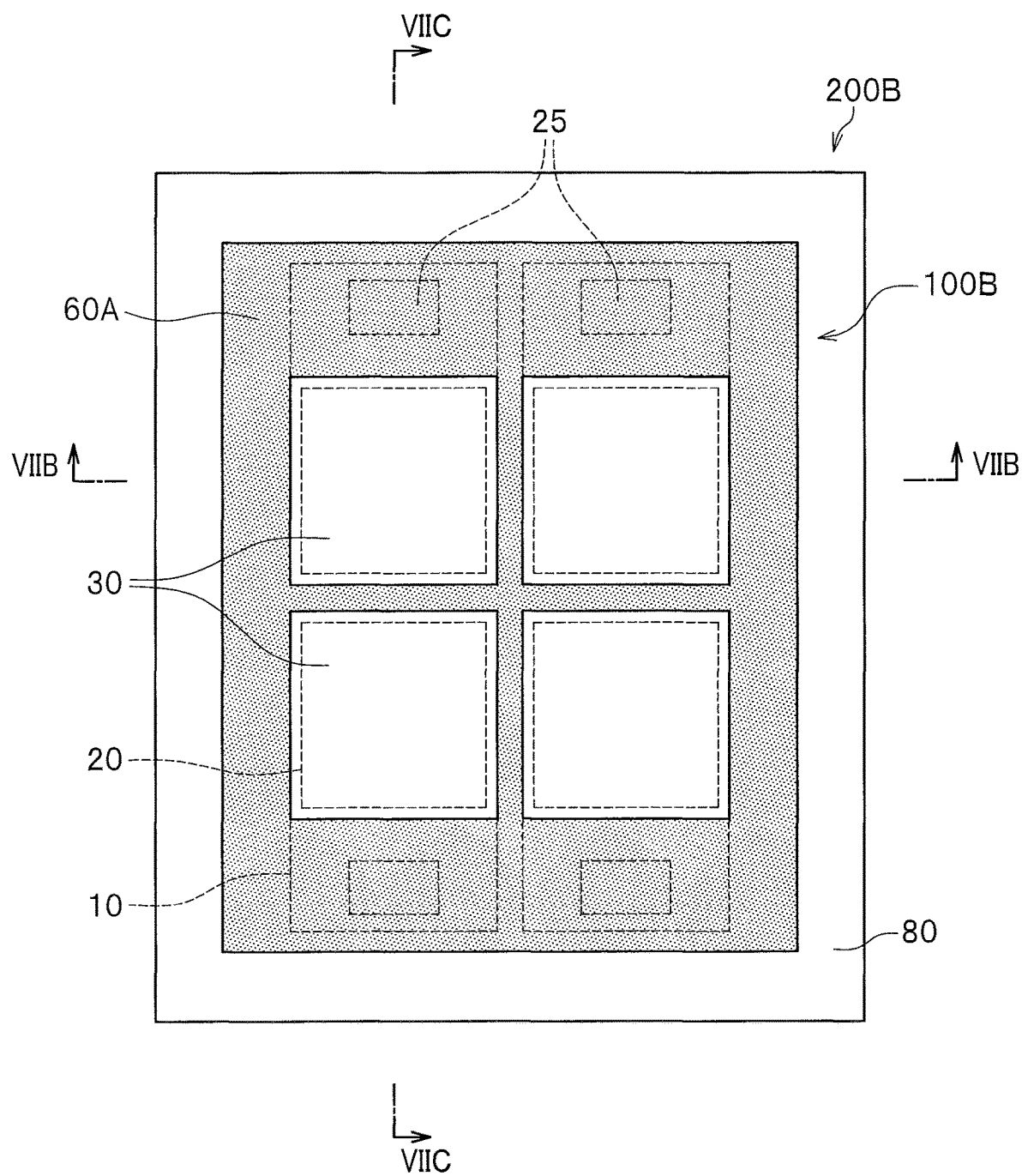
FIG. 7A is a plan view schematically showing the structure of a light emitting module that includes a light emitting device according to a third embodiment.
Figure 7B:
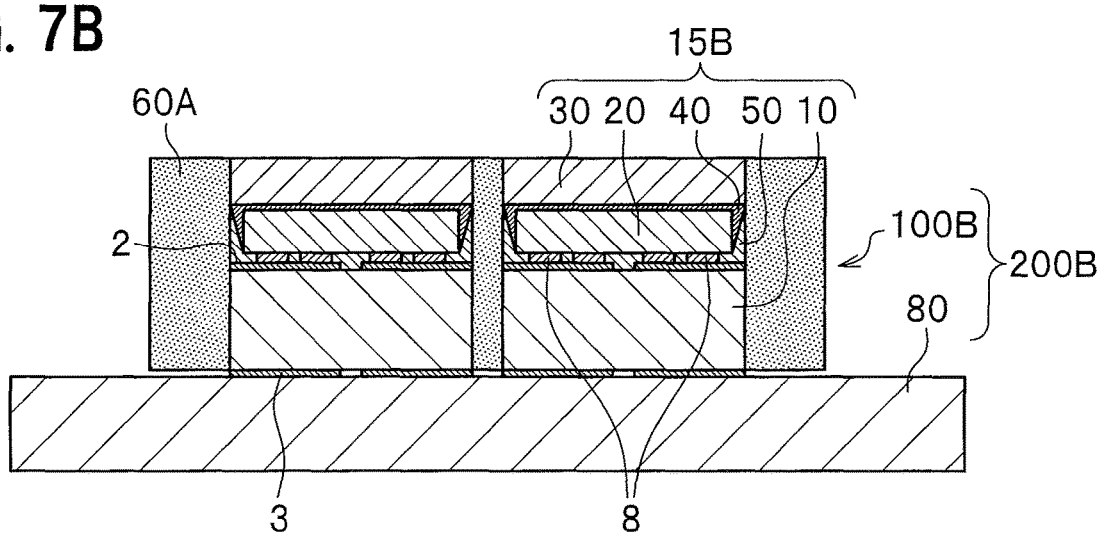
FIG. 7B is a cross-sectional view taken along line VIIB-VIIB in FIG. 7A.
Figure 7C:
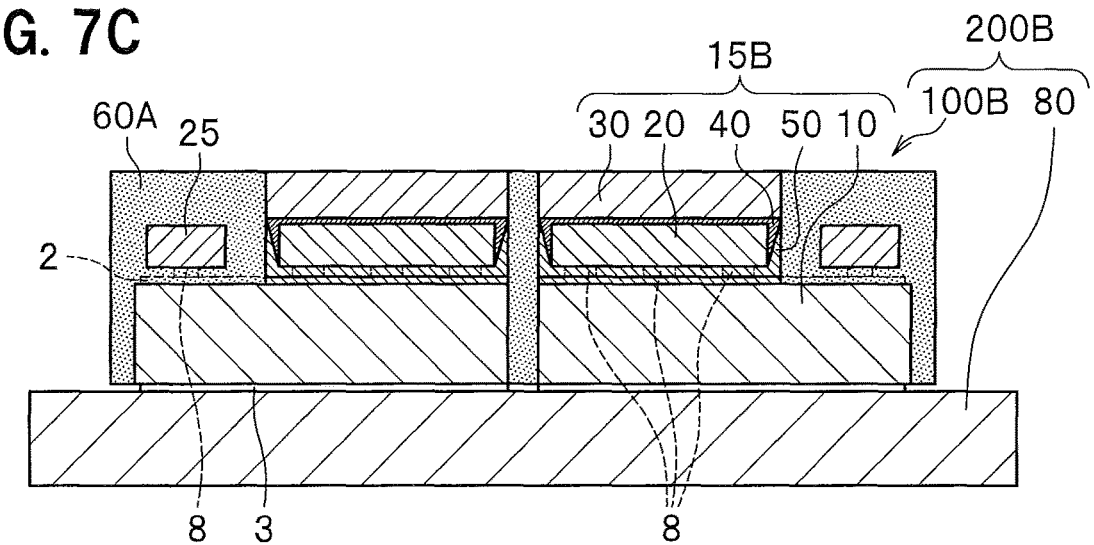
FIG. 7C is a cross-sectional view taken along line VIIC-VIIC in FIG. 7A.
Figure 7D:
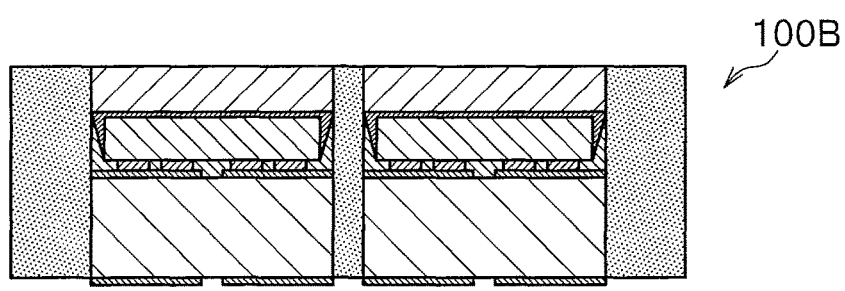
FIG. 7D is a cross-sectional view schematically showing the structure of the light emitting device according to the third embodiment.

FIG. 7A is a plan view schematically showing the structure of a light emitting module that includes a light emitting device according to a third embodiment. FIG. 7B is a cross-sectional view taken along line VIIB-VIIB in FIG. 7A. FIG. 7C is a cross-sectional view taken along line VIIC-VIIC in FIG. 7A. FIG. 7D is a cross-sectional view schematically showing the structure of the light emitting device according to the third embodiment.

A light emitting module 200B includes a light emitting device 100B, and a module substrate 80 on which the light emitting device 100B is mounted.

Light Emitting Device

A light emitting device 100B will be explained first.

The light emitting device 100B uses element structure bodies 15B instead of element structure bodies 15A. The other features are the same as or similar to those in the light emitting device 100A according to the second embodiment, for which the explanation will be omitted as appropriate.

In the light emitting device 100B, the width of each element structure body 15B is substantially the same from the lower face of the submount substrate 10 to the upper face of the light transmitting member 30 in a cross-sectional view. In other words, in the light emitting device 100B, the width of the submount substrate 10 and the width of the light transmitting member 30 are substantially the same in a cross-sectional view. This allows the second cover member 60A formed between adjacent element structure bodies 15B to have substantially the same thickness from the lower faces to the upper faces of the element structure bodies 15B. In the light emitting device 100B, moreover, the first cover members 50 do not cover the lateral faces of the light transmitting members 30.

Light Emitting Module

A light emitting module 200B will be explained next.

The light emitting module 200B is the same as or similar to the light emitting module 200 except for the use of a light emitting device 100B.

Manufacturing Method of Third Embodiment

Figure 8A:
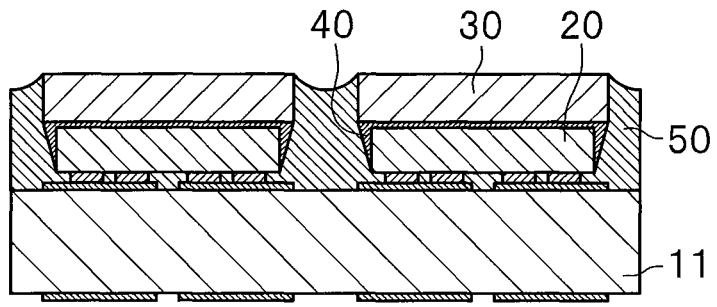
FIG. 8A is a cross-sectional view showing a step of forming a first cover member in an element structure body preparation step of the method of manufacturing a light emitting device according to the third embodiment.
Figure 8B:
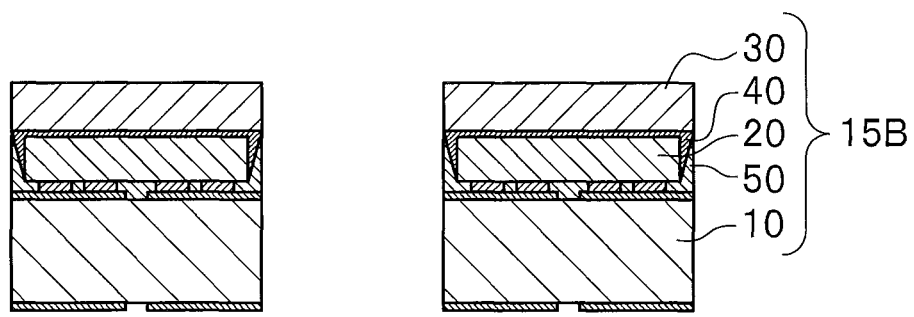
FIG. 8B is a cross-sectional view showing a step of completing element structure bodies in the element structure body preparation step of the method of manufacturing a light emitting device according to the third embodiment.
Figure 8C:
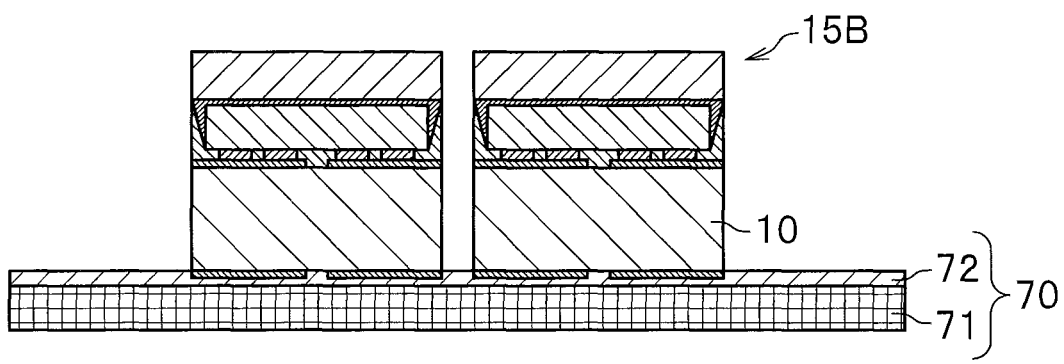
FIG. 8C is a cross-sectional view showing a step of mounting the element structure bodies in the method of manufacturing a light emitting device according to the third embodiment.
Figure 8D:
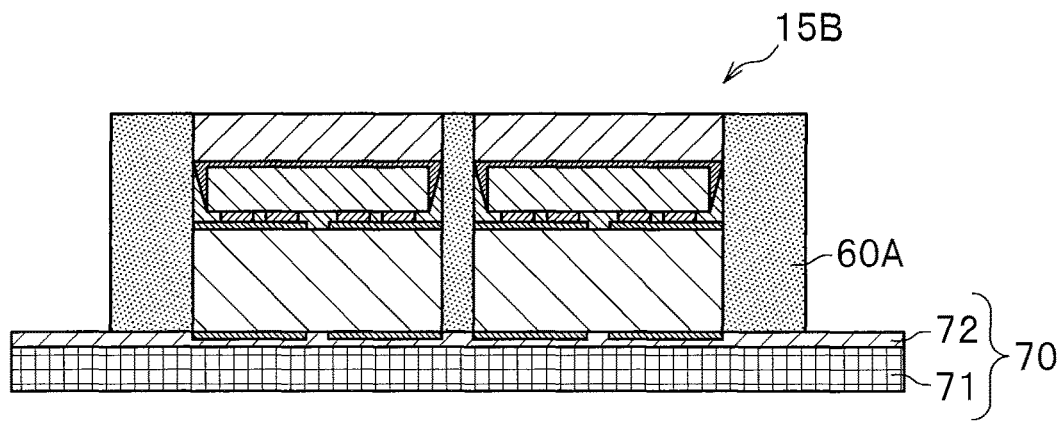
FIG. 8D is a cross-sectional view showing a step of forming a second cover member in the method of manufacturing a light emitting device according to the third embodiment.
Figure 8E:
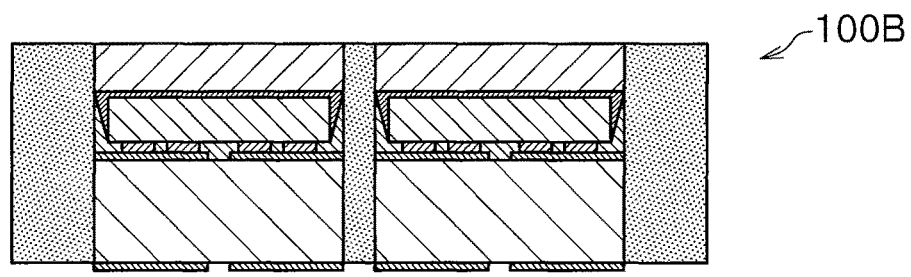
FIG. 8E is a cross-sectional view showing a step of removing the sheet member in the method of manufacturing a light emitting device according to the third embodiment.
Figure 8F:
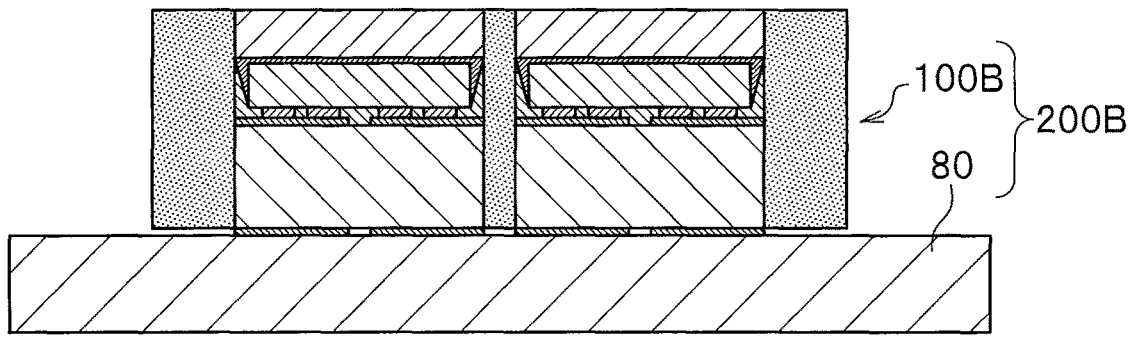
FIG. 8F is a cross-sectional view showing a step of mounting the light emitting device in the method of manufacturing a light emitting module according to the third embodiment.

FIG. 8A is a cross-sectional view showing a step of forming a first cover member in an element structure body preparation step of the method of manufacturing a light emitting device according to the third embodiment. FIG. 8B is a cross-sectional view showing a step of completing element structure bodies in the element structure body preparation step of the method of manufacturing a light emitting device according to the third embodiment. FIG. 8C is a cross-sectional view showing a step of mounting the element structure bodies in the method of manufacturing a light emitting device according to the third embodiment. FIG. 8D is a cross-sectional view showing a step of forming a second cover member in the method of manufacturing a light emitting device according to the third embodiment. FIG. 8E is a cross-sectional view showing a step of removing the sheet member in the method of manufacturing a light emitting device according to the third embodiment. FIG. 8F is a cross-sectional view showing a step of mounting the light emitting device in the method of manufacturing a light emitting module according to the third embodiment.

Method of Manufacturing Light Emitting Device

One example of method of manufacturing a light emitting device 100B will be explained first.

The method of manufacturing a light emitting device 100B includes the steps S101 to S104 explained with reference to the method of manufacturing a light emitting device 100. The differences in the method of manufacturing a light emitting device 100B from the method of manufacturing a light emitting device 100A will be explained below. The method of manufacturing a light emitting device 100B primarily differs from the method of manufacturing a light emitting device 100A such that it produces element structure bodies 15B each having the same width from the lower face of the submount substrate 10 to the upper face of the light transmitting member 30 in a cross-sectional view.

The method of manufacturing a light emitting device 100B, in the element structure body completing step S101f, divides the substrate block 11 into submount regions 12 at the positions along the lateral faces of the light transmitting members 30. In other words, the substrate block 11 is divided such that the width of the submount substrate 10 is the same as the width of the light transmitting member 30 in each element structure body in a cross-sectional view. This removes the first cover member covering the lateral faces of the light transmitting members 30. In this manner, element structure bodies 15B each having the same width from the upper face to the lower face in a cross-sectional view are produced.

The element structure bodies 15B in which the submount substrates 10 and light transmitting members 30 have the same width allows the distance between adjacent light transmitting members 30 to be further reduced when mounted on a sheet member 70. This can further narrow the space between adjacent emission faces in the light emitting device 100B.

The method of manufacturing a light emitting device 100B, in the second cover member forming step S103, forms a second cover member 60A on a sheet member 70 so as to cover the lateral faces of the element structure bodies 15B.

Method of Manufacturing Light Emitting Module

One example of method of manufacturing a light emitting module 200B will be explained next.

The method of manufacturing a light emitting module 200B is the same as or similar to the method of manufacturing a light emitting module 200 according to the first embodiment except for the use of a light emitting device 100B prepared by the method of manufacturing a light emitting device 100B described above.

Fourth Embodiment

Figure 9A:
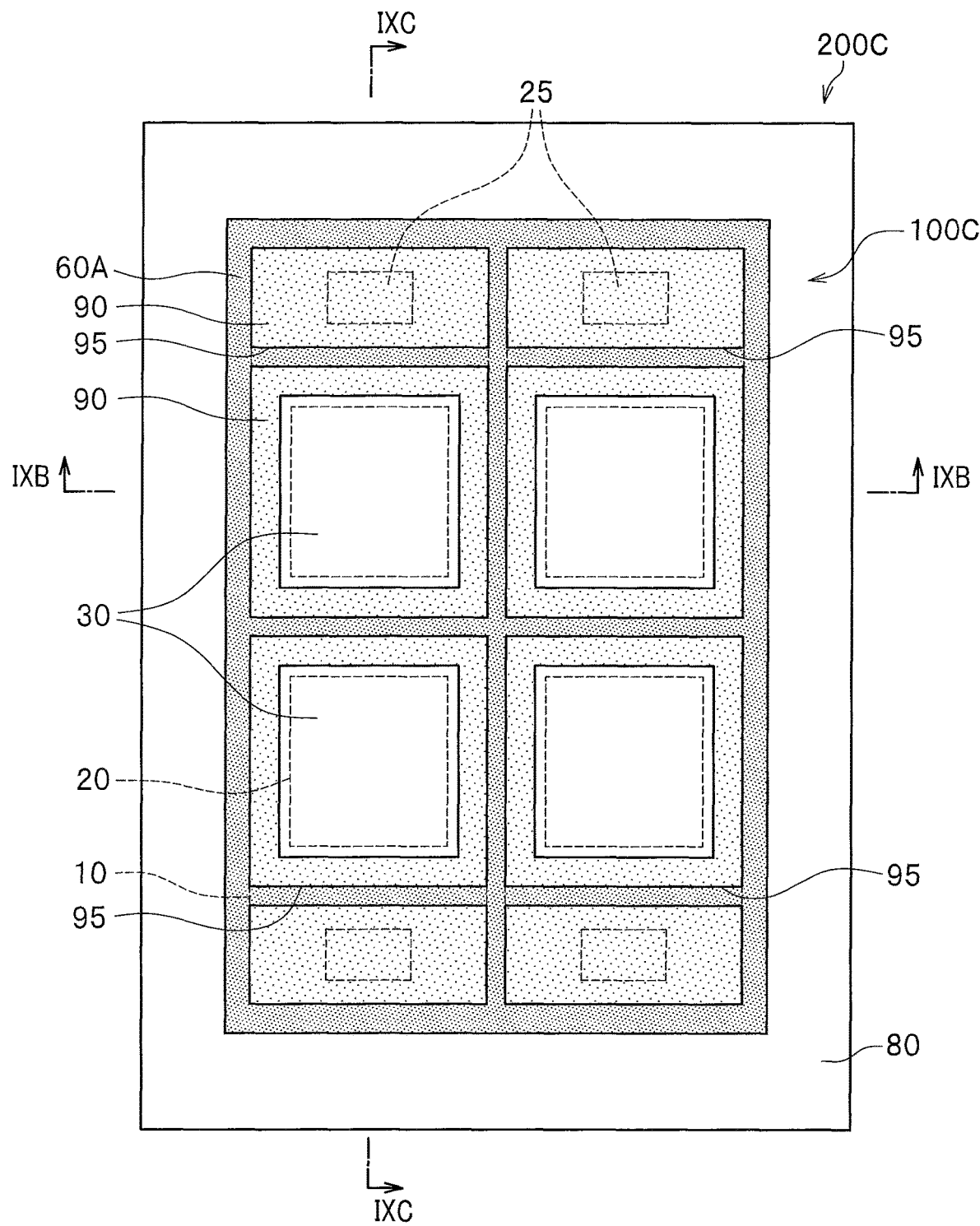
FIG. 9A is a plan view schematically showing the structure of a light emitting module that includes a light emitting device according to a fourth embodiment.
Figure 9B:
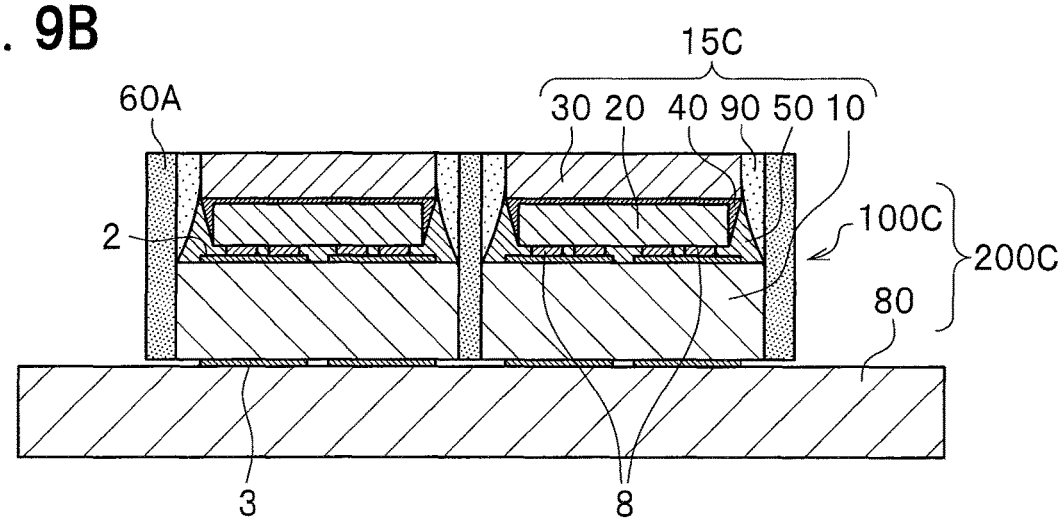
FIG. 9B is a cross-sectional view taken along line IXB-IXB in FIG. 9A.
Figure 9C:
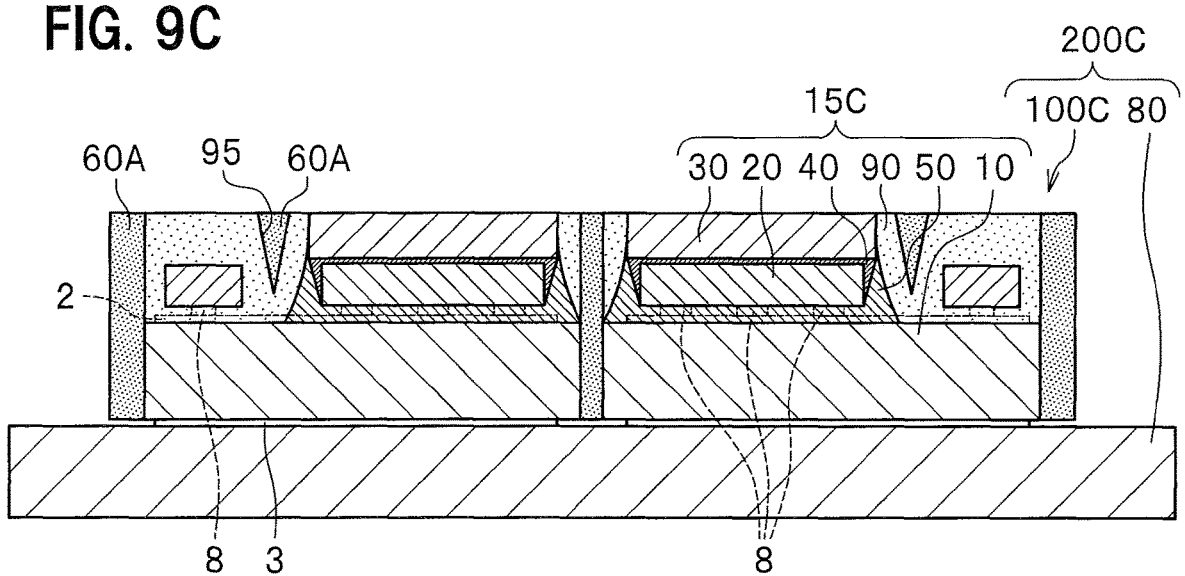
FIG. 9C is a cross-sectional view taken along line IXC-IXC in FIG. 9A.
Figure 9D:
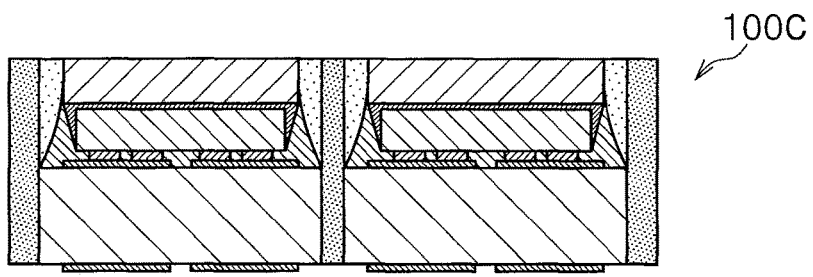
FIG. 9D is a cross-sectional view schematically showing the structure of the light emitting device according to the fourth embodiment.

FIG. 9A is a plan view schematically showing the structure of a light emitting module which includes a light emitting device according to a fourth embodiment. FIG. 9B is a cross-sectional view taken along line IXB-IXB in FIG. 9A. FIG. 9C is a cross-sectional view taken along line IXC-IXC in FIG. 9A. FIG. 9D is a cross-sectional view schematically showing the structure of the light emitting device according to the fourth embodiment.

A light emitting module 200C includes a light emitting device 100C and a module substrate 80 on which the light emitting device 100C is mounted.

Light Emitting Device

A light emitting device 100C will be explained first.

The light emitting device 100C uses element structure bodies 15C instead of element structure bodies 15. The other features are the same as or similar to those in the light emitting device 100 according to the first embodiment, for which the explanation will be omitted as appropriate.

Each element structure body 15C includes a third cover member 90 covering the lateral faces of the light emitting element 20 and the lateral faces of the light transmitting member 30 in a thickness that makes the width of the element structure body 15C substantially the same from the top to bottom. The third cover member 90 covers the lateral faces of the light emitting elements 20 via the light guide member 40 and the first cover member 50.

A resin material is preferably used for the third cover member 90. The third cover member 90, for example, is formed using a light reflecting white resin covering the lateral faces of the light emitting element 20 and the lateral faces of each light transmitting member 30.

Examples of resin materials for use as the third cover member 90 include those listed as examples for use as the first cover member 50. Examples of reflecting material for use as the third cover member 90 include those listed as examples for use as the first cover member 50.

It is preferable to use a white resin as the third cover member 90, while using a black or gray resin as the second cover member 60A.

In the third cover member 90, a groove 95 is formed along the lateral faces of the light transmitting member 30 between the light emitting element 20 and the protective device 25. The second cover member 60A is disposed in the groove 95. Such a structure allows the second cover member 60A to individually surround the light transmitting members 30 inward of the protective devices 25 in a plan view, thereby providing a light emitting device 100C with a more clearly distinguishable boundary between emission and non-emission regions.

The groove 95 is preferably formed in depth of at least one third of the thickness of the third cover member 90 in the thickness direction from the upper face of the third cover member 90. The depth of the groove 95 being at least one third of the thickness of the third cover member 90 can ensure the clearly distinguishable boundary, as well as facilitating the flow of the second cover member 60A into the groove 95. The depth of the groove 95 is preferably four fifths of the thickness of the third cover member 90 at most from the perspective of ensuring the strength of the light emitting device 100C and reducing mechanical damage to other members during the formation of the groove. The cross-sectional shape of a groove 95 is triangular, but cross-sectional shape can be optional for the groove 95, for example, a square shape or a shape having a curved bottom face.

The second cover member 60A covers the lateral faces of the light emitting elements 20 and the lateral faces of the light transmitting members 30 via the third cover members 90. The second cover member 60A in the light emitting device 100C is the same as or similar to the second cover member 60A in the light emitting device 100A.

In the light emitting device 100C, each element structure body 15C has substantially the same width from the lower face of the submount substrate 10 to the upper face of the light transmitting member 30 in a cross-sectional view. Moreover, in the light emitting device 100C, the width of each submount substrate 10 and the width of the outer perimeter of the third cover member 90 are substantially the same in a cross-sectional view. This allows the second cover member 60A located between element structure bodies 15C to have substantially the same width from the lower faces to the upper faces of the element structure bodies 15C.

Light Emitting Module

A light emitting module 200C will be explained next.

The light emitting module 200C is the same as or similar to the light emitting module 200 according to the first embodiment except for the use of a light emitting device 100C.

Manufacturing Method of Fourth Embodiment

Figure 10:
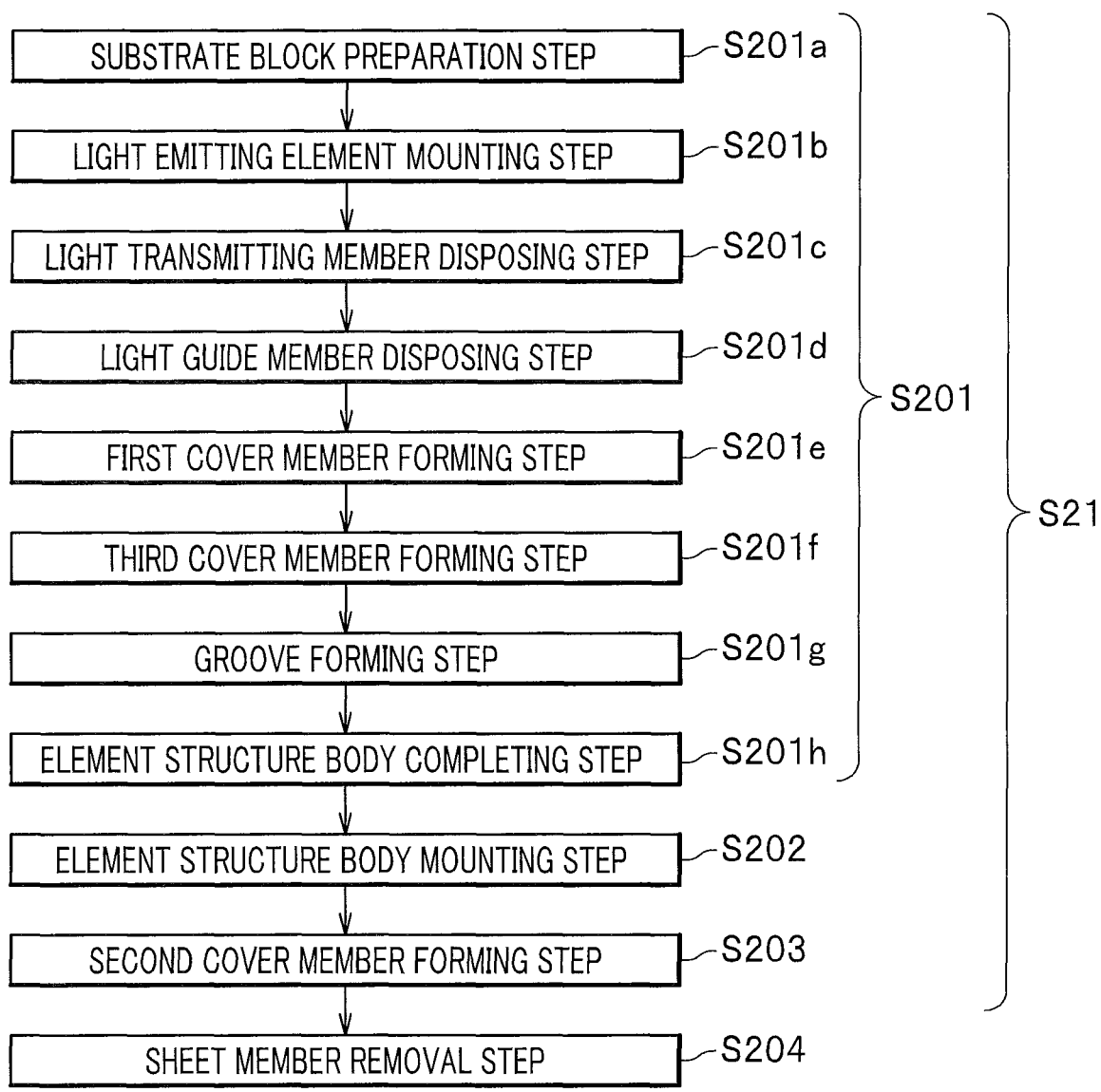
FIG. 10 is a flowchart of a method of manufacturing a light emitting device according to the fourth embodiment.
Figure 11A:
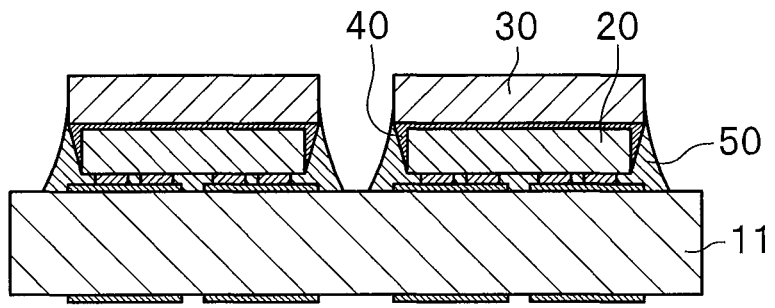
FIG. 11A is a cross-sectional view showing a step of forming first cover members in an element structure body preparation step of the method of manufacturing a light emitting device according to the fourth embodiment.
Figure 11B:
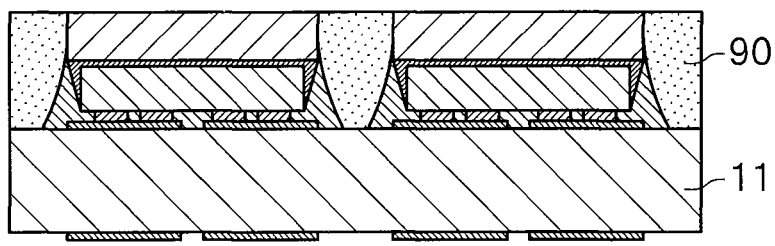
FIG. 11B is a cross-sectional view showing a step of forming a third cover member in the element structure body preparation step of the method of manufacturing a light emitting device according to the fourth embodiment.
Figure 11C:
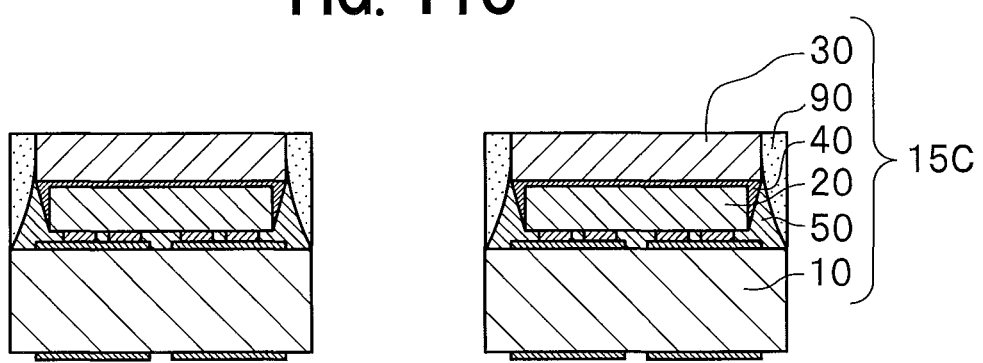
FIG. 11C is a cross-sectional view showing a step of completing element structure bodies in the element structure body preparation step of the method of manufacturing a light emitting device according to the fourth embodiment.
Figure 11D:
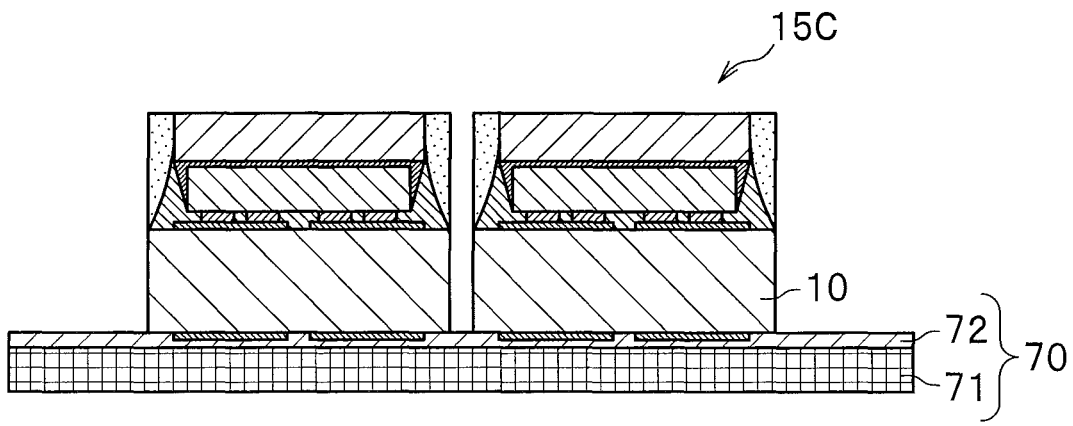
FIG. 11D is a cross-sectional view showing a step of mounting the element structure bodies in the method of manufacturing a light emitting device according to the fourth embodiment.
Figure 11E:
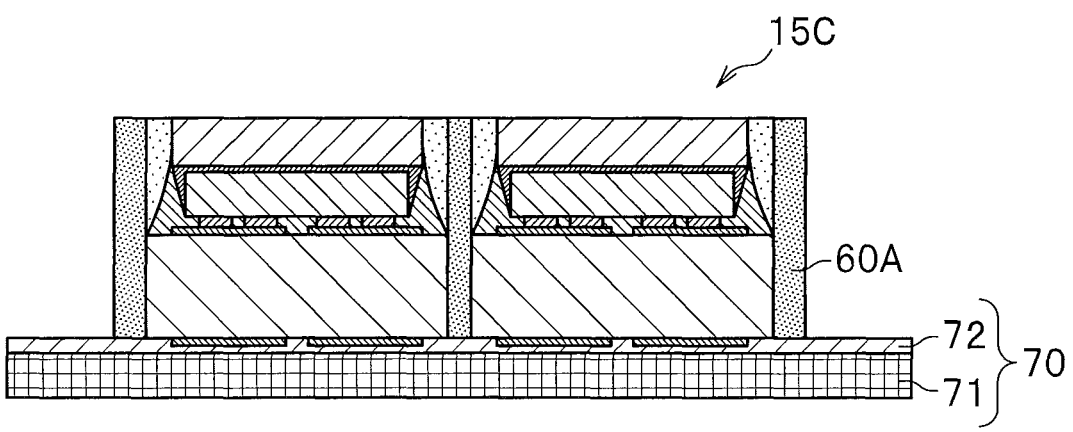
FIG. 11E is a cross-sectional view showing a step of forming a second cover member in the method of manufacturing a light emitting device according to the fourth embodiment.
Figure 11F:
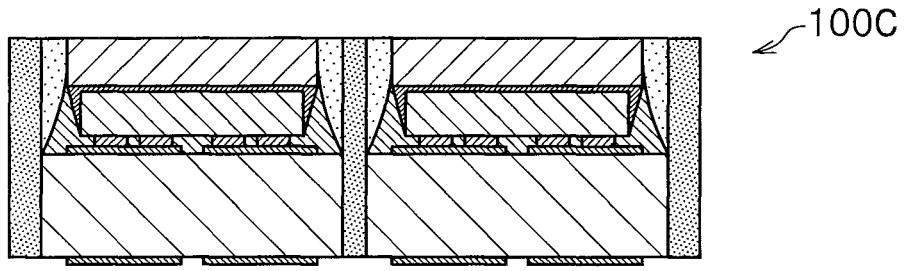
FIG. 11F a cross-sectional view showing a step of removing the sheet member in the method of manufacturing a light emitting device according to the fourth embodiment.
Figure 11G:
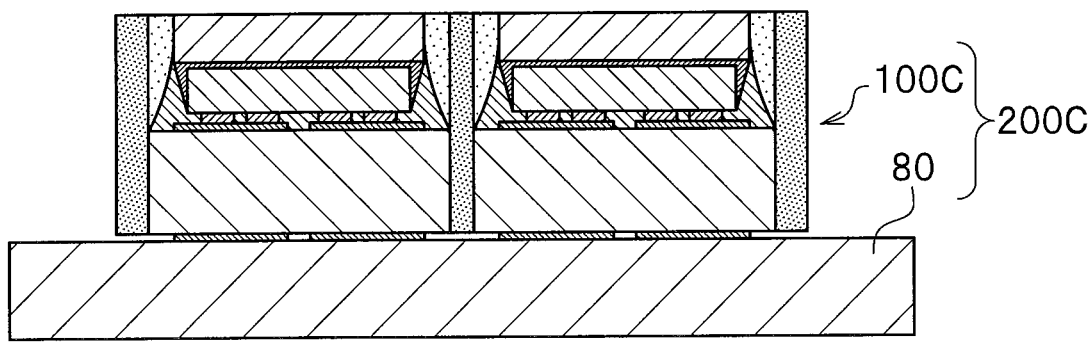
FIG. 11G is a cross-sectional view showing a step of mounting the element structure bodies in the method of manufacturing a light emitting module according to the fourth embodiment.
Figure 11H:
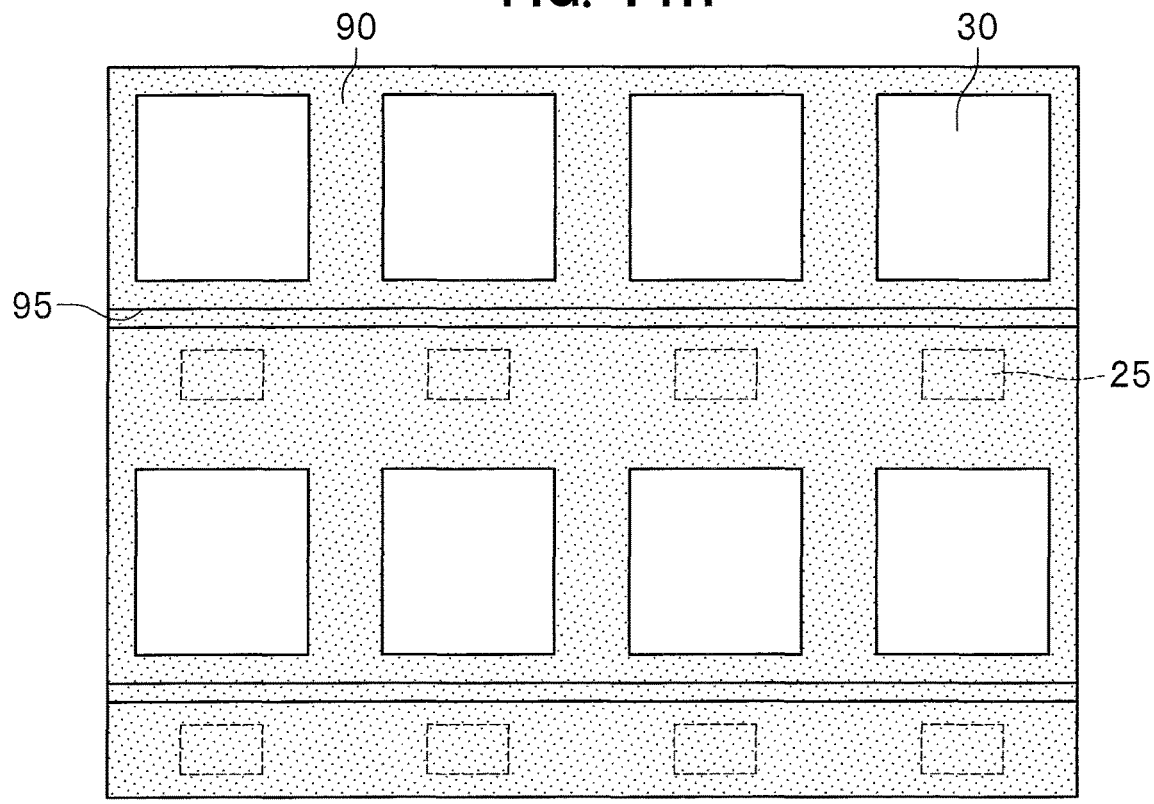
FIG. 11H is a plan view showing a step of forming groove(s) in the element structure body preparation step of the method of manufacturing a light emitting device according to the fourth embodiment.
Figure 11I:
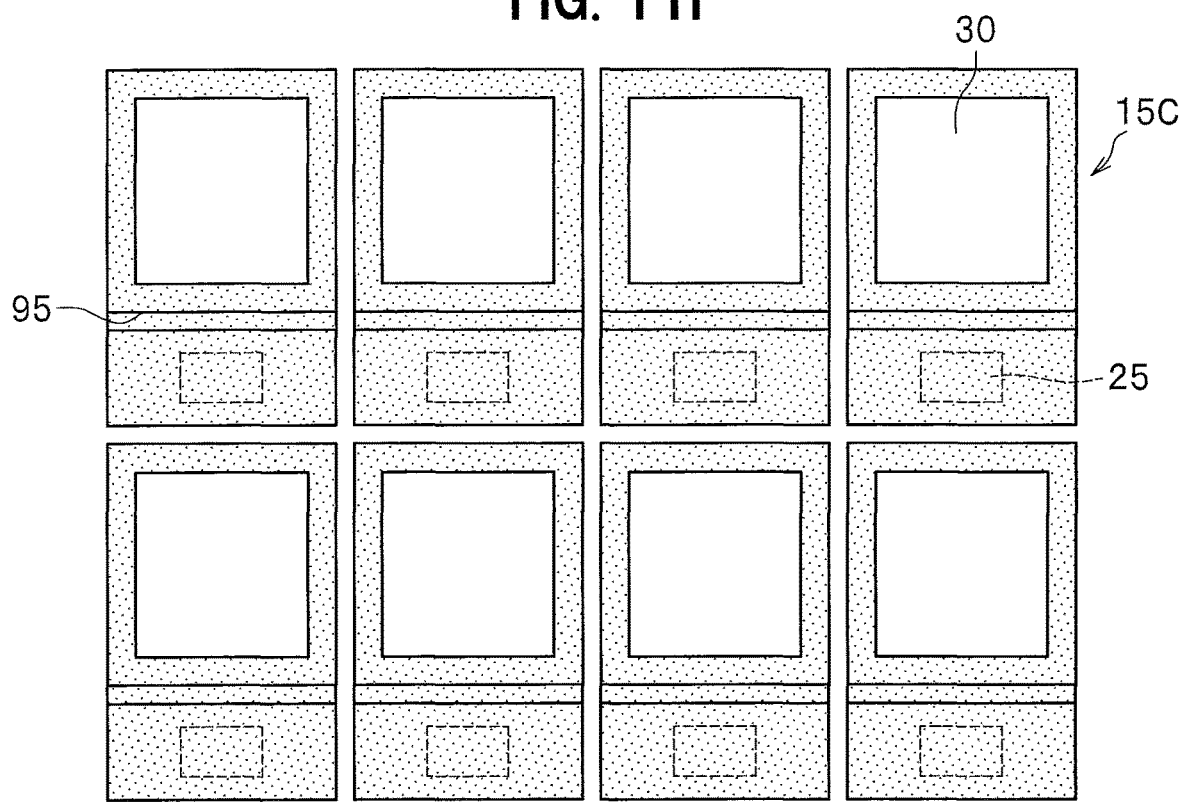
FIG. 11I is a plan view showing a step of completing element structure bodies in the element structure body preparation step of the method of manufacturing a light emitting device according to the fourth embodiment.
Figure 11J:
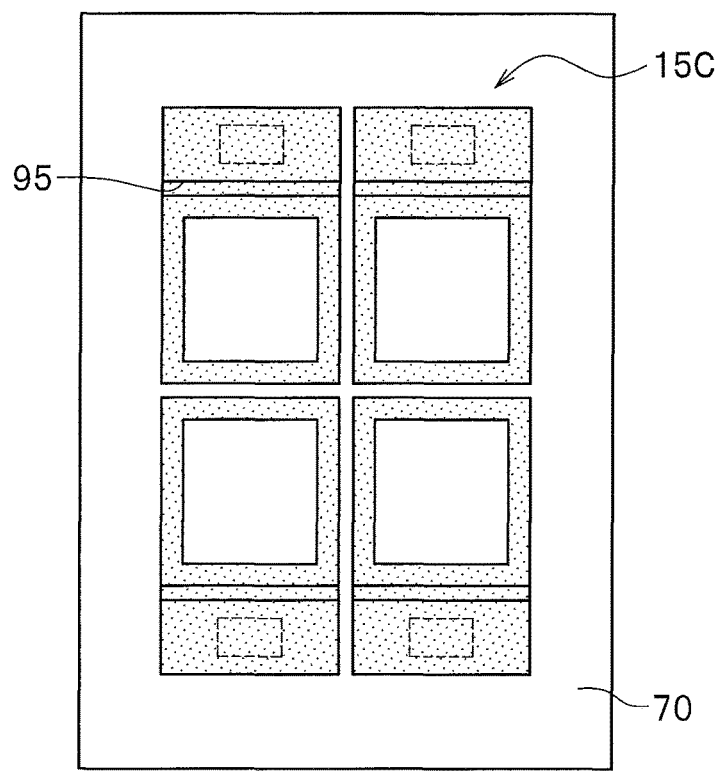
FIG. 11J is a plan view showing a step of mounting the element structure bodies in the method of manufacturing a light emitting device according to the fourth embodiment.
Figure 11K:
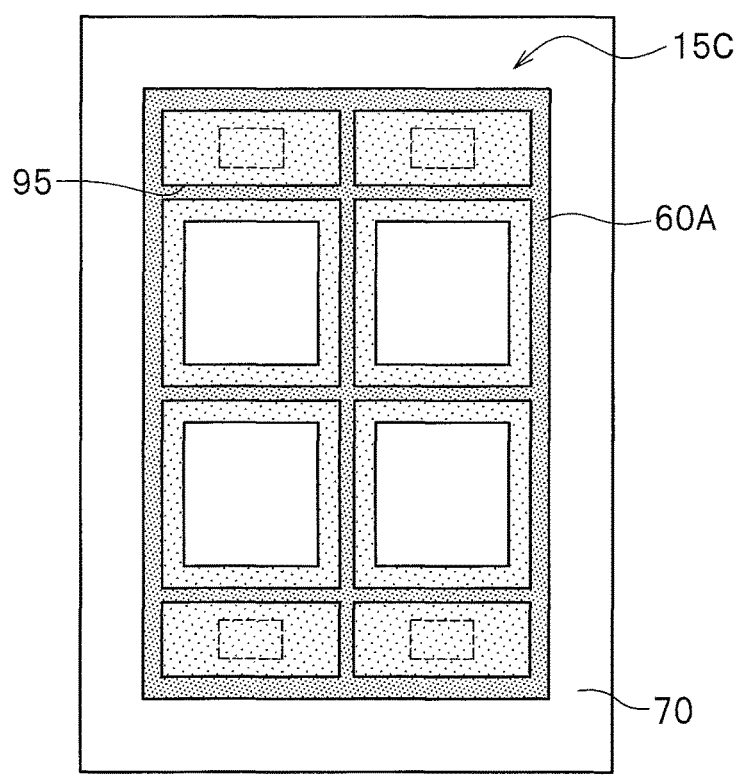
FIG. 11K is a plan view showing a step of forming a second cover member in the method of manufacturing a light emitting device according to the fourth embodiment.

FIG. 10 is a flowchart of a method of manufacturing a light emitting device according to a fourth embodiment. FIG. 11A is a cross-sectional view showing a step of forming first cover members in an element structure body preparation step of the method of manufacturing a light emitting device according to the fourth embodiment. FIG. 11B is a cross-sectional view showing a step of forming a third cover member in the element structure body preparation step of the method of manufacturing a light emitting device according to the fourth embodiment. FIG. 11C is a cross-sectional view showing a step of completing element structure bodies in the element structure body preparation step of the method of manufacturing a light emitting device according to the fourth embodiment. FIG. 11D is a cross-sectional view showing a step of mounting the element structure bodies in the method of manufacturing a light emitting device according to the fourth embodiment. FIG. 11E is a cross-sectional view showing a step of forming a second cover member in the method of manufacturing a light emitting device according to the fourth embodiment. FIG. 11F a cross-sectional view showing a step of removing the sheet member in the method of manufacturing a light emitting device according to the fourth embodiment. FIG. 11G is a cross-sectional view showing a step of mounting the element structure bodies in the method of manufacturing a light emitting module according to the fourth embodiment. FIG. 11H is a plan view showing a step of forming groove(s) in the element structure body preparation step of the method of manufacturing a light emitting device according to the fourth embodiment. FIG. 11I is a plan view showing a step of completing element structure bodies in the element structure body preparation step of the method of manufacturing a light emitting device according to the fourth embodiment. FIG. 11J is a plan view showing a step of mounting the element structure bodies in the method of manufacturing a light emitting device according to the fourth embodiment. FIG. 11K is a plan view showing a step of forming a second cover member in the method of manufacturing a light emitting device according to the fourth embodiment.

Method of Manufacturing Light Emitting Device

One example of method of manufacturing a light emitting device 100C will be explained first.

The method of manufacturing a light emitting device 100C includes an element structure body preparation step S201 which prepares element structure bodies 15C, at least one element structure bodies including a submount substrate 10, a light emitting element 20 disposed on the submount substrate 10, a light transmitting member 30 disposed on the light emitting element 20, a light guide member 40 disposed on the lateral face(s) of the light emitting element 20, a first cover member 50 covering the lateral face(s) of the light emitting element 20 on the submount substrate 10, and a third cover member 90 covering the lateral face(s) of the light emitting element 20 and the lateral face(s) of the light transmitting member 30; an element structure body mounting step S202 that mounts the element structure bodies 15C on a sheet member 70 such that the submount substrates 10 of the element structure bodies 15C faces the sheet member 70; a second cover member forming step S203 that forms a second cover member 60A on the sheet member 70 so as to support the element structure bodies 15C by covering the lateral faces of the element structure bodies 15C; and a sheet member removal step S204 that removes the sheet member 70.

In each element structure body 15C, the third cover member 90 covers the lateral faces of the light emitting element 20 via the first cover member 50, and the second cover member 60A covers the lateral faces of the light emitting element 20 and the lateral faces of the light transmitting member 30 via the third cover member 90.

The element structure body preparation step S201 includes a substrate block preparation step S201a that prepares a substrate block 11 including a plurality of submount regions 12 that will become submount substrates 10 when the substrate block 11 is subsequently divided; a light emitting element mounting step S201b that mounts light emitting elements 20 on the submount regions 12;

a light transmitting member disposing step S201c that disposes light transmitting members 30 on the light emitting elements 20; a light guide member disposing step S201d that disposes light guide members 40 on the lateral faces of each light emitting elements 20; a first cover member forming step S201e that forms first cover members 50 on the substrate block 11 to cover the lateral faces of the light emitting elements 20; a third cover member forming step S201f that forms on the substrate block 11 a third cover member 90 to cover the lateral faces of the light emitting elements 20 and the lateral faces of the light transmitting members 30; a groove forming step S201g that forms grooves 95 in the third cover member 90 along the lateral faces of the light transmitting members 30 between light emitting elements 20 and protective devices 25 in a plan view; and an element structure body completing step S201h that produces a plurality of element structure bodies 15C by dividing the substrate block 11 into individual submount regions 12.

The material, location, and the like of each member are as described in relation to the light emitting device 100C explained above, for which the explanation will be omitted as appropriate.

The steps S201a to S201e are the same as or similar to the steps S101a to S101e described in relation to the method of manufacturing a light emitting device 100.

Third Cover Member Forming Step

The third cover member forming step S201f is a step of forming a third cover member 90 on the substrate block 11 to cover the lateral faces of the light emitting elements 20 and the lateral faces of the light transmitting members 30.

In the step S201f, a third cover member 90 is formed on the substrate block 11 so as to cover the lateral faces of the light emitting elements 20 via the light guide member 40 disposed on the lateral faces of the light emitting element 20 as well as covering the lateral faces of the light transmitting member 30.

In the step S201f, an uncured resin material employed to form the third cover member 90 is disposed on substrate block 11 by, for example, potting, spraying, or the like. Subsequently, the resin material is hardened to form the third cover member 90.

In the step S201f, the third cover member 90 is provided so as to cover the lateral faces of the light emitting elements 20 and the lateral faces of the light transmitting member 30 while exposing the upper faces of the light transmitting members 30. The third cover member 90 may be disposed to cover the upper faces of the light transmitting members 30, followed by partially removing the third member by polishing, grinding, or cutting to expose the upper faces of the light transmitting members 30.

Groove Forming Step

The groove forming step S201g is a step of forming groove(s) 95 in the third cover member 90 along the lateral faces of the light transmitting members 30 between the light emitting elements 20 and the protective devices 25 in a plan view.

Because the light emitting device 100C includes protective devices 25, not providing grooves 95 increases the distance between the lateral face of each light transmitting member 30 that is closer to the protective device 25 and the second cover member 60A. Providing the grooves 95 between the light emitting elements 20 and protective devices 25 while providing the second cover member 60A in the groove(s) can reduce the distance between the lateral faces of the light transmitting members 30 that is closer to the protective devices 25 and the second cover member 60A. This further improves the clearly distinguishable boundary of the light emitting device 100C.

Here, for example, the light transmitting members 30 are arranged in two rows by four columns in a plan view. In the step S201g, grooves 95 are created along the lateral faces of the light transmitting members 30 per row between the light emitting elements 20 and the protective devices 25.

The grooves 95 can be created, for example, by cutting using a blade, or etching the predetermined position using a mask.

Element Structure Body Completing Step

The element structure body completing step S201h is the same as or similar to the element structure body completing step S101f except for producing element structure bodies 15C by dividing the substrate block 11 into individual submount regions 12.

Element Structure Body Mounting Step

The element structure body mounting step S202 is the same as or similar to the element structure body mounting step S102 except for mounting element structure bodies 15C on a sheet member 70 such that the submount substrates 10 of the element structure bodies 15C faces the sheet member 70.

Second Cover Member Forming Step

The second cover member forming step S203 is a step of forming a second cover member 60A on a sheet member 70 to cover the lateral faces of each element structure body 15C.

The step S203 includes a step of forming a second cover member 60A in the grooves 95. In the step of forming a second cover member 60A in the grooves 95, an uncured resin material employed to form the second cover member 60A is disposed in the grooves 95 by, for example, potting, spraying, or the like. Subsequently, the resin material is hardened to form the second cover member 60A.

The other features are the same as or similar to the second cover member forming step S103.

Sheet Member Removal Step

The sheet member removal step S204 is the same as or similar to the sheet member removal step S104.

Method of Manufacturing Light Emitting Module

One example of method of manufacturing a light emitting module 200C will be explained next.

The method of manufacturing a light emitting module 200C includes a light emitting device preparation step S21 and a light emitting device mounting step. In the light emitting device preparation step S21, a light emitting device 100C is produced by performing the steps S201 to S204 described above.

The method of manufacturing a light emitting module 200C is the same as or similar to the method of manufacturing a light emitting module 200 according to the first embodiment except for the use of a light emitting device 100C prepared by the method of manufacturing a light emitting device 100C described above.

Although the methods of manufacturing light emitting devises and light emitting modules, as well as light emitting devices and light emitting modules, according to certain embodiments have been specifically described in the foregoing, the subject matter of the present invention is not limited to these described above, and must be broadly interpreted based on the disclosure made in the scope of the claims. Furthermore, various modifications and alterations made based on the disclosure are also encompassed by the subject matter of the present invention.

Variations

Figure 12A:
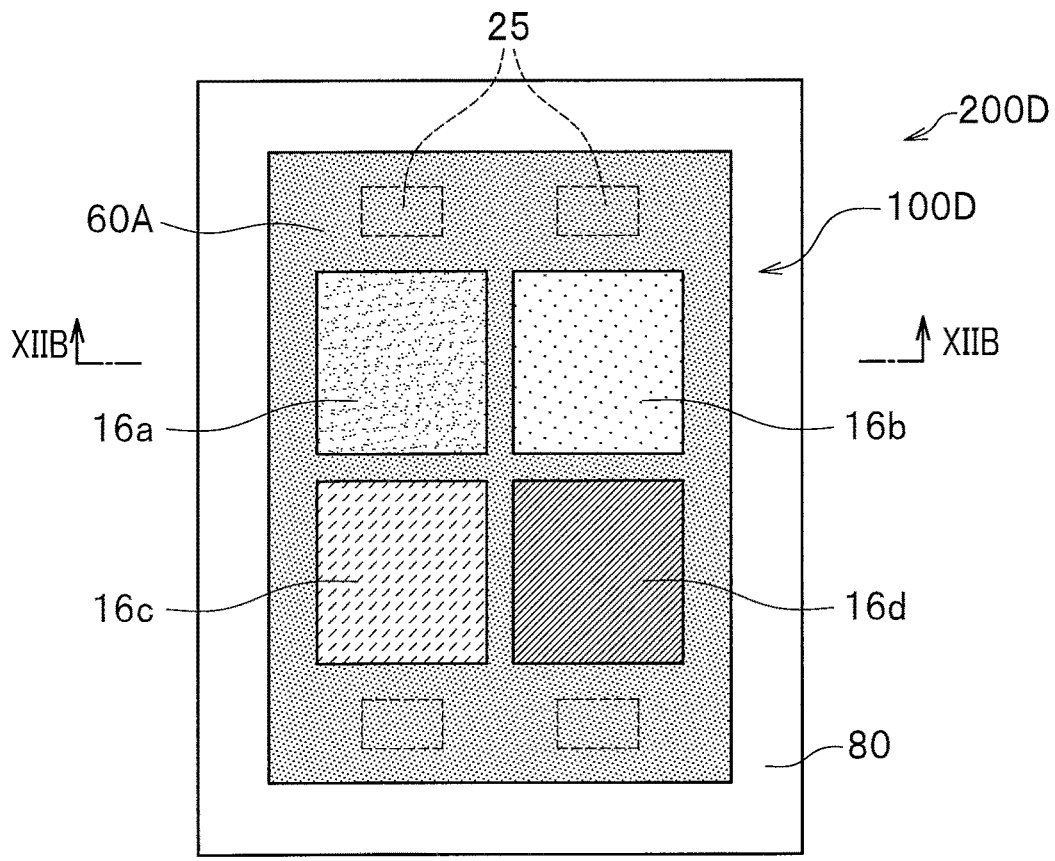
FIG. 12A is a plan view schematically showing the structure of a light emitting module that includes a light emitting device according to a variation of the second embodiment.
Figure 12B:
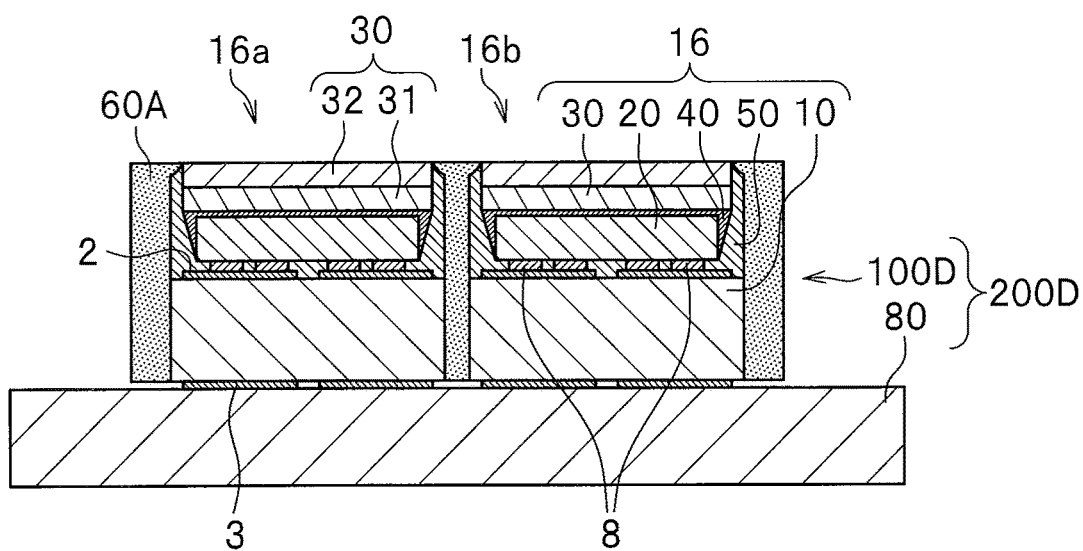
FIG. 12B is a cross-sectional view taken along line XIIB-XIIB in FIG. 12A.
Figure 13A:
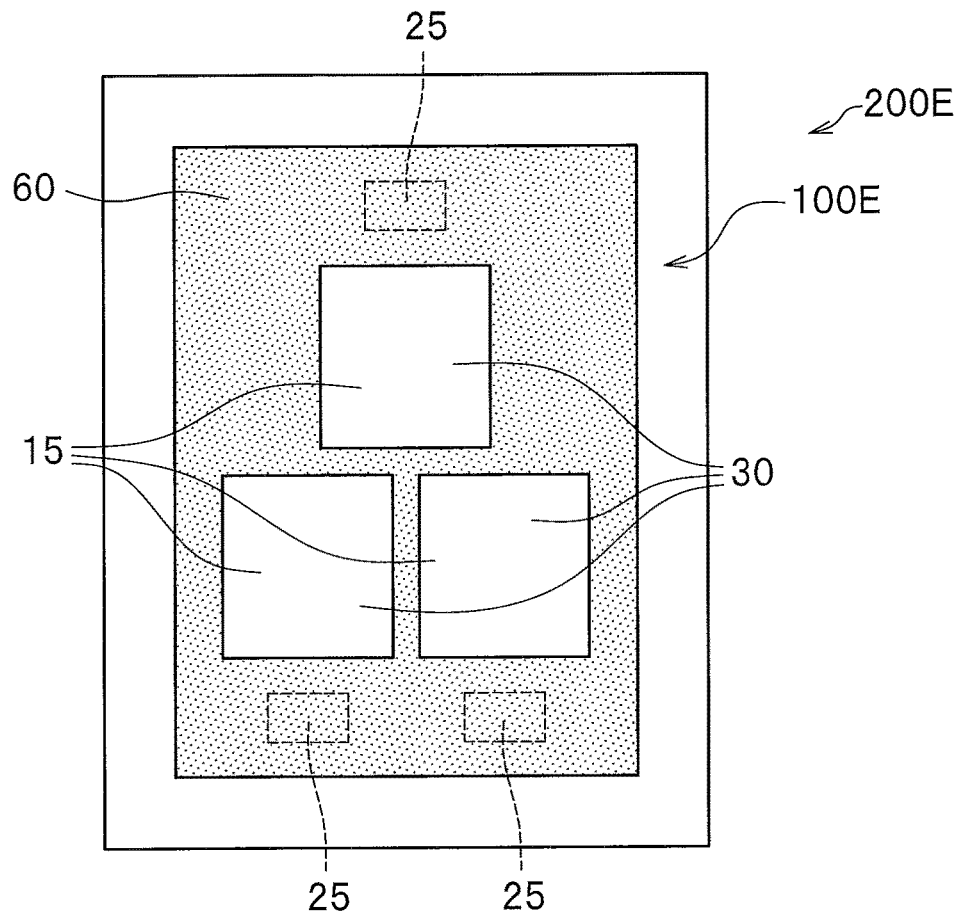
FIG. 13A is a plan view schematically showing the structure of a light emitting module that includes a light emitting device according to a first variation of the first embodiment.
Figure 13B:
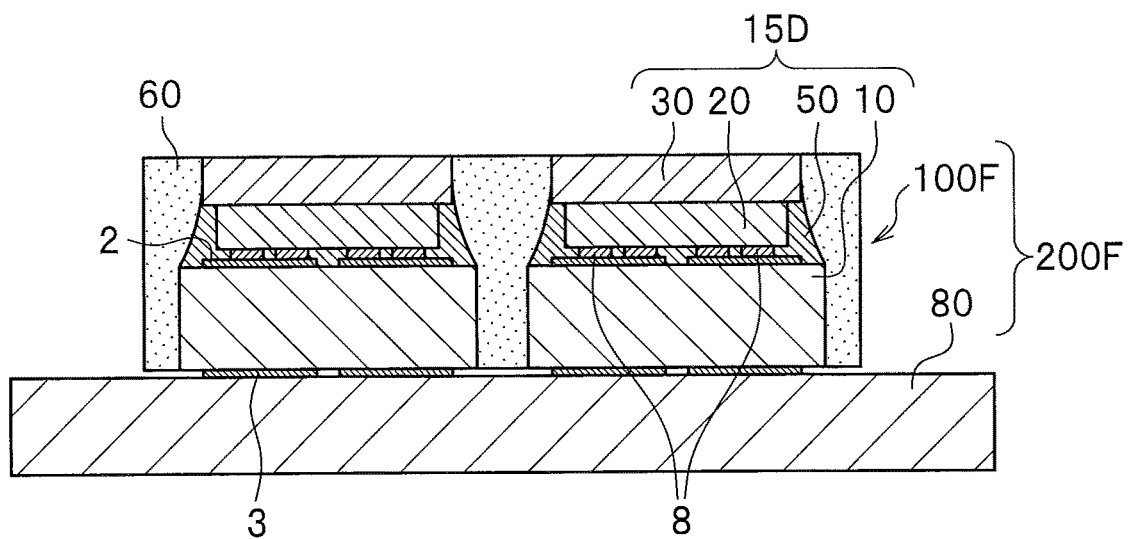
FIG. 13B is a cross-sectional view schematically showing the structure of the light emitting module that includes a light emitting device according to a second variation of the first embodiment.

FIG. 12A is a plan view schematically showing the structure of a light emitting module which includes a variation of the light emitting device according to the second embodiment. FIG. 12B is a cross-sectional view taken along line XIIB-XIIB in FIG. 12A. FIG. 13A is a plan view schematically showing the structure of a light emitting module which includes the light emitting device according to a first variation of the first embodiment. FIG. 13B is a cross-sectional view schematically showing the structure of a light emitting module which includes the light emitting device according to a second variation of the first embodiment.

The element structure bodies in a light emitting device may be an assortment of those having two or more different emission colors. The emission color of an element structure body is the color of the light emanating from the upper face of the light transmitting member, and the emission color of an element structure body may be the same as the emission color of the light emitting element disposed therein.

The light emitting device and the light emitting module according to the variation of the second embodiment will be explained with reference to FIG. 12A and FIG. 12B.

A light emitting module 200D includes a light emitting device 100D and a module substrate 80.

The light emitting device 100D includes four element structure bodies 16 having different emission colors. The other features of the light emitting device 100D are the same as or similar to those of the light emitting device 100A.

The element structure bodies 16 include a red element structure body 16a emitting red light, a white element structure body 16b emitting white light, a green element structure body 16c emitting green light, and a blue element structure body 16d emitting blue light. Here, the element structure bodies 16 are arranged in two rows by two columns, where the red element structure body 16a and the blue element structure body 16d are diagonally arranged, while the white element structure body 16b and the green element structure body 16c are diagonally arranged.

The light emitting device 100D employs a second cover member 60A which is a black or gray resin material. As such, the light emitted by one element structure body 16 cannot enter the adjacent element structure body 16, accordingly, occurrence of color shift can be suppressed.

Examples of red element structure bodies 16a include one having a blue light emitting element 20 and a light transmitting member 30 containing a red-emitting phosphor. Examples of white element structure bodies 16b include one having a blue light emitting element 20 and a light transmitting member 30 containing a yellow-emitting phosphor. Examples of green element structure bodies 16c include one having a green light emitting element 20 and a light transmitting member 30 containing a diffuser, and one having a blue light emitting element 20 and a light transmitting member 30 containing a green-emitting phosphor. Examples of blue element structure bodies 16d include one having a blue light emitting element 20 and a light transmitting member 30 containing a diffuser.

For a light transmitting member 30 containing a red phosphor, yellow phosphor, or green phosphor, one made by forming a light transmitting layer 32, such as a resin layer containing a phosphor or glass layer containing a phosphor, on the surface of a light transmitting sheet 31, such as a glass sheet or the like, can be used. For a light transmitting member 30 containing a diffuser, one made by forming a light transmitting layer 32, such as a resin layer containing a diffuser or glass layer containing a diffuser, on the surface of a light transmitting sheet 31, such as a glass sheet, can be used.

In the case where the emission color of a light emitting element is the same as that of the element structure body, using a light transmitting member 30 made by forming a resin layer containing a diffuser on the surface of a glass sheet, for example, allows the height of the element structure body to be substantially the same as the heights of the other element structure bodies. When combining element structure bodies 16 having different emission colors, making the heights of the element structure bodies about the same can restrain the second cover member 60A from creeping onto the upper faces of the light transmitting members 30. The differences in the thicknesses of the resin layers among the element structure bodies resulting from the amounts, or the existence or absence, of phosphors required to achieve desired emission colors can be adjusted by varying the thicknesses of the glass sheets supporting the resin layers.

A light emitting module 200D is produced by mounting the above-described light emitting device 100D on a module substrate 80.

The light emitting module 200D is the same as or similar to the light emitting module 200 according to the first embodiment except for the use of a light emitting device 100D.

The method of manufacturing a light emitting device 100D, in the element structure body preparation step S101, prepares element structure bodies 16 of two or more different emission colors. In the element structure body mounting step S102, element structure bodies 16 of two or more different emission colors are assorted and mounted on a sheet member 70. The other features are the same as or similar to those in the method of manufacturing a light emitting device 100A according to the second embodiment.

The method of manufacturing a light emitting module 200D is the same as or similar to the method of manufacturing a light emitting module 200 according to the first embodiment except for the use of the light emitting device 100D prepared by the method of manufacturing a light emitting device 100D described above.

The light emitting device may include two or more element structure bodies 16 selected from a red element structure body 16a, a white element structure body 16b, a green element structure body 16c, and a blue element structure body 16d. The light emitting device may have a red element structure bodies 16a, a white element structure bodies 16b, a green element structure bodies 16c, and a blue element structure body 16d alternately arranged in a row or matrix. The light emitting device may include a white element structure body 16b and an amber light emitting element structure body. The light emitting device can employ element structure bodies emanating light of various colors besides red, green blue, white, and amber by adjusting the wavelengths of the light emitting elements 20, as well as the types and blending ratios of phosphors contained in the light transmitting members 30. These element structure bodies can be arranged in any desired combination.

Next, the light emitting device and the light emitting module according to the first variation of the first embodiment are explained with reference to FIG. 13A. The light emitting module 200E and the light emitting device 100E include three element structure bodies 15 arranged as the vertices of a triangle. The other features are the same as or similar to those in the light emitting module 200 and the light emitting device 100 according to the first embodiment.

As described above, for the light emitting modules and light emitting devices, the number of rows or columns of element structure bodies is not limited, and the number of element structure bodies per row or column can be suitably adjusted according to the desired light distribution pattern. Furthermore, for the light emitting modules and light emitting devices, the combination of element structure bodies of different emission face sizes, the layout of element structure bodies, and the like can be suitably adjusted according to the desired light distribution pattern.

Next, the light emitting device and the light emitting module according to the second variation of the first embodiment are explained with reference to FIG. 13B.

The light emitting module 200F and the light emitting device 100F include element structure bodies 15D which have no light guide members. The other features are the same as or similar to those in the light emitting module 200 and the light emitting device 100 according to the first embodiment. As such, the light emitting device and light emitting module can either have or not have light guide members.

Figure 14A:
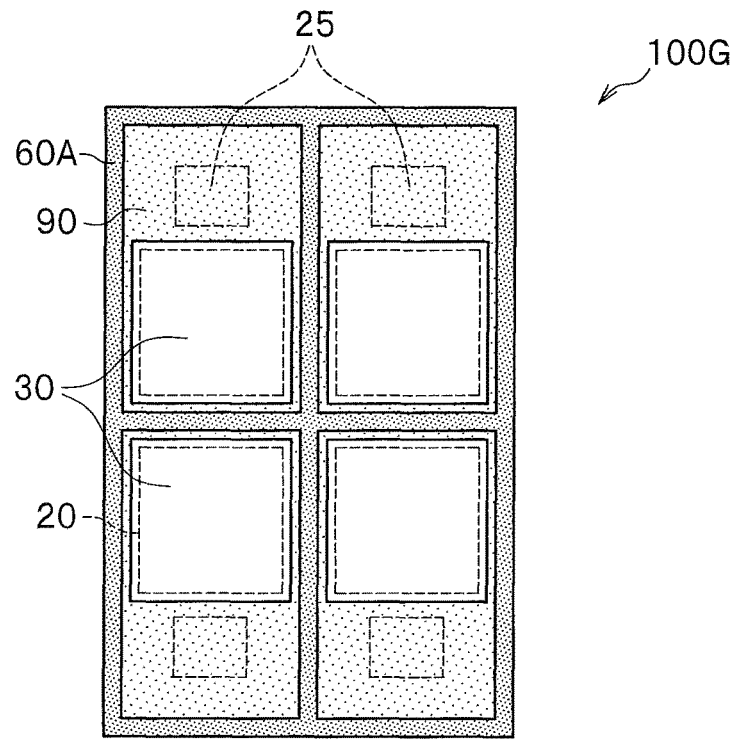
FIG. 14A is a plan view schematically showing the structure of a light emitting device according to a third variation of the first embodiment.
Figure 14B:
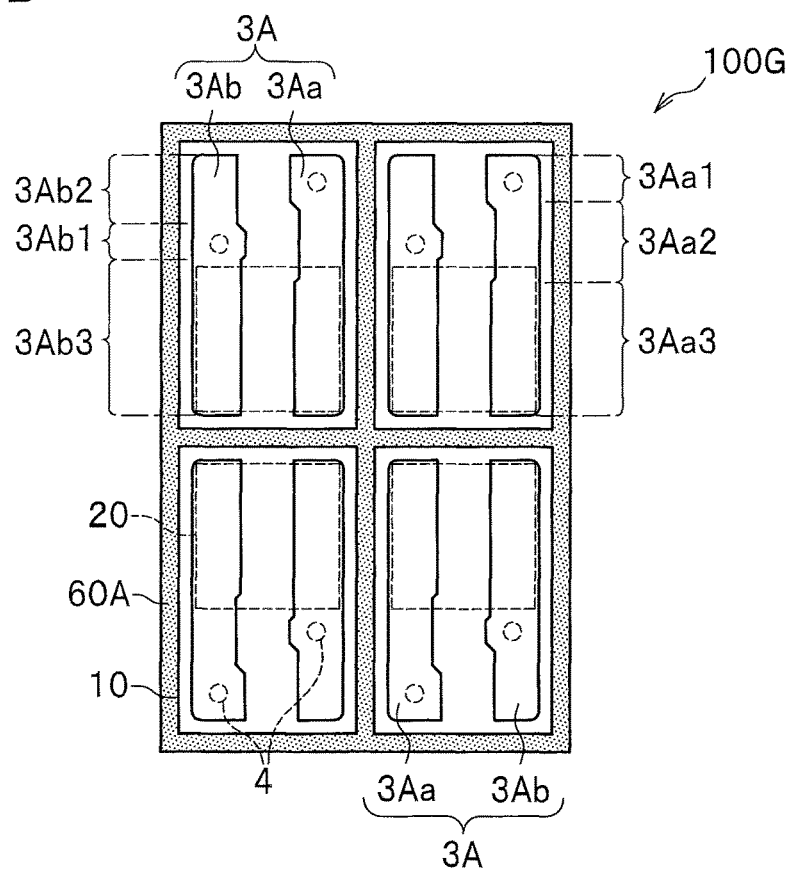
FIG. 14B is a bottom view schematically showing the structure of the light emitting device according to the third variation of the first embodiment.

Next, the light emitting device according to a third variation of the first embodiment. FIG. 14A is a plan view schematically showing the structure of a light emitting device according to the third variation of the first embodiment. FIG. 14B is a bottom view schematically showing the structure of the light emitting device according to the third variation of the first embodiment. FIG. 14C is an enlarged view schematically showing the structure of the external connection electrodes shown in FIG. 14B.

The light emitting device 100G according to the third variation includes a third covering member 90 covering the lateral faces of the light emitting element 20 and the lateral faces of the light transmitting member 30 in a thickness with which the width of each element structure body becomes substantially equivalent. The second cover member 60A is employed as the second cover member. Furthermore, the structure of the electrodes of the submount substrate 10 is different from that of the light emitting device 100 according to the first embodiment. The other features are the same or similar to the light emitting device 100 according to the first embodiment.

Specifically, a pair of external connection electrodes 3A (i.e., anode electrode 3Aa and cathode electrode 3Ab) of the light emitting device 100G that is elongated along the longitudinal direction of the submount substrate 10 and each has area(s) whose width(s) are partially different, in contrast to a pair of electrodes 3 of the light emitting device 100 that are the substantially rectangular shape elongated along the longitudinal direction of the submount substrate 10 in the substantially equal width. The external connection electrodes 3A of light emitting device 100G have a further elongated shape to make the submount substrate 10 smaller. In other words, the external connection electrodes 3A of the light emitting device 100G has a narrow width, to thereby correspond to the size reduction of the element structure body. This can make the distance between the emission faces smaller compared to the light emitting device 100 shown in FIG. 1A to FIG. 1F.

The anode electrode 3Aa of the external connection electrodes 3A has a large-width portion 3Aa1 having a large width, a small-width portion 3Aa2 having a small width, and an intermediate-portion 3Aa3 positioned therebetween. In the anode electrode 3Aa, the width becomes smaller in order of the width Wa1 of the large-width portion 3Aa1, the width Wa3 of the intermediate portion 3Aa3, and the width Wa2 of the small-width portion 3Aa2. The small-width portion 3Aa2 is a recessed portion in which the lateral face of the anode electrode 3Aa is recessed in the width direction. Here, the small-width portion 3Aa2 includes the latera face (the oblique face in a plan view) of the recessed portion.

The cathode electrode 3Ab of the external connection electrodes 3A includes a large-width portion 3Ab1 having a large width, a small-width portion 3Ab2 having a small width, and an intermediate portion 3Ab3 positioned therebetween. In the cathode electrode 3Ab, the width becomes smaller in order of the width Wb1 of the large-width portion 3Ab1, the width Wb3 of the intermediate portion 3Ab3, and the width Wb2 of the small-width portion 3Ab2. The large-width portion 3Ab1 is a protruding portion in which the lateral face of the cathode electrode 3Ab protrudes in the width direction. Here, the large-width portion 3Ab1 includes the lateral face (the oblique face in a plan view) of the protruding portion.

The submount substrate 10 included in the element structure body of the light emitting device 100G has vias 4 connecting the upper face wiring and the external connection electrodes. In the external connection electrodes 3A, the large-width portion 3Aa of the anode electrode 3Aa and the large-width portion 3Ab1 of the cathode electrode 3Ab are positioned directly below the vias 4 when viewed from the emission face side. As such, the structure in which the large-width portions 3Aa1 and 3Ab1 overlapping with each other in a plan view can facilitate positioning for forming the vias 4.

The vias 4 are preferably formed in positions that do not overlap with the light emitting element 20 in a plan view from the emission face side. Accordingly, the mounting of the light emitting element 20 on the submount substrate 10 is stable. Using bumps for the conductive adhesive material to mount the light emitting element 20 on the submount substrate 10, for example, may case variance of bump adhesiveness because the dispersion of stress subject to the wiring is different due to the difference of the members directly below the wiring.

In the light emitting device 100G, the large-width portion 3Aa1, the small-width portion 3Aa2, and the intermediate portion 3Aa3 of the anode electrode 3Aa are respectively correspond to the small-width portion 3Ab2, the large-width portion 3Ab1, and the intermediate portion 3Ab3 of the cathode electrode 3Ab in a plan view. In other words, the anode electrode 3Aa and the cathode electrode 3Ab are disposed such that the large-width portion 3Aa1 of the anode electrode 3Aa corresponds to the small-width portion 3Ab2 of the cathode electrode 3Ab, the small-width portion 3Aa2 of the anode electrode 3Aa corresponds to the large-width portion 3Ab1 of the cathode electrode 3Ab, the intermediate portion 3Aa3 of the anode electrode 3Aa corresponds to the intermediate portion 3Ab3 of the cathode electrode 3Ab. Employing such a structure can achieve the substantially equivalent distance between the anode electrode 3Aa and the cathode electrode 3Ab. Furthermore, allowing the external connection electrodes 3A having an elongated shape in the vertical direction to each have the recessed portion (small-width portion) and the protruding portion (large-width portion) corresponding to each other can suppress the misalignment in the vertical direction (longitudinal direction of the submount substrate 10) when mounting the light emitting device 100G to the module substate or the like, resulting in improvement of self-alignment property. Accordingly, the lateral faces of the protruding portions and the recessed portions of the external connection electrodes 3A advantageously effect the self-alignment.

The area of the anode electrode 3Aa and the area of the cathode electrode 3Ab are preferably the substantially equivalent. Accordingly, the conductive adhesive members can be disposed in the substantially equivalent height when mounting the light emitting device 100G to the module substrate, to thereby suppressing the inclination of the light emitting device 100G.

Figure 14D:
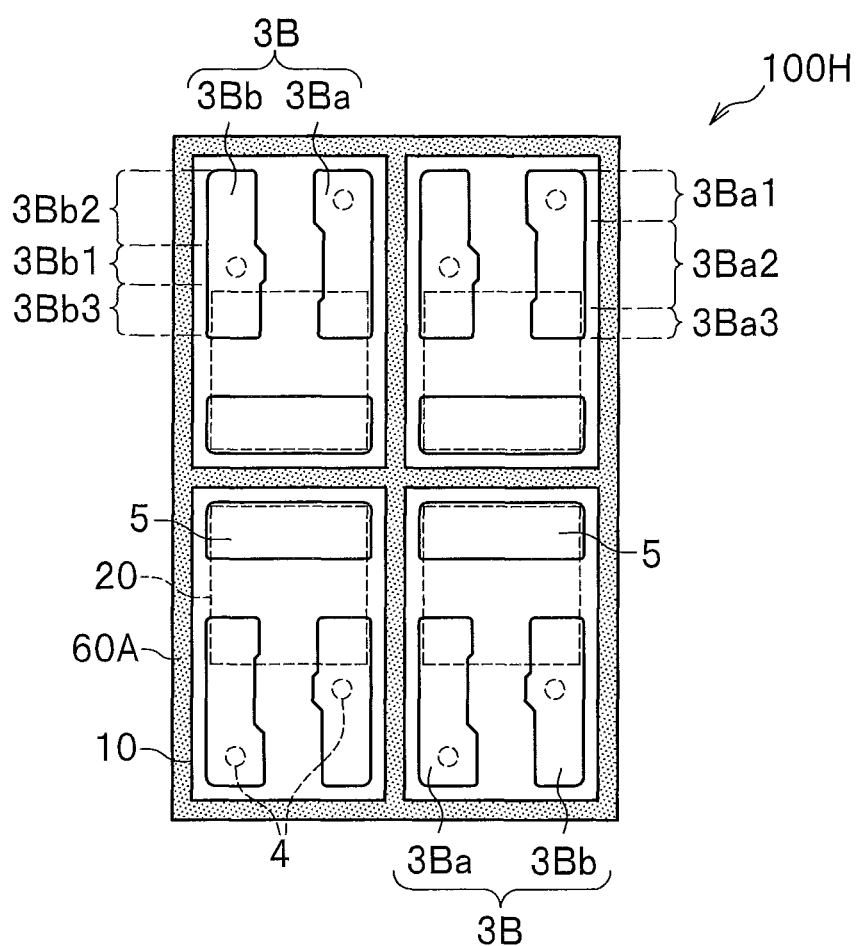
FIG. 14D is a bottom view schematically showing the structure of a light emitting device according to a fourth variation of the first embodiment.
Figure 14E:
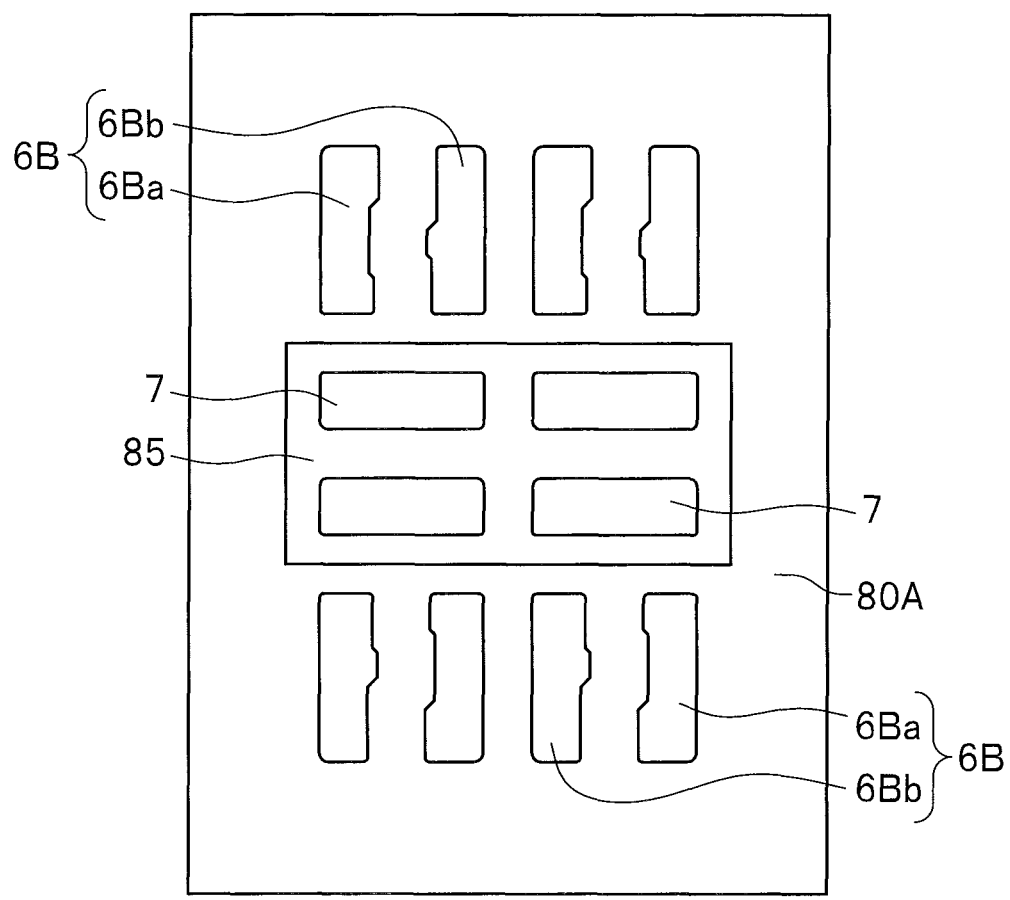
FIG. 14E is a plan view schematically showing the structure of a module substrate on which the light emitting device shown in FIG. 14D is mounted.
Figure 14F:
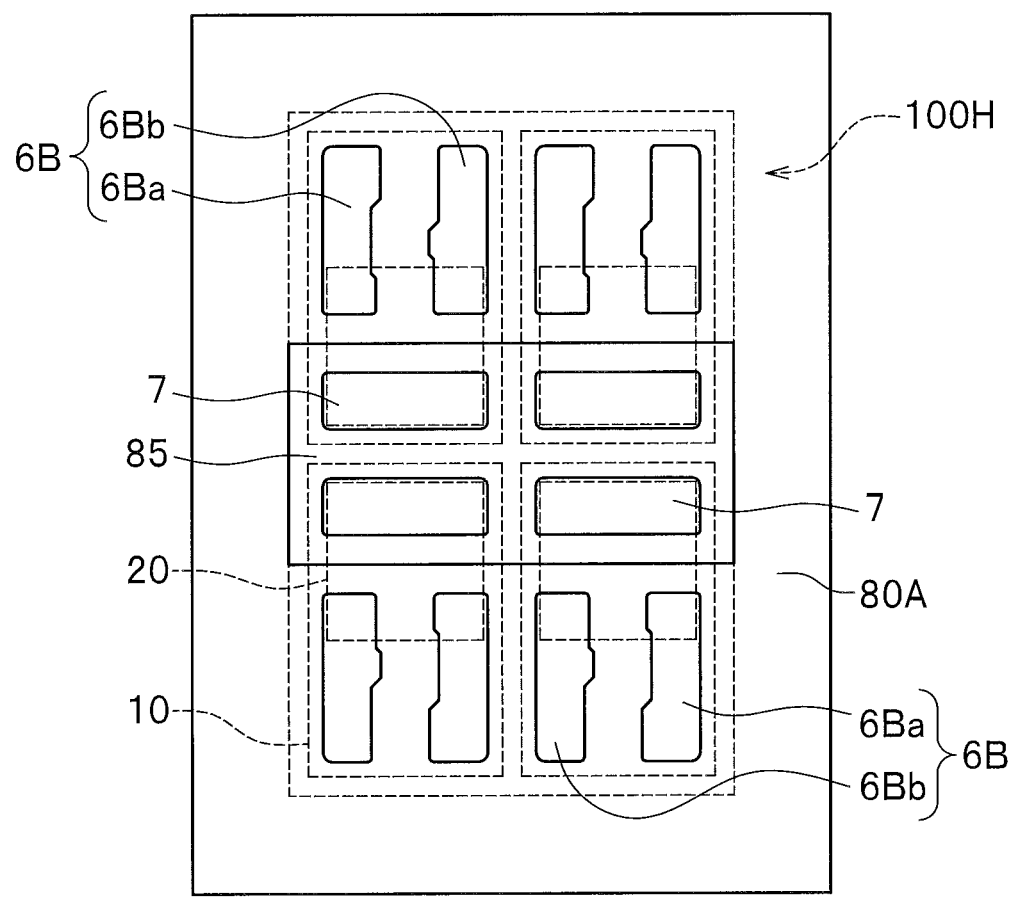
FIG. 14F is a plan view showing the positional relationship between the module substrate shown in FIG. 14E and the light emitting device shown in FIG. 14D.

Next, the light emitting device according to a fourth variation of the first embodiment will be explained. FIG. 14D is a bottom view schematically showing the structure of a light emitting device according to a fourth variation of the first embodiment. FIG. 14E is a plan view schematically showing the structure of a module substrate on which the light emitting device shown in FIG. 14D is mounted. FIG. 14F is a plan view showing the positional relationship between the module substrate shown in FIG. 14E and the light emitting device shown in FIG. 14D.

The light emitting device 100H includes a heat-dissipation terminal on the lower face opposite to the upper face of the submount on which the light emitting element 20 is mounted. Accordingly, the external connection electrodes 3B of the light emitting device 100H are shorter than the external connection electrodes 3A of the light emitting device 100G in the longitudinal direction of the submount substrate 10.

The anode electrode 3Ba of the external connection electrode 3B has a large-width portion 3Ba1 having a large width, a small-width portion 3Ba2 having a small width, and an intermediate portion 3Ba3 positioned therebetween. The cathode electrode 3Bb of the external connection electrode 3B has a large-width portion 3Bb1 having a large width, a small-width portion 3Bb2 having a small width, and an intermediate portion 3Bb3 positioned therebetween.

In the external connection electrode 3B, the large-width portion 3Ba1 and the large-width portion 3Bb1 are positioned directly below the vias 4. In the light emitting device 100H, the large-width portion 3Ba1 and the small-width portion 3Ba2 of the anode electrode 3Ba are respectively correspond to the small-width portion 3Bb2 and the large-width portion 3Bb1 of the cathode electrode 3Bb in a plan view. The heat-dissipation terminal 5 having a substantially rectangular shape is disposed at the intermediate portion 3Ba3 side of the anode electrode 3Ba while facing the intermediate portion 3Bb3 of the cathode electrode 3Bb, in a plan view. The heat dissipation terminal 5 is disposed directly below the light emitting element 20. Accordingly, the plurality of heat-dissipation terminals 5 are concentratively disposed in the middle part of the lower face of the light emitting device 100H.

The materials listed as examples for use as the external connection electrode 3 can be used for the materials for the heat-dissipation terminals 5. The heat-dissipation terminals 5 are insulated to the external connection electrode 3B.

The area of the heat-dissipation terminal 5 is preferably the substantially equivalent to the area of the anode electrode 3Ba and the area of the cathode electrode 3Bb of each element structure body. Accordingly, the conductive adhesive members can be disposed in the substantially equivalent height when mounting the light emitting device 100H to a module substrate 80A, to thereby suppressing the inclination of the light emitting device 100H.

The other features are the same as or similar to those of the light emitting device 100G.

In the case where the external connection electrode 3B has the partially different width area, the wiring pattern of the module substrate preferably also has partially different width area in order to further exhibit self-alignment property. The detailed structure is explained as follows.

In the module substrate 80A on which the light emitting device 100H is mounted, the shape and the position of its wiring where the light emitting device 100H is jointed corresponds to the shape and the position of the external connection electrode 3B and the heat-dissipation terminal 5. Specifically, the module substrate 80A includes an upper face wiring 6B having a shape substantially corresponding to the shape of the anode electrode 3Ba and the shape of the cathode electrode 3Bb of the light emitting device 100H. Similarly, the module substrate 80A includes a heat-dissipation terminal 7 having a shape substantially corresponding to the shape of the heat-dissipation terminal 5 of the light emitting device 100H.

In the light emitting device 100H, the plurality of the heat-dissipation terminals 5 are concentratively disposed in the middle area of the lower face of the light emitting device 100H.

Here, the module substrate 80A includes a heat-dissipation pad in which all the plurality of heat-dissipation terminal 5 can be mounted. The heat-dissipation pad includes the plurality of heat-dissipation terminals 7 demarcated by an insulative cover layer 85 such as resist that partially cover the surface of the heat-dissipation pad. In other words, in the module substrate 80A, the heat-dissipation terminals 7 are formed by positioning openings of the cover layer 85 so as to substantially correspond to the shape of the heat-dissipation terminals 5 of the light emitting device 100H. This can further improve the heat dissipation property.

Figure 15A:
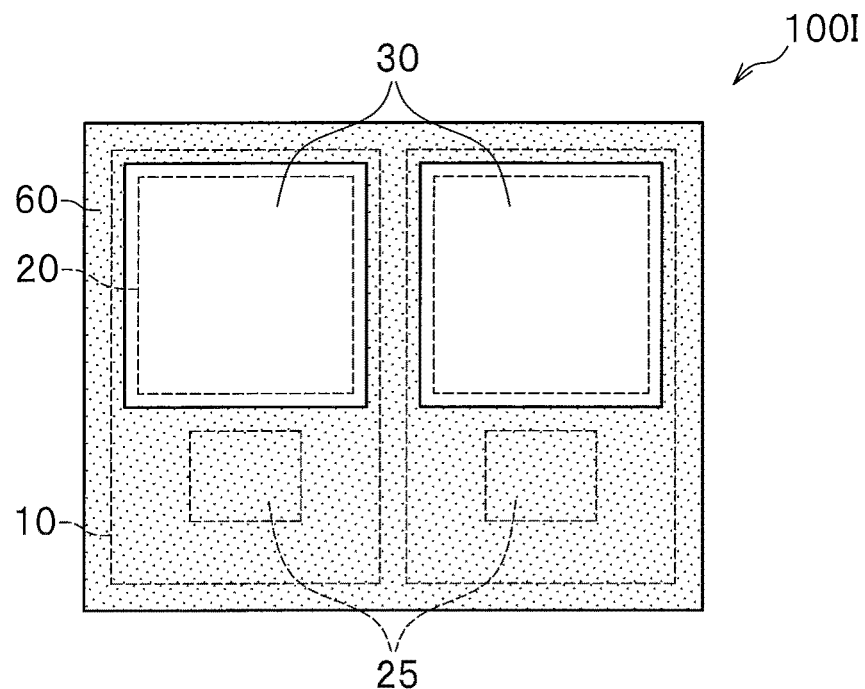
FIG. 15A is a plan view schematically showing the structure of the light emitting device according to a fifth variation of the first embodiment.
Figure 15B:
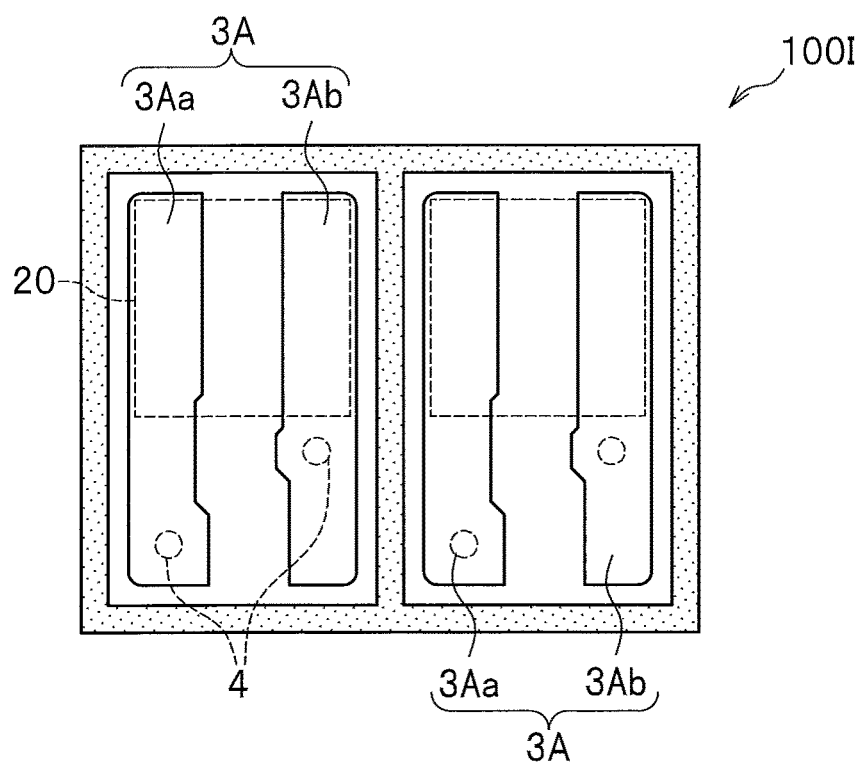
FIG. 15B is a bottom view schematically showing the structure of the light emitting device according to the fifth variation of the first embodiment.
Figure 15C:
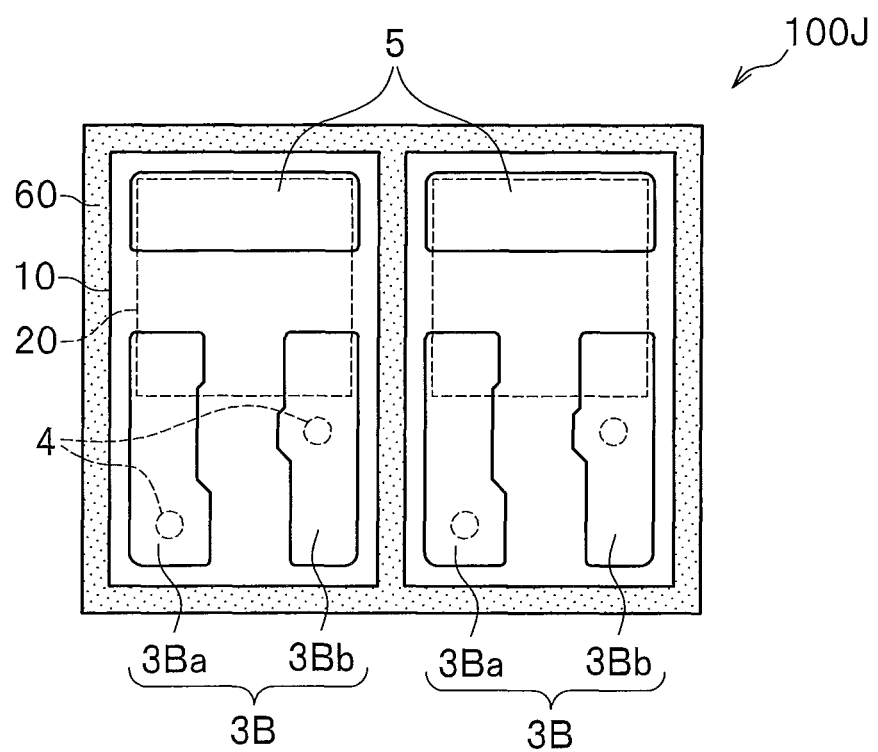
FIG. 15C is a bottom view schematically showing the structure of the light emitting device according to the sixth variation of the first embodiment.
Figure 15D:
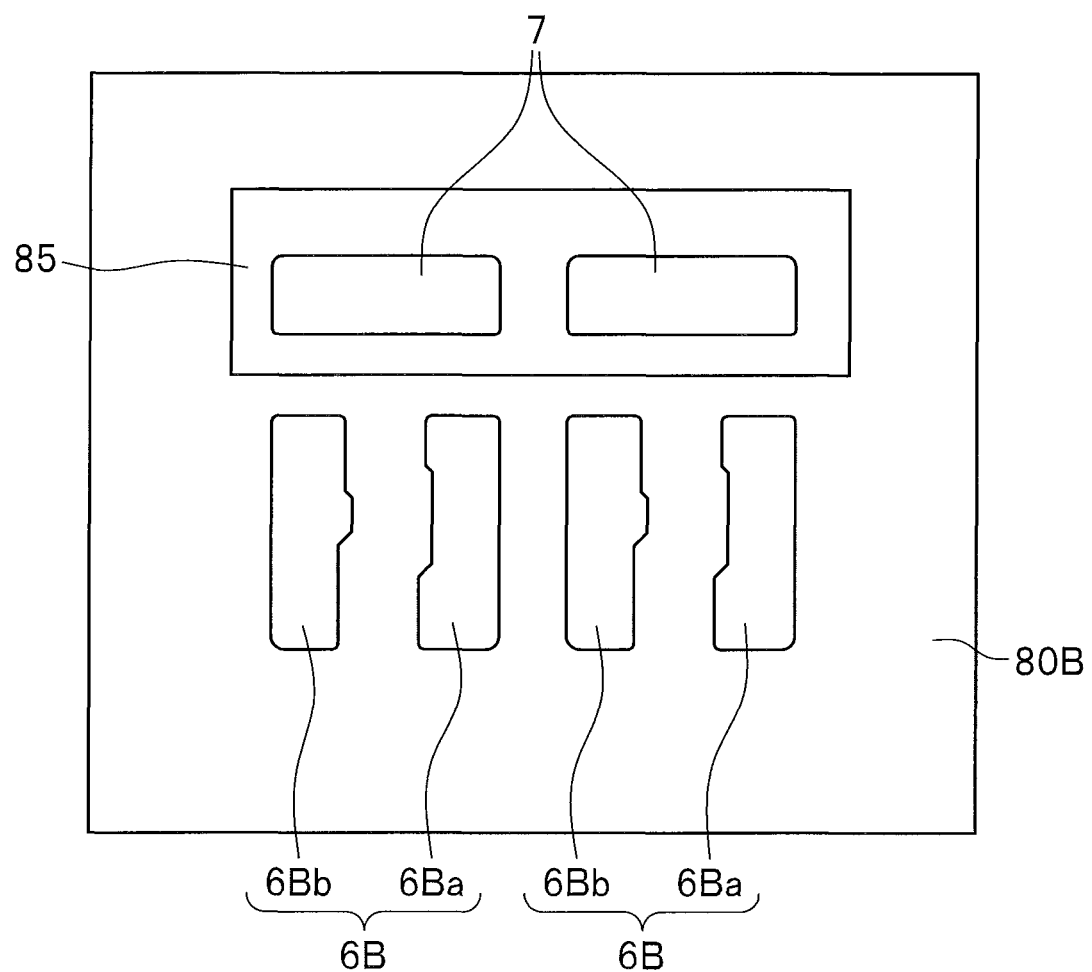
FIG. 15D is a plan view schematically showing the structure of the module substrate on which the light emitting device shown in FIG. 15C is mounted.
Figure 15E:
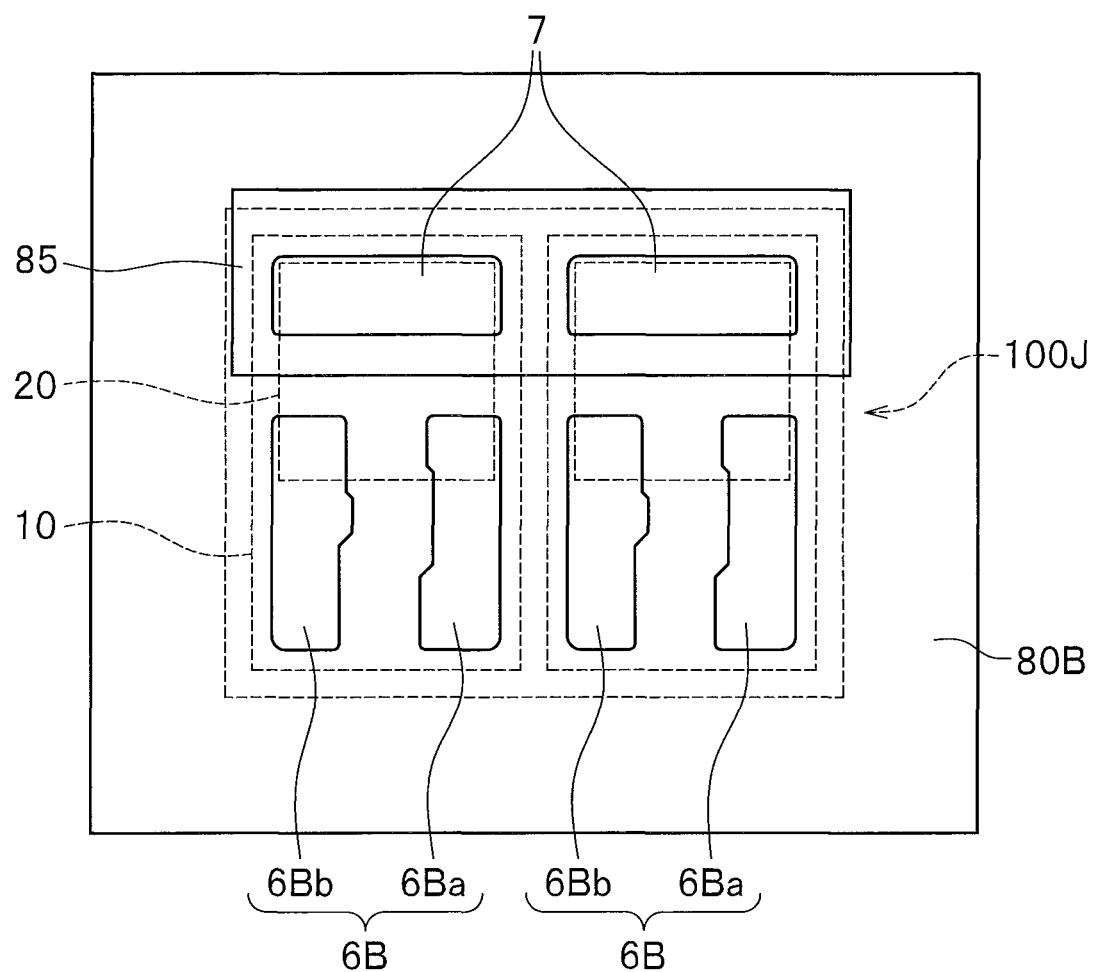
FIG. 15E is a plan view showing a positional relationship between the module substrate shown in FIG. 15D and the light emitting device shown in 15C.
Figure 16A:
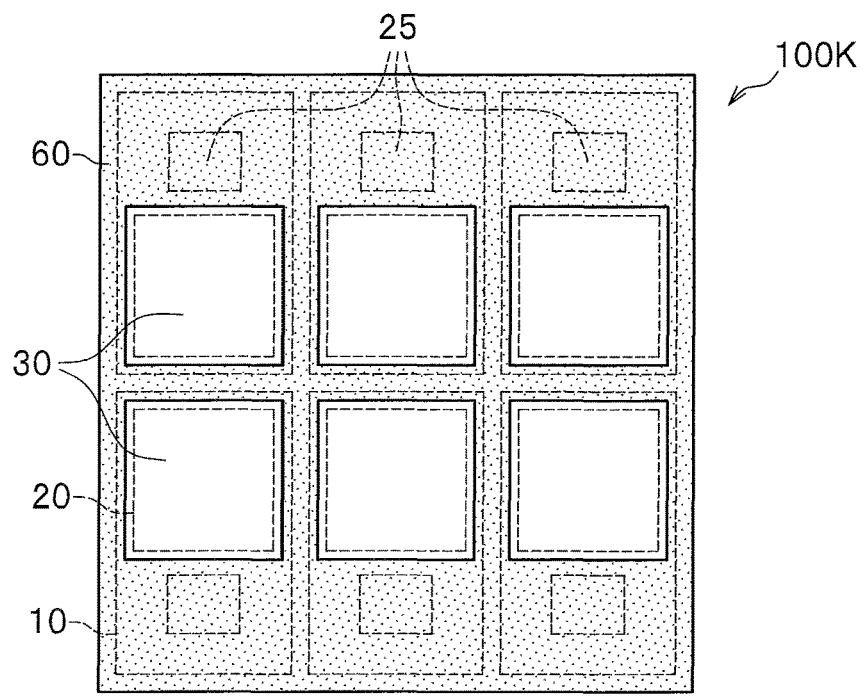
FIG. 16A is a plan view schematically showing the structure of a light emitting device according to a seventh variation of the first embodiment.
Figure 16B:
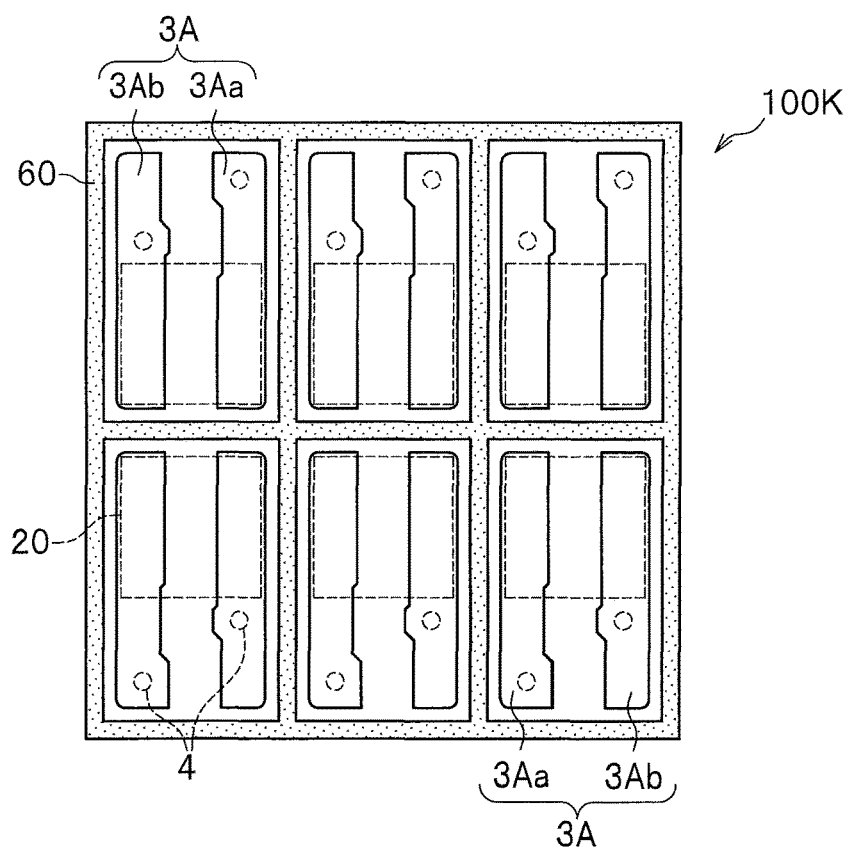
FIG. 16B is a bottom view schematically showing the structure of the light emitting device according to the seventh variation of the first embodiment.
Figure 16C:
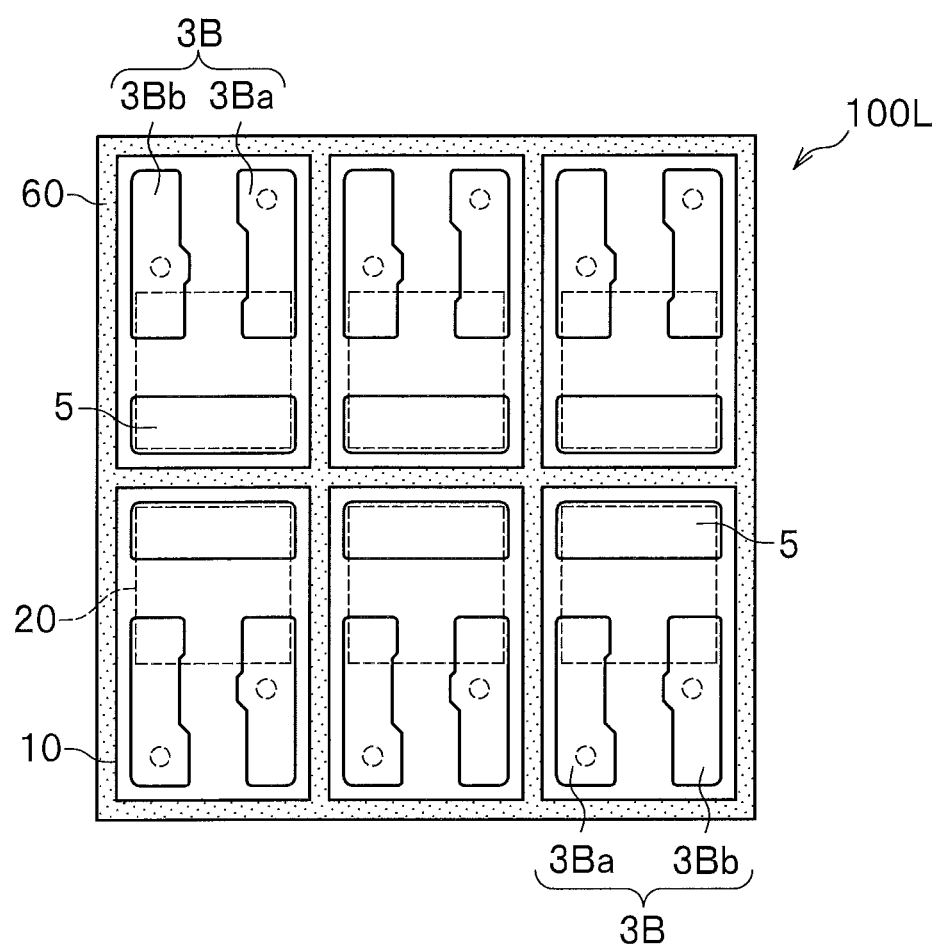
FIG. 16C is a bottom view schematically showing the structure of the light emitting device according to an eighth variation of the first embodiment.
Figure 16D:
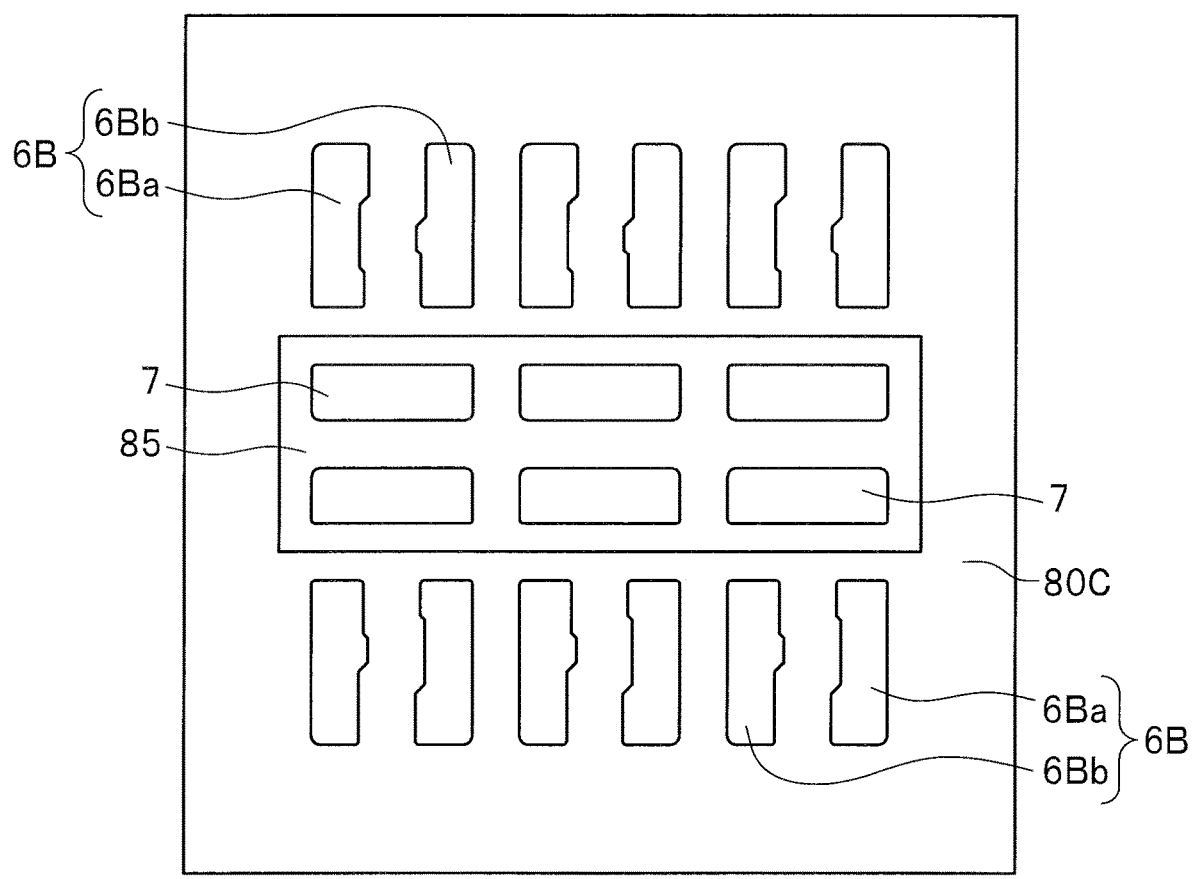
FIG. 16D is a plan view schematically showing the structure of a module substrate on which the light emitting device shown in FIG. 16C is mounted.
Figure 16E:
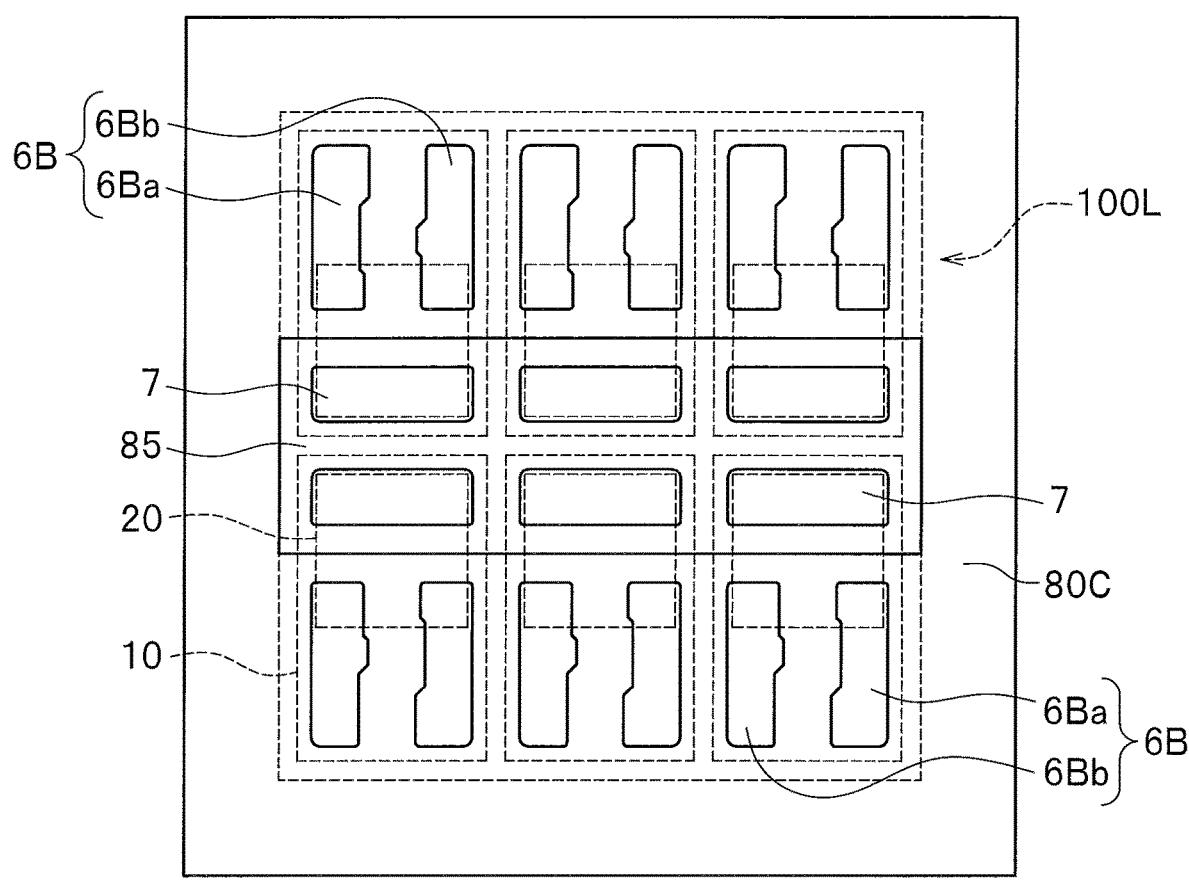
FIG. 16E is a plan view showing a positional relationship between the module substrate shown in FIG. 16D and the light emitting device shown in FIG. 16C.

Next, fifth to eight variations of the first embodiment will be explained. FIG. 15A is a plan view schematically showing the structure of the light emitting device according to a fifth variation of the first embodiment. FIG. 15B is a bottom view schematically showing the structure of the light emitting device according to the fifth variation of the first embodiment. FIG. 15C is a bottom view schematically showing the structure of the light emitting device according to the fifth variation of the first embodiment. FIG. 15D is a plan view schematically showing the structure of the module substrate on which the light emitting device shown in FIG. 15C is mounted. FIG. 15E is a plan view showing a positional relationship between the module substrate shown in FIG. 15D and the light emitting device shown in 15C. FIG. 16A is a plan view schematically showing the structure of a light emitting device according to a seventh variation of the first embodiment. FIG. 16B is a bottom view schematically showing the structure of the light emitting device according to the seventh variation of the first embodiment. FIG. 16C is a bottom view schematically showing the structure of the light emitting device according to an eighth variation of the first embodiment. FIG. 16D is a plan view schematically showing the structure of a module substrate on which the light emitting device shown in FIG. 16C is mounted. FIG. 16E is a plan view showing a positional relationship between the module substrate shown in FIG. 16D and the light emitting device shown in FIG. 16C.

A light emitting device 100I and a light emitting device 100J has a structure in which two element structure bodies each having a substantially rectangular shape in a plan view are arranged in the same orientation while joining one long side of each rectangle each other. The other features are the same as or similar to the light emitting device 100G and the light emitting device 100H except for the use of the second cover member 60 for the second cover member. The module substrate 80B is a member on which the light emitting device 100J is mounted, and the shape and the position of its wiring corresponds to the shapes and the positions of the external connection electrode 3B and the heat-dissipation terminal 5. The other features are the same as or similar to the module substrate 80A. In a light emitting device 100K, six element structure bodies are arranged such that each of two light transmitting members 30 face each other. The other features are the same as or similar to the light emitting device 100G except for the use of the second cover member 60 for the second cover member. In a light emitting device 100L, six element structure bodies are arranged such that each of two heat-dissipation terminals 5 face each other. The other features are the same as or similar to the light emitting device 100H. The module substrate 80C is a member on which the light emitting device 100L is mounted, and the shape and the position of its wiring corresponds to the shapes and positions of the external connection electrode 3B and the heat-dissipation terminal 5. The other features are the same as or similar to the module substrate 80A.

As such, the number of the element structure bodies can be two, six, or other numbers.

For such light emitting devices 100G to 100L, the element structure bodies corresponding to these embodiments can be prepared in the element structure body preparation step. The number of the element structure bodies in the light emitting device can be adjusted according to the number of the element structure bodies disposed on the sheet member in the element structure body mounting step.

The variations of light emitting devices and light emitting modules described above can be applied to any of the first to fourth embodiments, or any other embodiment.

The light emitting devices and light emitting modules explained in the forgoing may have the first cover members cover or not cover the lower faces of the light emitting elements. The light emitting devices and light emitting modules may have the third cover members include or not include grooves.

Furthermore, the first cover members, the second cover members, the third cover member, the light guide members, or the like, can include as additives various coloring agents, fillers, wavelength conversion materials, or the like, in order to achieve desired emission colors, desired surface colors, desired light distribution characteristics, and the like.

The submount substrates and the module substrates may be substantially square shaped in a plan view. The submount substrates and the module substrates may have other shape.

Furthermore, the methods of manufacturing light emitting devices and the methods of manufacturing light emitting modules may include additional steps before, after, or between the steps described above to the extent that such additional steps do not have any adverse effect on the steps.

Figure 17A:
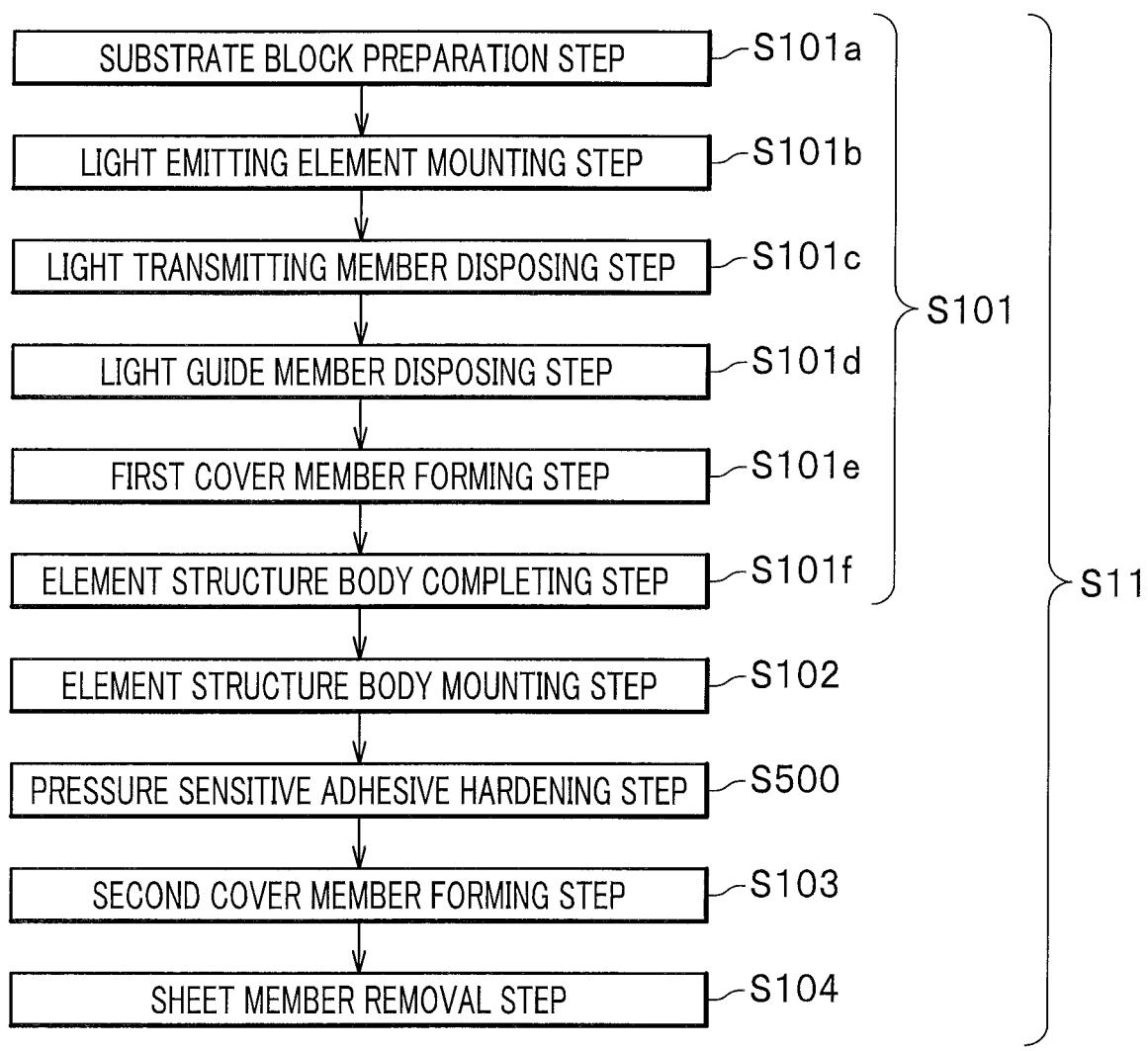
FIG. 17A is a flowchart of another method of manufacturing a light emitting device according to the first embodiment.
Figure 17B:
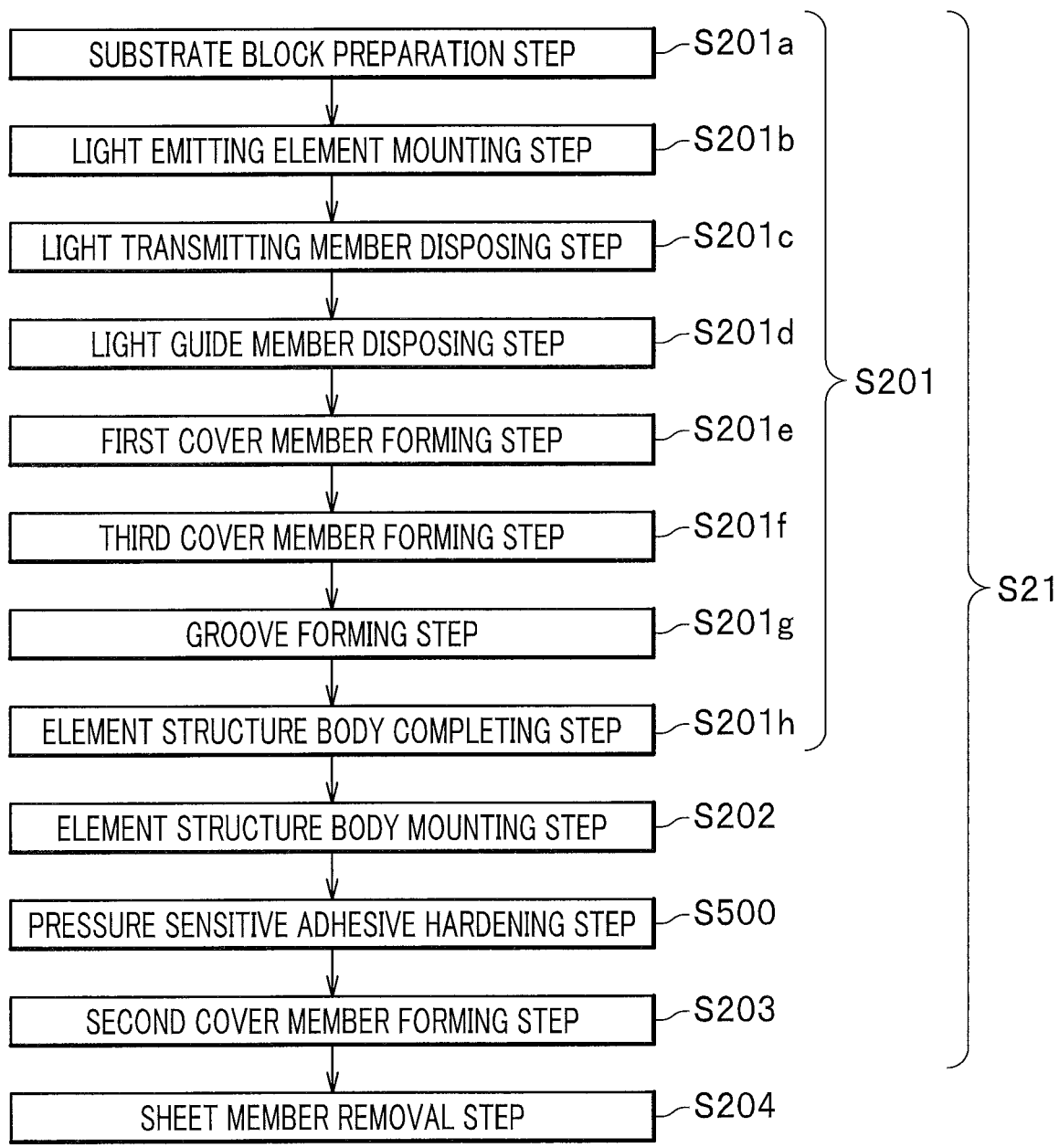
FIG. 17B is a flowchart of another method of manufacturing a light emitting device according to the fourth embodiment.

FIG. 17A is a flowchart of another method of manufacturing a light emitting device according to the first embodiment. FIG. 17B is a flowchart of another method of manufacturing a light emitting device according to the fourth embodiment.

For example, in the method of manufacturing a light emitting device according to the first embodiment, in the case of employing a thermosetting resin material for the second cover member 60 in the second cover member forming step S103, a pressure sensitive adhesive hardening step S500 which hardens the pressure sensitive resin of the sheet member 70, i.e., the pressure sensitive adhesive 72, may be performed subsequent to the element structure body mounting step S102, but prior to the second cover member forming step S103. The thermal history during hardening of a resin material and/or the elapsed time until the resin material hardens might make it difficult to detach the light emitting device 100 from the sheet member 70, or might allow a portion of the pressure sensitive adhesive 72 of the sheet member 70 to remain adhered to the rear face of the light emitting device 100 when detached. In the case where the element structure bodies 15 include external connection electrodes 3 on the lower faces of the submount substrates 10, in particular, any pressure sensitive adhesive 72 of the sheet member 70 remaining on the surfaces of the external connection electrodes 3 can cause an unsuccessful electrical connection during secondary mounting. Accordingly, hardening the pressure sensitive adhesive 72 of the sheet member 70 before forming the second cover member 60 can restrain the pressure sensitive adhesive from remaining on the external connection electrodes 3 of the light emitting device 100 after the device is detached from the sheet member 70. Although the hardening conditions or the like of the resin material are normally controlled so as not to allow the problem described above to occur, the pressure sensitive adhesive hardening step S500 can be performed to more securely restrain the pressure sensitive adhesive 72 from remaining on the electrode surfaces.

Similarly, in the method of manufacturing a light emitting device according to the fourth embodiment, a pressure sensitive adhesive hardening step S500 may be performed subsequent to the element structure body mounting step S202, but before the second cover member forming step S203. The pressure sensitive adhesive hardening step S500 may be performed in the method of manufacturing a light emitting device according to any other embodiment.

The element structure body mounting step has been described as mounting the element structure bodies on a sheet member 70 so as to bury the external connection electrodes 3 in the pressure sensitive adhesive 72 of the sheet member 70. However, the element structure bodies may be mounted so as not to bury the external connection electrodes 30 in the pressure sensitive adhesive 72 of the sheet member 70. In this case, in the second cover member forming step, the second cover member may be disposed to cover the lower faces of the submount substrates 10 and the lateral faces of the external connection electrodes 3.

Furthermore, a foreign material removal step to remove foreign matter introduced during manufacturing step, for example, may be included. Moreover, the element structure body preparation step has been explained as disposing light transmitting members 30 on the light emitting elements 20 after mounting the light emitting elements 20 on the submount substrates 10. However, the light transmitting members 30 may be disposed on the light emitting elements 20 before mounting the light emitting elements 20 on the submount substrates 10. Furthermore, the light emitting elements 20 and the light transmitting members 30 may be mounted on the submount substrates 10 after dividing up the substrate block 11.

The light emitting devices and light emitting modules according to the embodiments of the present disclosure can be utilized as the light sources for adaptive driving beam headlights. In addition, the light emitting devices and light emitting modules according to the embodiments of the present disclosure can be utilized in liquid crystal display backlights, various lighting fixtures, large displays, various display devices for advertising and destination signs, image pickup devices in digital video cameras, facsimiles, copiers, and scanners, as well as projectors, and the like.

DESCRIPTION OF REFERENCE

2 Upper face wiring
3, 3A, 3B External connection electrode
3a, 3Aa, 3Ba Anode electrode
3b, 3Ab, 3Bb Cathode electrode
3Aa1, 3Ab1 Large-width portion
3Aa2, 3Ab2 Small-width portion
3Aa3, 3Ab3 Intermediate portion
3Ba1, 3Bb1 Large-width portion
3Ba2, 3Bb2 Small-width portion
3Ba3, 3Bb3 Intermediate portion
4 Via
5 Heat-dissipation terminal
6B Upper face wiring
6Ba Anode electrode wiring
6Bb Cathode electrode wiring
7 Heat-dissipation terminal
8 Conductive adhesive material
10 Submount substrate
11 Substrate block
12 Submount region
15, 15A, 15B, 15C, 15D Element structure body
16 Element structure body
16a Red element structure body
16b White element structure body
16c Green element structure body
16d Blue element structure body
20 Light emitting element
25 Protective device
30 Light transmitting member
31 Light transmitting sheet
32 Light transmitting layer
40 Light guide member
50 First cover member
60, 60A Second cover member
70 Sheet member
71 Support member
72 Pressure sensitive adhesive
80, 80A, 80B, 80C Module Substrate
85 Cover member
90 Third cover member
95 Groove
100, 100A, 100B, 100C, 100D, 100E, 100F, 100G, 100H, 100I, 100J, 100K, 100L
  Light emitting device
200, 200A, 200B, 200C, 200D, 200E, 200F
  Light emitting module
L1 Distance between adjacent submount substrates
L2 Distance between adjacent light transmitting member
Wa1 Width of large-width portion of anode electrode
Wa2 Width of small-width portion of anode electrode
Wa3 Width of intermediate portion of anode electrode
Wb2 Width of large-width portion of cathode electrode
Wb2 Width of small-width portion of cathode electrode
Wb3 Width of intermediate portion of cathode electrode

What is claimed is:

1. A light emitting device comprising:
    a plurality of element structure bodies, each element structure body of the plurality of element structure bodies comprising:
        a submount substrate;
        a light emitting element disposed on the submount substrate;
        a light transmitting member disposed on the light emitting element; and
        a first cover member covering a lateral face of the light emitting element on the submount substrate; and
    a second cover member supporting the plurality of element structure bodies by covering the lateral faces of the plurality of element structure bodies, wherein
    at least one of the plurality of element structure bodies comprises a third cover member covering a lateral face of the light emitting element and a lateral face of the light transmissive member,
    the third cover member covers the lateral face of the light emitting element via the first cover member, and
    the second cover member covers the lateral face of the light emitting element and the lateral face of the light transmitting member via the third cover member.

2. The light emitting device according to claim 1, wherein the first cover member covers a lower face of the light emitting element in the at least one of the plurality of element structure bodies.

3. The light emitting device according to claim 1, wherein the first cover member covers a lateral face of the light emitting element and a lateral face of the light transmitting member in the at least one of the plurality of element structure bodies.

4. The light emitting device according to claim 1, wherein comprising:
    the at least one of the submount substrates comprises a protective device disposed thereon, the third cover member has a groove between the light emitting element and the protective device in the at least one of the plurality of element structure bodies, and the second cover member is disposed in the groove.

5. The light emitting device according to claim 1, wherein the second cover member is a black resin or a gray resin.

6. The light emitting device according to claim 1, wherein each of the light transmitting members comprises a light transmitting sheet and a resin layer disposed on a surface of the light transmitting sheet.

7. The light emitting device according to claim 1, wherein the plurality of element structure bodies are of two or more different emission colors.

8. The light emitting device according to claim 1, wherein the submount substrate comprises:
   an upper face wiring disposed on an upper face of the submount substrate on which the light emitting element is disposed;
   a pair of external connection electrodes disposed on a lower face of the submount substrate located opposite to the upper face; and
   vias connecting the upper face wiring and the external connection electrodes.

9. The light emitting device according to claim 8, wherein at least one of the pair of external connection electrodes has a large-width portion having a large width, a small-width portion having a small width, and an intermediate portion positioned therebetween, and
   the large-width portion of the at least one of the external connection electrodes is positioned directly below the vias.

10. The light emitting device according to claim 1, wherein
    the submount substrate comprises a heat-dissipation terminal on a lower face of the submount substrate located opposite to an upper face thereof on which the light emitting element is disposed.

11. A light emitting device comprising:
    a plurality of element structure bodies, each element structure body of the plurality of element structure bodies comprising:
      a submount substrate;
      a light emitting element disposed on the submount substrate;
      a light transmitting member disposed on the light emitting element; and
      a first cover member covering a lateral face of the light emitting element on the submount substrate; and
    a second cover member supporting the plurality of element structure bodies by covering the lateral faces of the plurality of element structure bodies, wherein
    the second cover member is a white resin.

12. A light emitting device comprising:
    a plurality of element structure bodies, each element structure body of the plurality of element structure bodies comprising:
      a submount substrate;
      a light emitting element disposed on the submount substrate;
      a light transmitting member disposed on the light emitting element; and
      a first cover member covering a lateral face of the light emitting element on the submount substrate; and
    a second cover member supporting the plurality of element structure bodies by covering the lateral faces of the plurality of element structure bodies, wherein
    each of the light transmitting members comprises a light transmitting sheet and a resin layer disposed on a surface of the light transmitting sheet.

13. A light emitting module comprising:
    a light emitting device according to claim 1, and
    a module substrate on which the light emitting device is mounted such that the submount substrates of the plurality of element structure bodies each face the module substrate.

14. A light emitting module comprising:
    a light emitting device according to claim 5, and
    a module substrate on which the light emitting device is mounted such that the submount substrates of the plurality of element structure bodies each face the module substrate.

15. A light emitting module comprising:
    a light emitting device according to claim 12, and
    a module substrate on which the light emitting device is mounted such that the submount substrates of the plurality of element structure bodies each face the module substrate.

16. A light emitting module comprising:
    a light emitting device according to claim 7, and
    a module substrate on which the light emitting device is mounted such that the submount substrates of the plurality of element structure bodies each face the module substrate.

* * * * *